United States Patent
Nomura et al.

(10) Patent No.: US 7,955,716 B2
(45) Date of Patent: Jun. 7, 2011

(54) METAL COORDINATION COMPOUND, POLYMER COMPOSITION, AND ORGANIC ELECTROLUMINESCENT DEVICE EMPLOYING SAME

(75) Inventors: Satoyuki Nomura, Tsukuba (JP); Yoshii Morishita, Tsukuba (JP); Yoshihiro Tsuda, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 1021 days.

(21) Appl. No.: 10/559,774

(22) PCT Filed: Jun. 9, 2004

(86) PCT No.: PCT/JP2004/008392
§ 371 (c)(1),
(2), (4) Date: Feb. 1, 2007

(87) PCT Pub. No.: WO2004/111066
PCT Pub. Date: Dec. 23, 2004

(65) Prior Publication Data
US 2007/0128466 A1    Jun. 7, 2007

(30) Foreign Application Priority Data

Jun. 9, 2003 (JP) ............... P2003-164321
Jun. 9, 2003 (JP) ............... P2003-164328
Jun. 9, 2003 (JP) ............... P2003-164340

(51) Int. Cl.
*H01L 51/50* (2006.01)
*H01L 51/54* (2006.01)
(52) U.S. Cl. ........... 428/690; 428/917; 313/504; 546/6; 548/402; 548/403; 548/427; 548/440
(58) Field of Classification Search .................. None
See application file for complete search history.

(56) References Cited

U.S. PATENT DOCUMENTS

| | | | |
|---|---|---|---|
| 5,244,992 A | 9/1993 | Yamamoto et al. | |
| 5,367,038 A | 11/1994 | Yamamoto et al. | |
| 5,648,448 A | 7/1997 | Marrocco, III et al. | |
| 5,786,071 A | 7/1998 | Marrocco, III et al. | |
| 6,006,101 A | 12/1999 | Sakamoto | |
| 6,451,056 B1 | 9/2002 | Cumming | |
| 2002/0193532 A1 | 12/2002 | Ikehira et al. | |
| 2003/0050696 A1 | 3/2003 | Cumming | |
| 2003/0068535 A1 * | 4/2003 | Takiguchi et al. | 428/704 |
| 2003/0129448 A1 | 7/2003 | Lin et al. | |
| 2003/0224208 A1 * | 12/2003 | Kamatani et al. | 428/690 |
| 2004/0243232 A1 | 12/2004 | Cumming | |
| 2007/0003783 A1 | 1/2007 | Morishita et al. | |
| 2007/0027299 A1 | 2/2007 | Morishita et al. | |
| 2007/0128466 A1 | 6/2007 | Nomura et al. | |

FOREIGN PATENT DOCUMENTS

| | | |
|---|---|---|
| CN | 1374315 | 10/2002 |
| JP | 4-302230 A | 10/1992 |
| JP | 5-70565 A | 3/1993 |
| JP | 8-319482 | 12/1996 |
| JP | 9-832427 A | 3/1997 |
| JP | 9-136954 A | 5/1997 |
| JP | 10-223372 A | 8/1998 |
| JP | 11-242994 A | 9/1999 |
| JP | 11-256148 | 9/1999 |
| JP | 11-313370 A | 11/1999 |
| JP | 11-329739 | 11/1999 |
| JP | 2002-134277 A | 5/2002 |
| JP | 2002-216956 A | 8/2002 |
| JP | 2002-317033 A | 10/2002 |
| JP | 2002-332291 | 11/2002 |
| JP | 2002-359079 A | 12/2002 |
| JP | 2003-73480 A | 3/2003 |
| JP | 2003-171659 A | 6/2003 |
| JP | 2003-277444 A | 10/2003 |
| JP | 2003-332075 A | 11/2003 |
| JP | 2004-067658 | 3/2004 |
| JP | 2005-23070 A | 1/2005 |
| JP | 2006-523231 A | 10/2006 |
| WO | 90/13148 A1 | 11/1990 |
| WO | WO02/44189 | 6/2002 |
| WO | 2004/085450 A2 | 10/2004 |
| WO | 2004/092245 A1 | 10/2004 |
| WO | 2004/092246 A1 | 10/2004 |
| WO | 2005/092245 A1 | 10/2005 |

OTHER PUBLICATIONS

Japanese Office Action dated Jan. 5, 2010, issued in corresponding Japanese Patent Application No. 2004-171228.
Japanese Office Action dated Jan. 5, 2010, issued in corresponding Japanese Patent Application No. 2004-171704.
Chinese Office Action issued Jun. 8, 2007 of Chinese Application No. 200480015847.1.
M. A. Baldo et al.; "Very high-efficiency green organic light-emitting devices based on electrophosphorencence", Applied Physics Letters, vol. 75, No. 1, Jul. 5, 1999, pp. 4-6. Cited in the spec.
Japanese Office Action dated Jun. 1, 2010, issued in corresponding Japanese patent Application No. 2004-171194.
Japanese Office Action dated Aug. 31, 2010, issued in corresponding Japanese Patent Application No. 2004-171194.
Igor Sokolik et al.; "Blue light electroluminescence prom p-phenylene vinylene-based copolymers"; J. Appl. Phys. vol. 74 No. 5, Sep. 1, 1993, pp. 3584-3586.
Taiwanese Office Action dated Apr. 30, 2009, issued in corresponding Taiwanese Patent Application No. 093117614.
Japanese Office Action dated May 19,2009, issued in corresponding Japanese Patent Application No. 2004-180126.
Japanese Office Action dated May 19, 2009, issued in corresponding Japanese Patent Application No. 2004-180137.
Japanese Office Action dated May 19, 2009, issued in corresponding Japanese Patent Application No. 2004-180158.
Japanese Office Action dated May 19, 2009, issued in corresponding Japanese Patent Application No. 2004-180147.

* cited by examiner

*Primary Examiner* — David Wu
*Assistant Examiner* — Vu A Nguyen
(74) *Attorney, Agent, or Firm* — Westerman, Hattori, Daniels & Adrian, LLP

(57) ABSTRACT

It is an object of the present invention to provide a phosphorescence-emitting material that emits light in a wide visible light range from blue to red and has excellent color purity and reliability, etc. The present invention relates to a metal coordination compound represented by any one of Formulae (1) to (6),
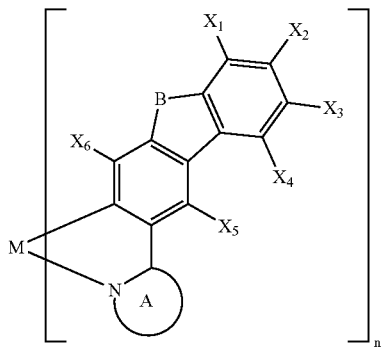
(1)
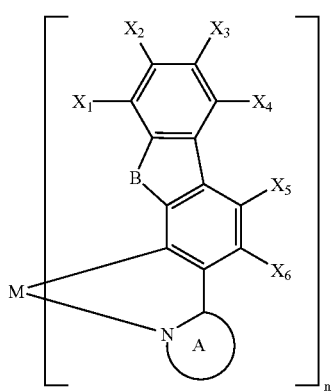
(2)
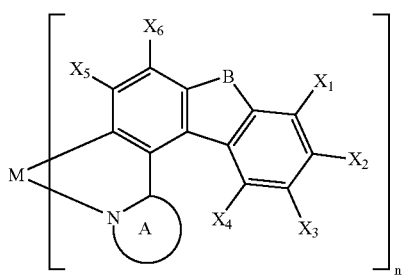
(3)
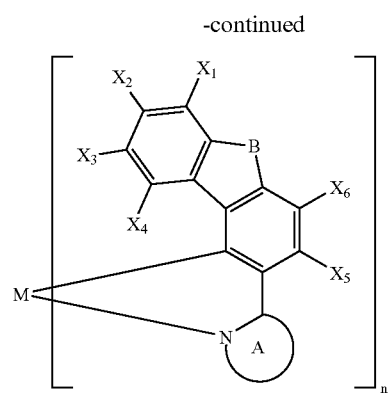
(4)
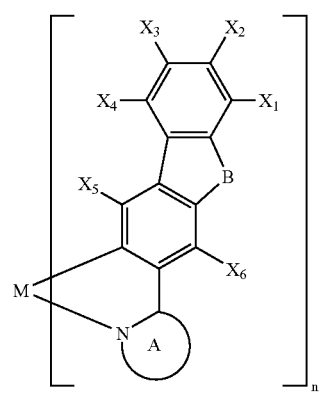
(5)
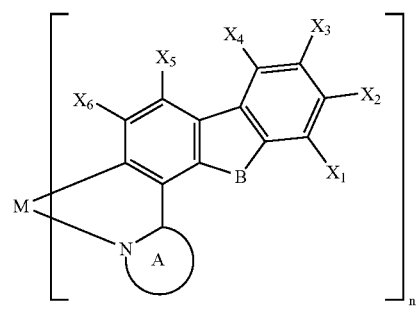
(6)
B: >NR, >O, >S, >C=O, >SO$_2$, >CR$_2$
(in the formulae, M is Ir, Rh, Ru, Os, Pd, or Pt, and n is 2 or 3; when M is Ir, Rh, Ru, or Os and n is 2, another bidentate ligand further bonds to M; ring A is a cyclic compound containing a nitrogen atom bonded to M.
6 Claims, No Drawings

METAL COORDINATION COMPOUND, POLYMER COMPOSITION, AND ORGANIC ELECTROLUMINESCENT DEVICE EMPLOYING SAME

TECHNICAL FIELD

The present invention relates to a novel metal coordination compound, a polymer composition, and an organic electroluminescent (EL) device employing same.

BACKGROUND ART

In recent years, electroluminescent devices have been attracting attention as, for example, large-area solid state light sources to replace incandescent lamps and gas-filled lamps. They have also been attracting attention as self-luminous displays, and are the most promising alternative to liquid crystal displays in the flat panel display (FPD) field. In particular, an organic electroluminescent (EL) device, in which the device material is formed from an organic material, is being commercialized as a low power consumption full-color FPD.

Conventionally, organic EL devices generally produce phosphorescence when an excited singlet relaxes to the ground state. However, the proportion of excitons generated by injection of charge into an organic film is said to be statistically singlet : triplet=1:3, and the theoretical limit value of the internal quantum efficiency of an organic EL device is said to be 25%. This is one of the hurdles to be overcome when lowering the power consumption of an organic EL device.

As one means for solving this problem, a device utilizing phosphorescence from an excited triplet has been investigated. If phosphorescence from an excited triplet can be utilized, it can be expected that in principle the luminescence quantum yield would be at least three times that obtained when fluorescence from an excited singlet is utilized. Furthermore, while taking into consideration utilization of an exciton resulting from intersystem crossing from the singlet, which has high energy, to the triplet, it can be expected that in principle the luminescence quantum yield would be four times greater, that is, it would be 100%.

Examples of research that has been carried out so far include M. A. Baldo et al., Appl. Phys. Lett. 1999, 75, 4. In this publication, the materials below are used. The materials are abbreviated as follows.

Alq$_3$: an aluminum-quinolinol complex (tris(8-quinolinolato)aluminum)
α-NPD: N,N'-Di-naphthalen-1-yl-N,N'-diphenyl-biphenyl-4,4'-diamine
CBP: 4,4'-N,N'-dicarbazole-biphenyl
BCP: 2,9-dimethyl-4,7-diphenyl-1,10-phenanthroline
Ir(ppy)$_3$: iridium-phenylpyridine complex (tris(2-phenylpyridine)iridium)

Examples in which luminescence from a triplet is utilized include Japanese Patent Application Laid-open Nos. 11-329739, 11-256148, and 8-319482.

DISCLOSURE OF INVENTION

However, it is difficult to obtain an organic EL device that emits light at various wavelength from blue to red and has excellent reliability with the above-mentioned material, which utilizes light emission from the excited triplet. In view of the above-mentioned conventional problems, the object of the present invention is therefore to provide a phosphorescence-emitting material that emits light in a wide visible light range from blue to red and has excellent color purity and reliability, etc.

Furthermore, in particular, when the above-mentioned organic EL device employing phosphorescence emission is fabricated so as to exhibit full color, no metal coordination compound has been found having blue phosphorescence emission with good color purity. Another object of the present invention is therefore to provide a metal coordination compound having blue phosphorescence emission with good color purity.

Moreover, in particular, there has been a desire for the development of a phosphorescence-emitting metal coordination compound that has various emission colors and a long operating life when taking into consideration its use not only in the above-mentioned full color organic EL device employing phosphorescence emission but also in illumination applications, etc. However, the operating life of conventional phosphorescence-emitting devices is short compared with that of fluorescence-emitting devices. Although the cause of the short operating life of phosphorescence-emitting devices is not clear,. it is surmised that, since the lifetime of an excited triplet state is generally long compared with the lifetime of an excited singlet, and molecules remain in a high energy state for a long time, the molecules react with surrounding substances, the molecules themselves undergo structural change, excitons react with each other, etc. Yet another object of the present invention is therefore to provide a metal coordination compound that has light emission of various colors from green to red and has a long operating life.

Furthermore, in particular, when the above-mentioned organic EL device employing phosphorescence emission for full color applications or illumination purposes, etc. is fabricated, no metal coordination compound has been found that has blue phosphorescence emission with good color purity. Moreover, no material, from blue to red, has been found that can give the device a long operating life. Yet another object of the present invention is therefore to provide a metal coordination compound having blue phosphorescence emission with excellent color purity and to provide a metal coordination compound having blue to red phosphorescence emission with a long operating life.

Furthermore, yet another object of the present invention is to provide a polymer composition containing the above-mentioned metal coordination compound.

Moreover, yet another object of the present invention is to provide an organic electroluminescent device employing the above-mentioned metal coordination compound or the above-mentioned polymer composition.

As a result of an intensive investigation by the inventors of the present invention, it has been found that a metal coordination compound having as a ligand a cyclic compound shown in Formulae (1) to (6) is a phosphorescence-emitting material that emits light in a wide wavelength region from blue to red and has excellent reliability, and the present invention has thus been accomplished. That is, the present invention relates to a compound represented by any one of Formulae (1) to (6).

(1)
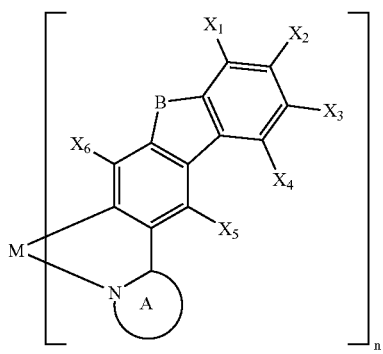

(2)
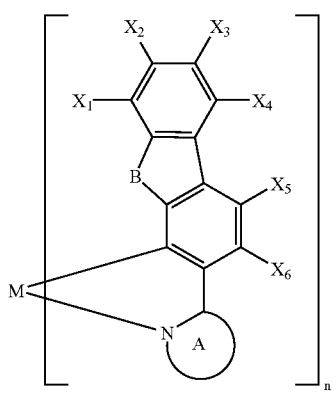

(3)
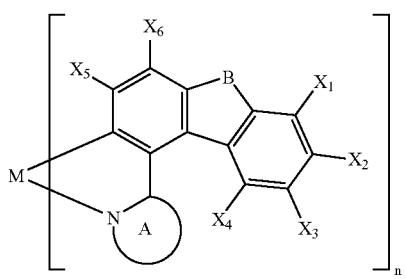

(4)
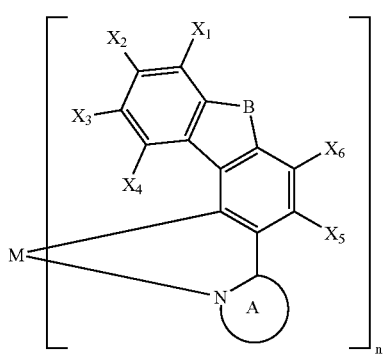

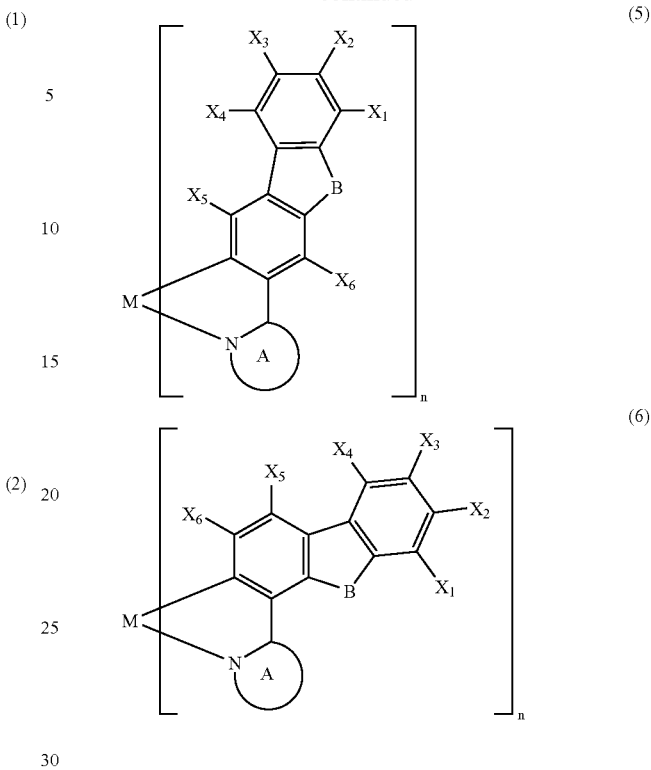

B: >NR, >O, >S, >C=O, >SO$_2$, >CR$_2$ (In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_6$ and R are independently substituents selected from the group consisting of —$R^1$, —$OR^2$, —$SR^3$, —$OCOR^4$, —$COOR^5$, —$SiR^6R^7R^8$, and —$NR^9R^{10}$ (here, $R^1$ to $R^{10}$ represent a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C21 aryl group, a C2 to C20 heteroaryl group, or a C7 to C21 aralkyl group, or a corresponding halogen-substituted aryl group, halogen-substituted heteroaryl group, or halogen-substituted aralkyl group in which a part or all of the hydrogen atoms are substituted by a halogen atom, and $R^1$ to $R^{10}$ may be identical to or different from each other), $X_1$ to $X_6$ may be identical to or different from each other, and ring A may have a substituent that is the same as the groups defined by $X_1$ to $X_6$.) Here, $R^1$ to $R^{10}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may further be substituted by a halogen atom, a methyl group, etc.

The inventors of the present invention have also found that, in particular, a metal coordination compound having as a ligand a carbazole derivative is an excellent phosphorescence-emitting material having blue phosphorescence emission with excellent color purity. Therefore, as a preferred embodiment of the present invention, a metal coordination compound represented by any one of Formulae I-(1) to I-(6) below is provided.

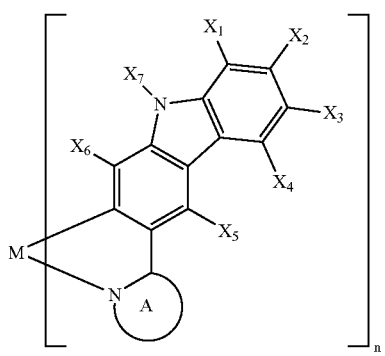

I-(1)

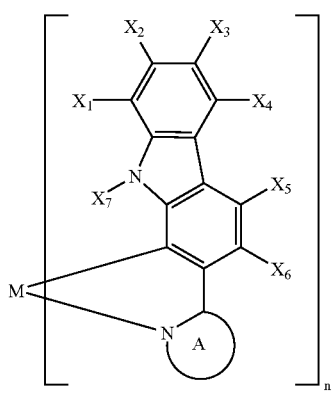

I-(2)

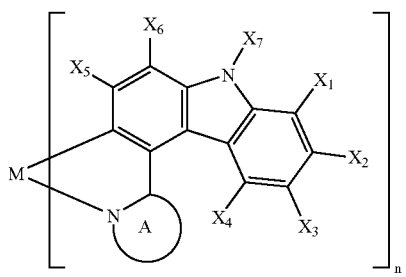

I-(3)

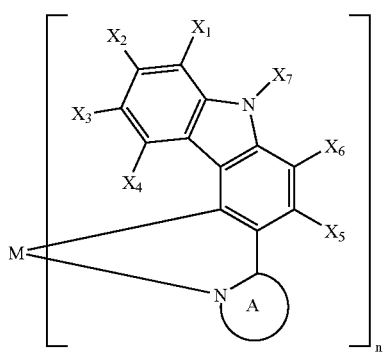

I-(4)

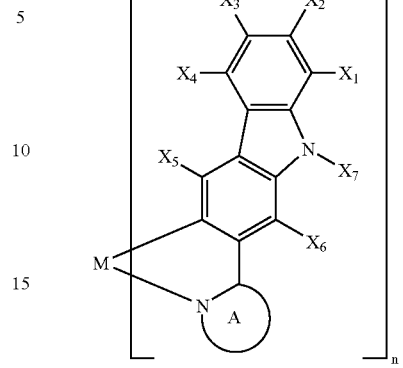

I-(5)

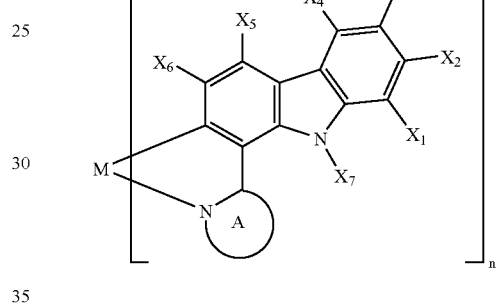

I-(6)

(In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_7$ may be any of a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C21 aryl group, a C2 to C20 heteroaryl group, or a C7 to C21 aralkyl group, or a corresponding halogen-substituted aryl group, halogen-substituted heteroaryl group, or halogen-substituted aralkyl group in which a part or all of the hydrogen atoms are substituted by a halogen atom, $X_1$ to $X_7$ may be identical to or different from each other, and ring A may have a substituent that is the same as the groups defined by $X_1$ to $X_7$.)

The inventors of the present invention have also found that, in particular, metal coordination compounds having as a ligand a carbazole derivative into which various substituents have been incorporated are excellent phosphorescence-emitting materials that have an emission color from green to red and have a long operating life.

Therefore, as a preferred embodiment of the present invention, a metal coordination compound represented by Formulae II-(1) to II-(6) below is provided.

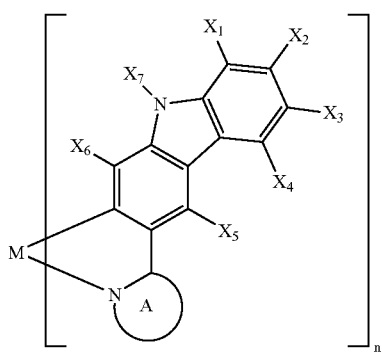

II-(1)

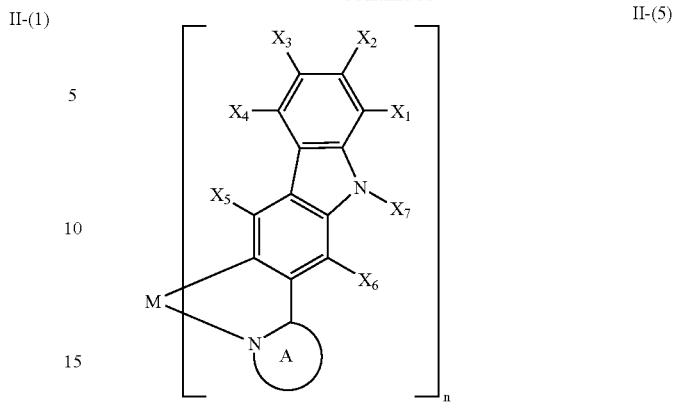

II-(5)

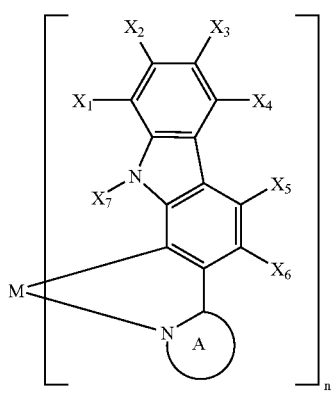

II-(2)

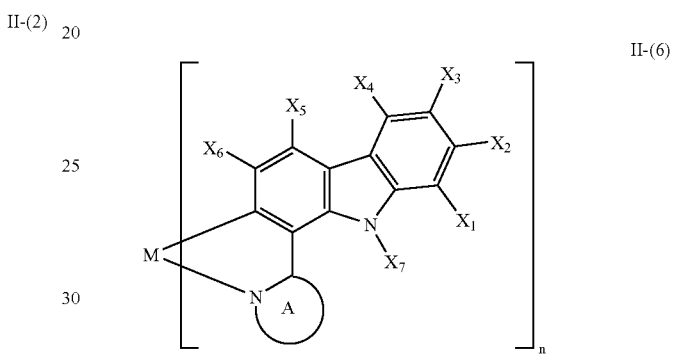

II-(6)

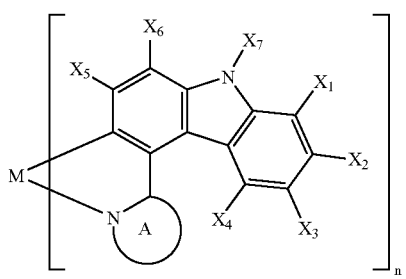

II-(3)

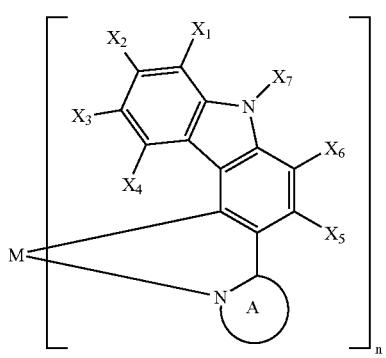

II-(4)

(In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_7$ are independently substituents selected from the group-consisting of —H, —OH, —$R^1$, —$OR^2$, —$SR^3$, —$OCOR^4$, —$COOR^5$, —$SiR^6R^7R^8$, —$NH_2$, —$NHR^9$, and —$NR^{10}R^{11}$ (here, $R^1$ to $R^{11}$ represent a C1 to C22 straight-chain, cyclic, or branched alkyl group, a C6 to C21 aryl group, a C2 to C20 heteroaryl group, or a C7 to C21 aralkyl group, and $R^1$ to $R^{11}$ may be identical to or different from each other), $X_1$ to $X_7$ may be identical to or different from each other, and ring A may have a substituent that is the same as the groups defined by $X_1$ to $X_7$.) Here, $R^1$ to $R^{11}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may further be substituted by a halogen atom, a methyl group, etc.

The inventors of the present invention have also found that, in particular, a metal coordination compound having as a ligand a cyclic compound shown in Formulae III-(1) to III-(6) is an excellent phosphorescence-emitting material that has phosphorescence emission from blue to red with excellent color purity and has a long operating life.

Therefore, as a preferred embodiment of the present invention, a metal coordination compound represented by Formulae III-(1) to III-(6) below is provided.

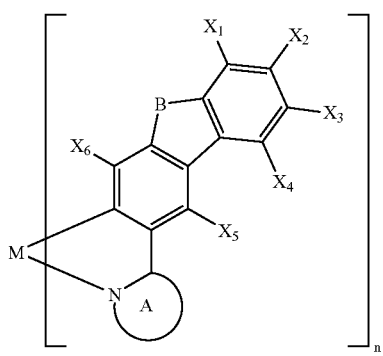

III-(1)

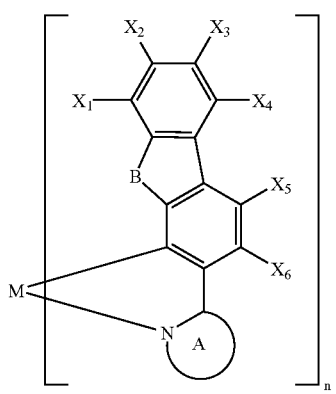

III-(2)

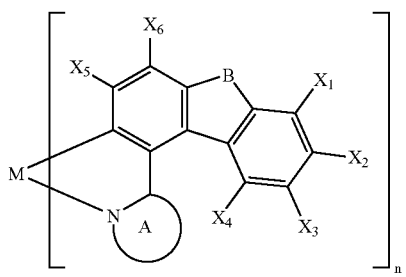

III-(3)

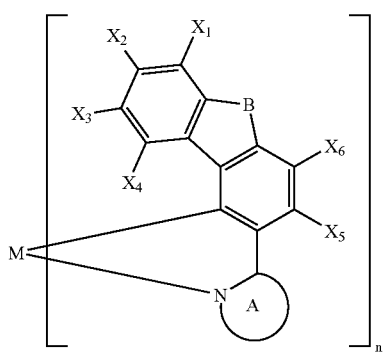

III-(4)

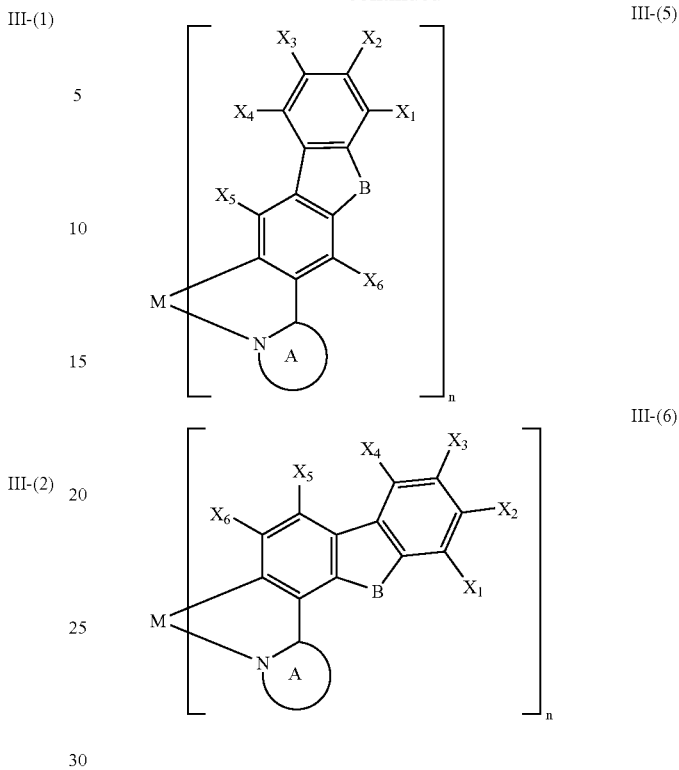

III-(5)

III-(6)

B: >O, >S, >C=O, >SO$_2$, >CR$_2$ (In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_6$ and R are independently substituents selected from the group consisting of —$R^1$, —$OR^2$, —$SR^3$, —$OCOR^4$, —$COOR^5$, —$SiR^6R^7R^8$, and —$NR^9R^{10}$ (here, $R^1$ to $R^{10}$ represent a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C21 aryl group, a C2 to C20 heteroaryl group, or a C7 to C21 aralkyl group, or a corresponding halogen-substituted aryl group, halogen-substituted heteroaryl group, or halogen-substituted aralkyl group in which a part or all of the hydrogen atoms are substituted by a halogen atom, and $R^1$ to $R^{10}$ may be identical to or different from each other), $X_1$ to $X_6$ may be identical to or different from each other, and ring A may have a substituent that is the same as the groups defined by $X_1$ to $X_6$.) Here, $R^1$ to $R^{10}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may further be substituted by a halogen atom, a methyl group, etc.

Furthermore, the present invention relates to a polymer composition formed by mixing or copolymerizing the above-mentioned metal coordination compound with a conjugated or non-conjugated polymer.

Moreover, the present invention relates to an organic electroluminescent device fabricated using the above-mentioned metal coordination compound or the above-mentioned polymer composition.

The disclosures of the present invention relate to subject matter described in Japanese Patent Application Nos. 2003-164321, 2003-164328, and 2003-164340, filed on June 9, 2003, and the contents of the disclosures therein are incorporated herein by reference.

BEST MODE FOR CARRYING OUT THE INVENTION

The metal coordination compound of the present invention is characterized by being represented by Formulae (1) to (6) below.

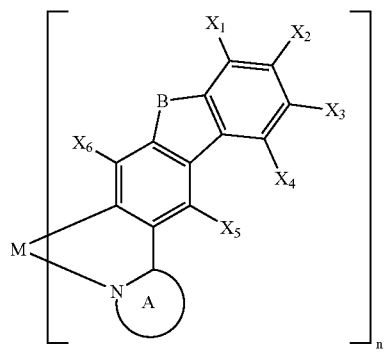

(1)

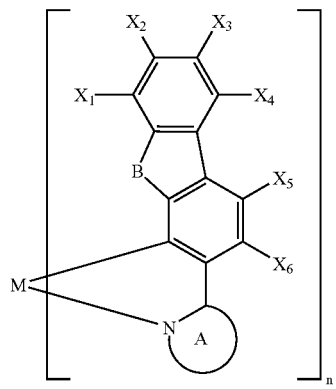

(2)

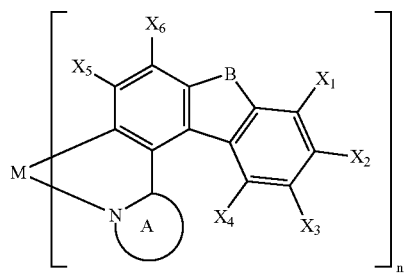

(3)

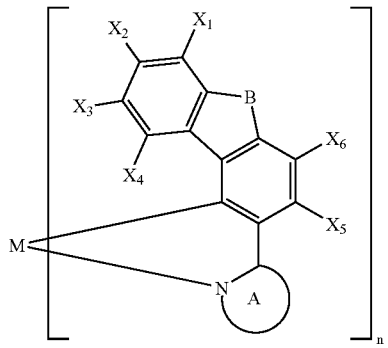

(4)

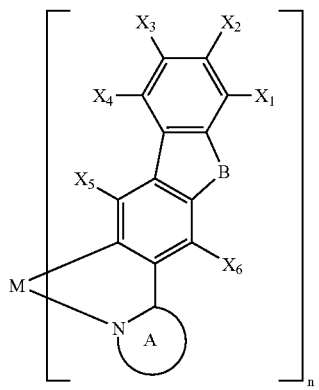

(5)

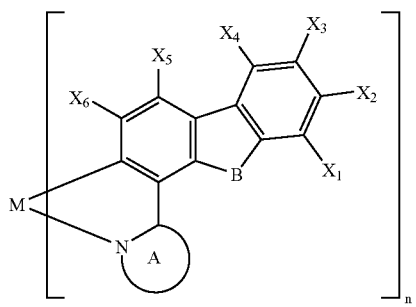

(6)

B: >NR, >O, >S, >C=O, >SO$_2$, >CR$_2$ (In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_6$ and R are independently substituents selected from the group consisting of —$R^1$, —$OR^2$, —$SR^3$, —$OCOR^4$, —$COOR^5$, —$SiR^6R^7R^8$ and —$NR^9R^{10}$ (here, $R^1$ to $R^{10}$ represent a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C21 aryl group, a C2 to C20 heteroaryl group, or a C7 to C21 aralkyl group, or a corresponding halogen-substituted aryl group, halogen-substituted heteroaryl group, or halogen-substituted aralkyl group in which a part or all of the hydrogen atoms are substituted by a halogen atom, and $R^1$ to $R^{10}$ may be identical to or different from each other), $X_1$ to $X_6$ may be identical to or different from each other, and ring A may have a substituent that is the same as the groups defined by $X_1$ to $X_6$.) Here, $R^1$ to $R^{10}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may further be substituted by a halogen atom, a methyl group, etc.

Examples of the substituents $X_1$ to $X_6$ and R are listed below, but the present invention is not limited thereto.

Examples of —$R^1$ include a hydrogen atom, a halogen atom such as a fluorine atom, a chlorine atom, a bromine atom, or an iodine atom, a cyano group, a nitro group, a methyl group, an ethyl group, a propyl group, an isopropyl group, a cyclopropyl group, a butyl group, an isobutyl group, a tert-butyl group, a cyclobutyl group, a pentyl group, an isopentyl group, a neopentyl group, a cyclopentyl group, a hexyl group, a cyclohexyl group, a heptyl group, a cycloheptyl group, an octyl group, a nonyl group, a decyl group, a phenyl group, a tolyl group, a xylyl group, a mesityl group, a cumenyl group, a benzyl group, a phenethyl group, a methylbenzyl group, a diphenylmethyl group, a styryl group, a cinnamyl group, a biphenyl residue, a terphenyl residue, a naphthyl group, an anthryl group, a fluorenyl group, a furan residue, a thiophene residue, a pyrrole residue, an oxazole residue, a thiazole residue, an imidazole residue, a pyridine residue, a pyrimidine residue, a pyrazine residue, a triazine residue, a quinoline residue, and a quinoxaline residue, and derivatives thereof substituted with a-halogen such as a fluorine atom, a chlorine atom, a bromine atom, or an iodine atom.

Examples of —$OR^2$ include a hydroxyl group, a methoxy group, an ethoxy group, a propoxy group, a butoxy group, a tert-butoxy group, an octyloxy group, a tert-octyloxy group, a phenoxy group, a 4-tert-butylphenoxy group, a 1-naphthyloxy group, a 2-naphthyloxy group, and a 9-anthryloxy group.

Examples of —$SR^3$ include a mercapto group, a methylthio group, an ethylthio group, a tert-butylthio group, a hexylthio group, an octylthio group, a phenylthio group, a 2-methylphenylthio group, and a 4-tert-butylphenylthio group.

Examples of —$OCOR^4$ include a formyloxy group, an acetoxy group, and an benzoyloxy group.

Examples of —$COOR^5$ include a carboxyl group, a methoxycarbonyl group, an ethoxycarbonyl group, a tert-butoxycarbonyl group, a phenoxycarbonyl group, and a naphthyloxycarbonyl group.

Examples of —$SiR^6R^7R^8$ include a silyl group, a trimethylsilyl group, a triethylsilyl group, and a triphenylsilyl group.

Examples of —$NR^9R^{10}$ include an amino group, an N-methylamino group, an N-ethylamino group, an N,N-dimethylamino group, an N,N-diethylamino group, an N,N-diisopropylamino group, an N,N-dibutylamino group, an N-benzylamino group, an N,N-dibenzylamino group, an N-phenylamino group, and an N,N-diphenylamino group.

The metal coordination compound of the present invention has phosphorescent light emission, and it is thought that the lowest excited state is either a triplet MLCT (Metal-to-Ligand charge transfer) excited state or a π-π* excited state. Phosphorescent light emission occurs when there is a transition from such a state to the ground state.

The phosphorescence quantum yield of light-emitting materials of the present invention is as high as 0.1 to 0.9, and the phosphorescence lifetime is 1 to 60 µs. Short phosphorescence lifetime is a requirement for achieving a high luminescence efficiency when used as an organic EL device. That is, if the phosphorescence lifetime is long, the proportion of molecules in an excited triplet state is high, and the luminescence efficiency decreases due to T-T annihilation when the current density is high. Since the metal coordination compound of the present invention has high phosphorescence emission efficiency and a short luminescence lifetime, it is suitable as a light-emitting material for an organic EL device.

In the metal coordination compounds represented by Formulae (1) to (6) above, ring A is preferably any one of the cyclic compounds having the structures shown below, is more preferably pyridine, quinoline, benzoxazole, benzothiazole, benzimidazole, benzotriazole, imidazole, pyrazole, oxazole, thiazole, triazole, benzopyrazole, triazine, or isoquinoline, which may have a substituent that is the same as the groups defined by $X_1$ to $X_6$ (hereinafter collectively referred to as substituents Xn), and is yet more preferably pyridine, quinoline, or isoquinoline.

Formulae (7)

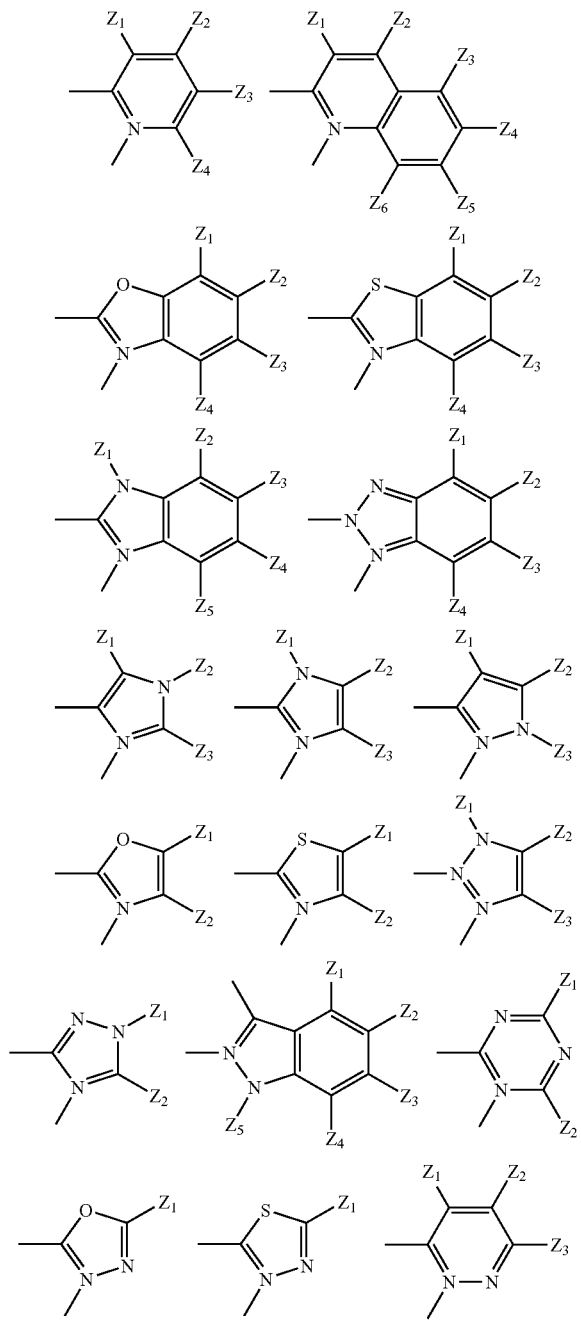

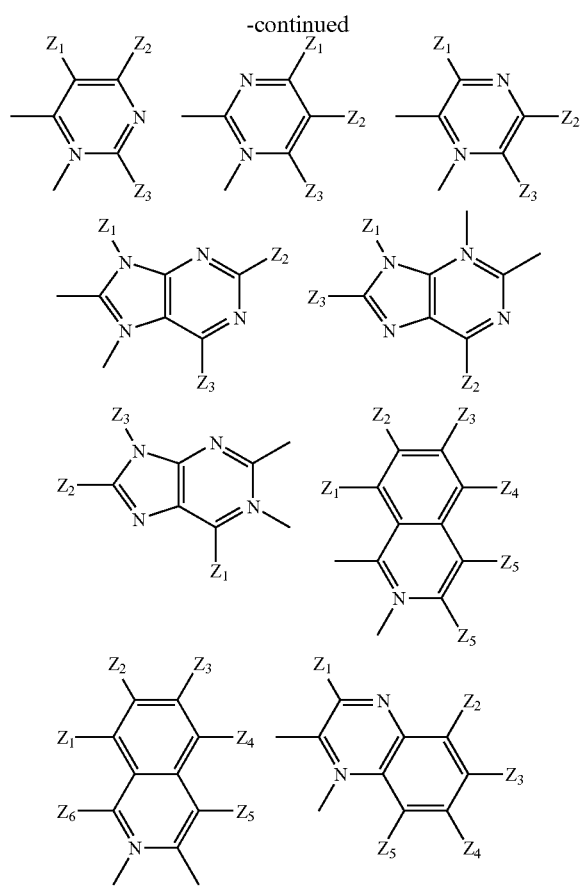

Here, $Z_1$ to $Z_6$ are the same substituents as the substituents represented by Xn in Formulae (1) to (6), and $Z_1$ to $Z_6$ may be identical to or different from each other.

Furthermore, in the present invention, in Formulae (1) to (6), M is preferably Ir.

When metal M is Ir, Rh, Ru, or Os and n=2, another ligand bonded to the metal M is preferably either one of the compounds having the structures shown below.

Formulae (8)

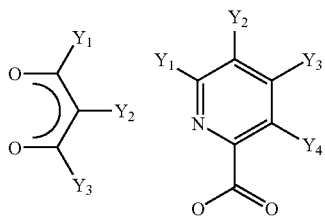

Here, $Y_1$ to $Y_4$ are the same substituents as the substituents represented by Xn in Formulae (1) to (6), and $Y_1$ to $Y_4$ may be identical to or different from each other.

(Detailed Explanation of Synthetic Method for Metal Coordination Compound)

A synthetic method for the metal coordination compound of the present invention is explained in detail below by way of specific examples of the metal coordination compound.

The metal coordination compound of the present invention may be produced by various synthetic methods known to a person skilled in the art. For example, a method described in S. Lamansky, et al., J. Am. Chem. Soc. 2001, 123 can be used. One example (a case in which ring A is a substituted pyridine) of the synthetic route for the metal coordination compound represented by Formulae (1) to (6) above used in the present invention is illustrated below taking an iridium coordination compound as an example. The explanation here is given with respect to (2) shown in Table I-1, (2) shown in Table II-1, and (2) shown in Table III-1, but other example compounds can also be synthesized by substantially the same method.

(Synthesis of Ligand L)

Ligand L of Table I-1 (2) or Table II-1 (2)

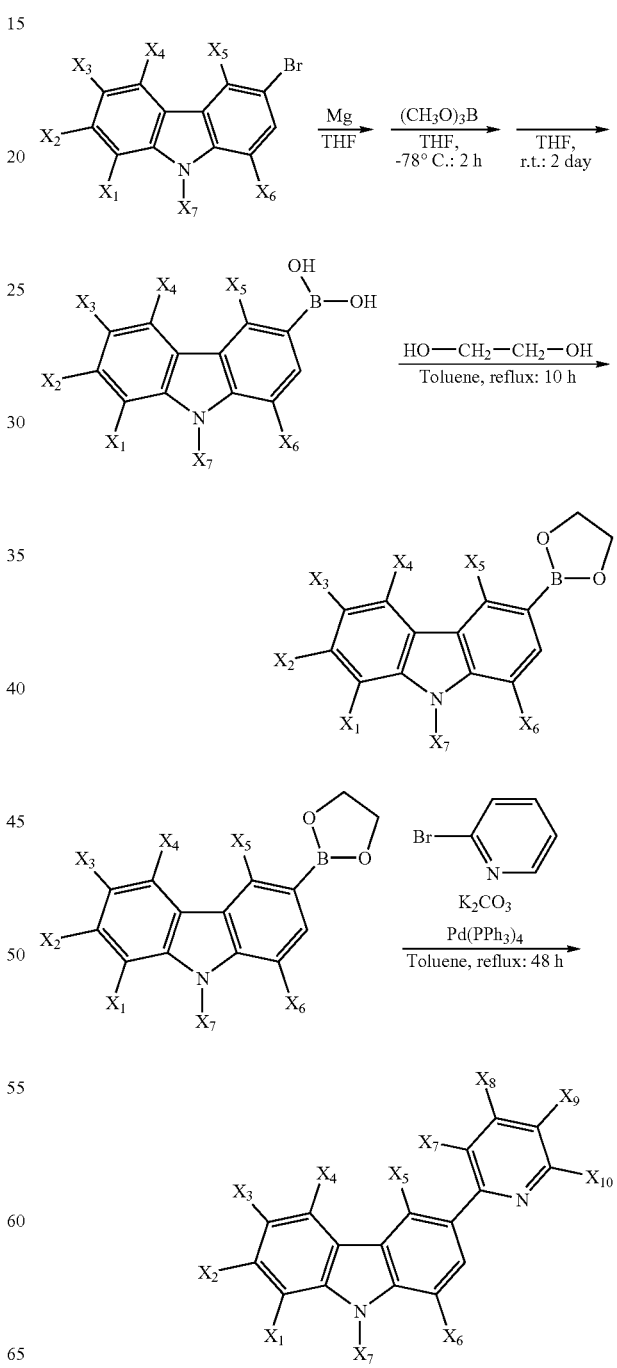

Ligand L of Table III-1 (2)

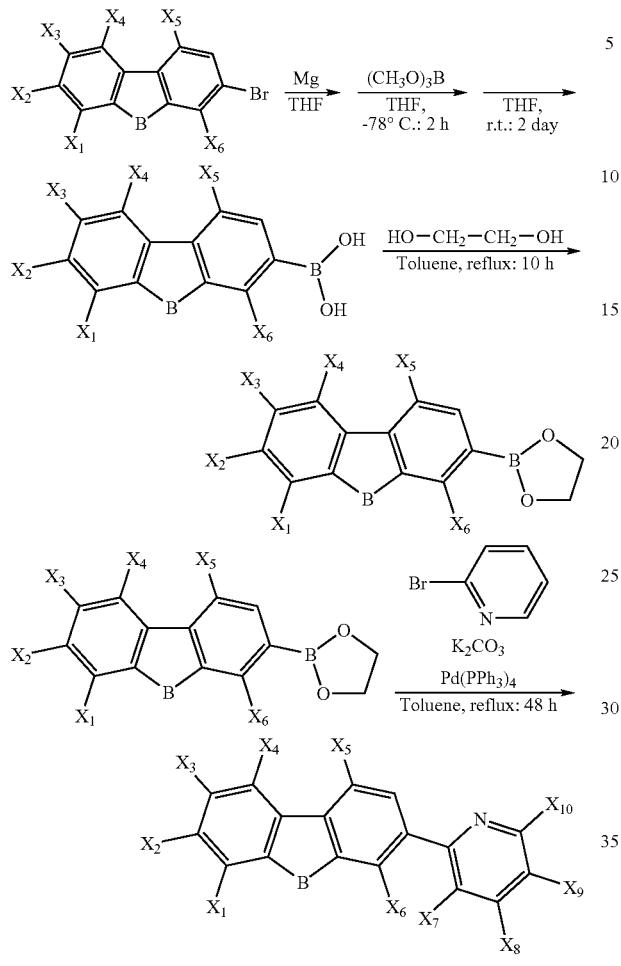

(Synthesis of Iridium Complex)

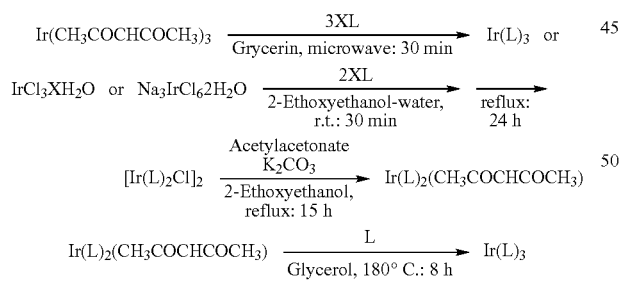

Preferred embodiments of the metal coordination compound of the present invention are shown below.

(Metal Coordination Compounds Represented by Formula I-(1) to I-(6))

With regard to organic EL, in order to obtain blue phosphorescence emission, it is necessary for the energy level of the lowest excited state to be high. However, it is surmised that, since the energy level of the lowest excited state of the conventional metal coordination compounds is too low for blue emission, the emission color is blue-green to red.

As a result of various investigations, the present inventors have found that the metal coordination compounds represented by Formulae I-(1) to I-(6) below have blue phosphorescence emission.

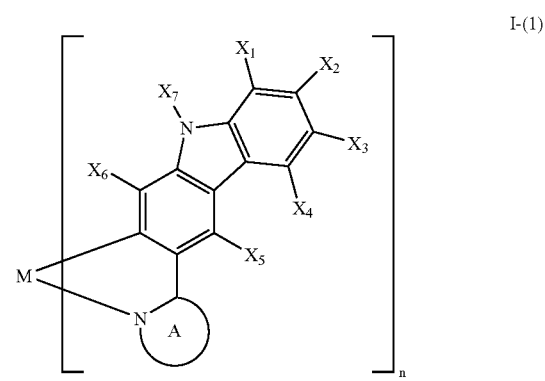

I-(1)

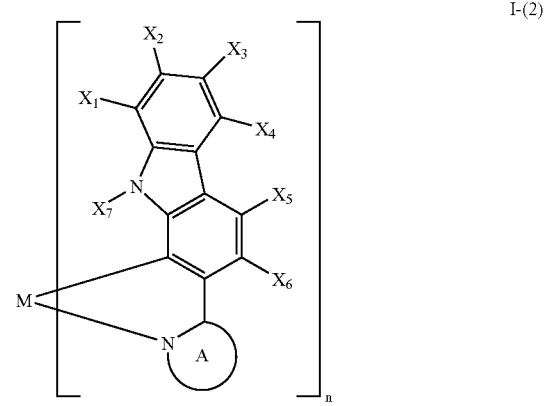

I-(2)

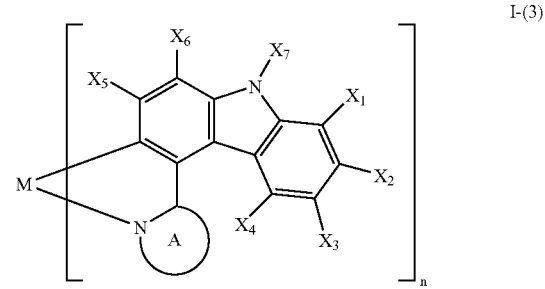

I-(3)

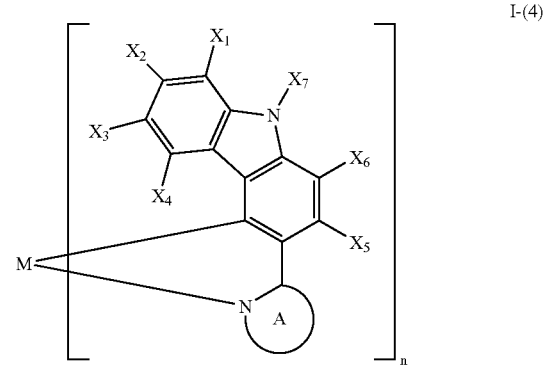

I-(4)

I-(5)

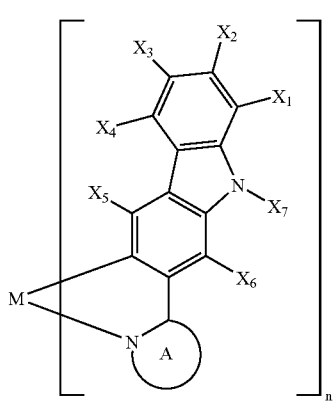

I-(6)

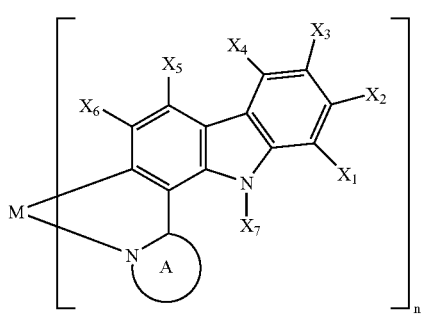

(In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_7$ may be any of a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C21 aryl group, a C2 to C20 heteroaryl group, or a C7 to C21 aralkyl group, or a corresponding halogen-substituted aryl group, halogen-substituted heteroaryl group, or halogen-substituted aralkyl group in which a part or all of the hydrogen atoms are substituted by a halogen atom, $X_1$ to $X_7$ may be identical to or different from each other, and ring A may have a substituent that is the same as the groups defined by $X_1$ to $X_7$.)

In the metal coordination compounds represented by Formulae I-(1) to I-(6) above, ring A is preferably any one of the cyclic compounds having the structures shown below, is more preferably pyridine, quinoline, benzoxazole, benzothiazole, benzimidazole, benzotriazole, imidazole, pyrazole, oxazole, thiazole, triazole, benzopyrazole, or triazine, which may have a substituent that is the same as the groups defined by $X_1$ to $X_7$ (hereinafter collectively referred to as substituents Xn), and is yet more preferably pyridine, or quinoline.

Formulae I-(7)

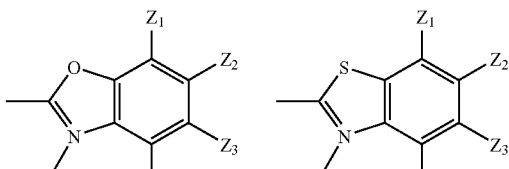

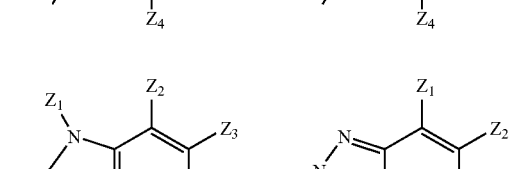

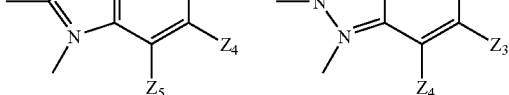

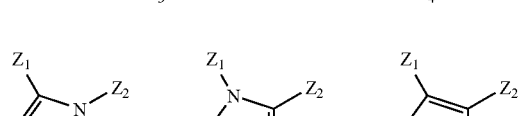

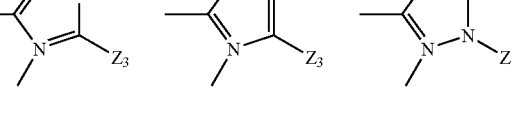

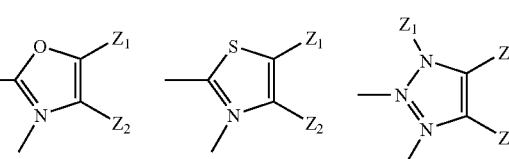

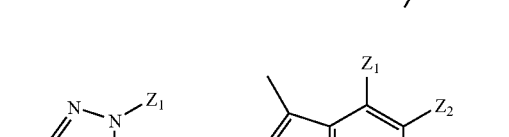

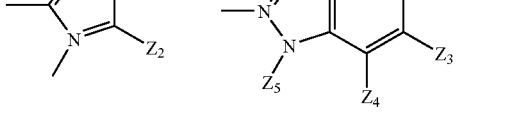

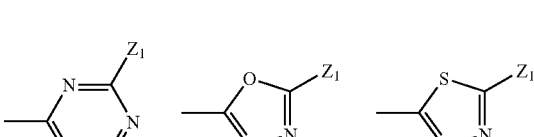

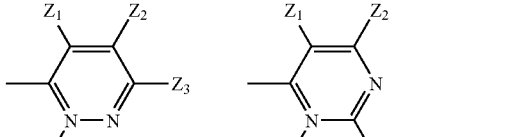

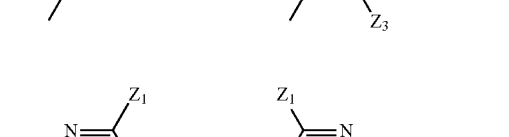

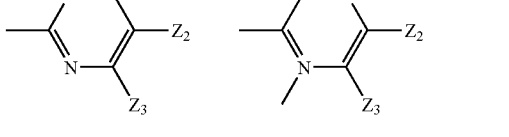

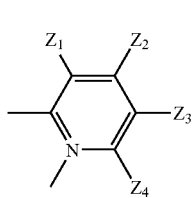 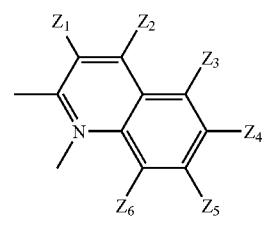 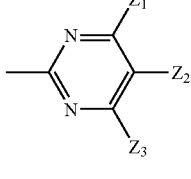 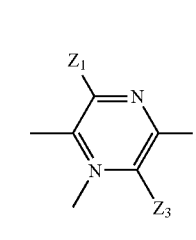

-continued

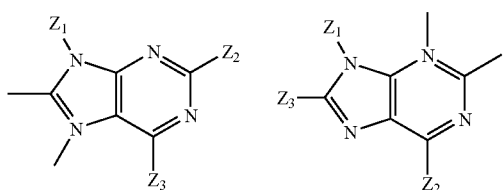

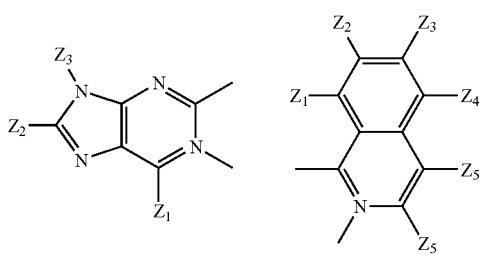

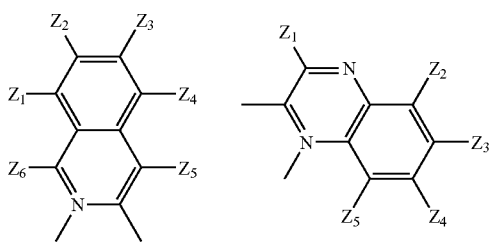

Here, $Z_1$ to $Z_6$ are the same substituents as the substituents represented by Xn in Formulae I-(1) to I-(6), and $Z_1$ to $Z_6$ may be identical to or different from each other.

When metal M is Ir, Rh, Ru, or Os and n=2, another ligand bonded to the metal M is preferably either one of the compounds having the structures shown below.

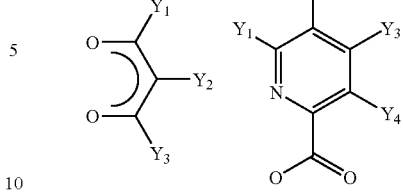

Formulae I-(8)

Here, $Y_1$ to $Y_4$ are the same substituents as the substituents represented by Xn in Formulae I-(1) to I-(6), and $Y_1$ to $Y_4$ may be identical to or different from each other.

With regard to the metal coordination compounds represented by Formulae I-(1) to I-(6) above, at least one of the substituents Xn and the substituents of ring A defined as being the same as Xn is preferably a halogen atom, a cyano group, or a halogen-substituted alkyl group from the point of view of their being effective for making the emission wavelength shorter, more preferably a fluorine atom, a chlorine atom, a cyano group, or a trifluoromethyl group, yet more preferably a fluorine atom or a trifluoromethyl group, and most preferably a fluorine atom. When at least one of the substituents Xn or the substituents of ring A defined as being the same as Xn comprises any one of the above-mentioned substituents, the other Xn are often hydrogen atoms, but may be another substituent. For example, $X_7$ is preferably an alkyl group or a halogen-substituted alkyl group.

Among the metal coordination compounds represented by Formulae I-(1) to I-(6) above, from the viewpoint of ease of synthesis, a metal coordination compound represented by Formulae I-(1) or I-(4) is preferable.

The metal coordination compounds represented by Formulae I-(1) to I-(6) above are expected to have a high energy level for the lowest excited state, and are suitable as blue phosphorescence-emitting materials for organic EL.

As specific examples of the metal coordination compounds represented by Formulae I-(1) to I-(6) above, example compounds are shown below, but they should not be construed as being limited thereto. $X_1$ to $X_4$ in Table I-1 represent substituents of ring A.

TABLE I-1

(Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (1) | Ir | 2 | | $CH_3$ | | H | H | H | H | |
| (2) | Ir | 3 | | $CH_3$ | | H | H | H | H | — |

TABLE I-1-continued
(Specific Synthetic Examples of Metal Coordination Compounds
represented by Formulae I-(1) to I-(6))
| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (3) | Ir | 2 | 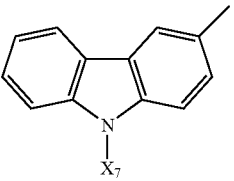 | $CH_3$ | 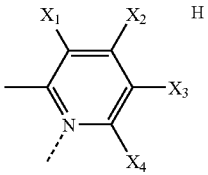 | H | H | H | H | 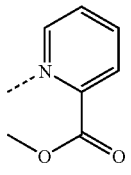 |
| (4) | Ir | 2 | 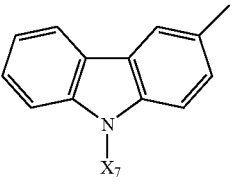 | $C_2H_5$ | 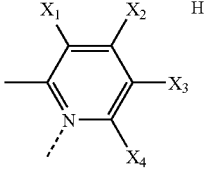 | H | $CF_3$ | H | H | 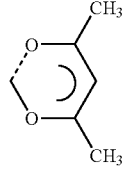 |
| (5) | Ir | 3 | 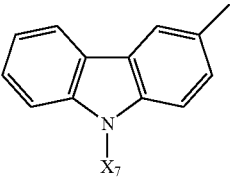 | $C_2H_5$ | 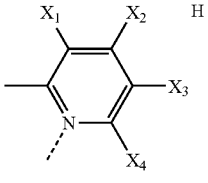 | H | $CF_3$ | H | H | — |
| (6) | Ir | 2 | 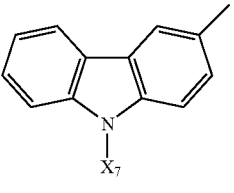 | $C_2H_5$ | 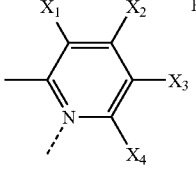 | H | $CF_3$ | H | H | 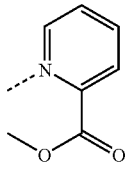 |
| (7) | Ir | 2 | 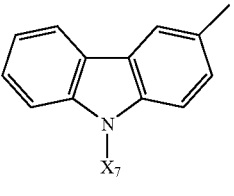 | $C_2H_5$ | 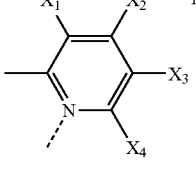 | H | H | $CF_3$ | H | 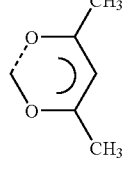 |
| (8) | Ir | 3 | 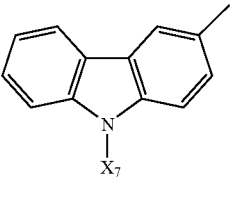 | $C_2H_5$ | 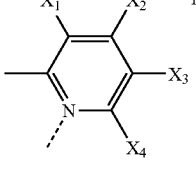 | H | H | $CF_3$ | H | — |
| (9) | Ir | 2 | 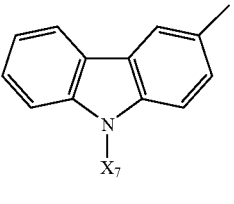 | $C_2H_5$ | 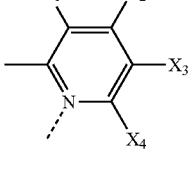 | H | H | $CF_3$ | H | 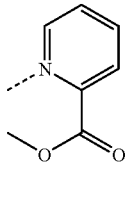 |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (10) | Ir | 2 | | $C_2H_5$ | | H | H | $NO_2$ | H | |
| (11) | Ir | 3 | | $C_2H_5$ | | H | H | $NO_2$ | H | — |
| (12) | Ir | 2 | | $C_2H_5$ | | H | H | $NO_2$ | H | |
| (13) | Ir | 2 | | $C_2H_5$ | | H | H | F | H | |
| (14) | Ir | 3 | | $C_2H_5$ | | H | H | F | H | — |
| (15) | Ir | 2 | | $C_2H_5$ | | H | H | F | H | |
| (16) | Ir | 2 | | $C_2H_5$ | | H | H | CN | H | |

TABLE I-1-continued
(Specific Synthetic Examples of Metal Coordination Compounds represented by Formulae I-(1) to I-(6))
| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (17) | Ir | 3 | 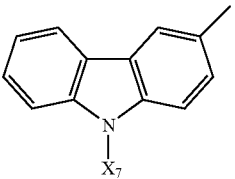 | $C_2H_5$ | 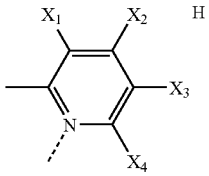 | H | H | CN | H | — |
| (18) | Ir | 2 | 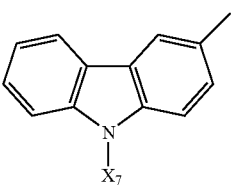 | $C_2H_5$ | 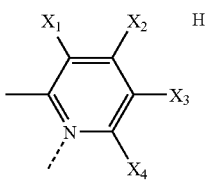 | H | H | CN | H | 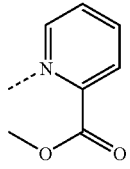 |
| (19) | Ir | 2 | 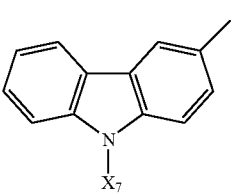 | $CH_2CF_3$ | 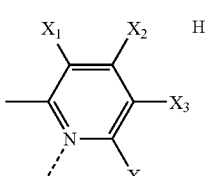 | H | H | H | H | 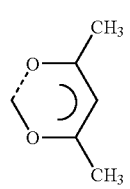 |
| (20) | Ir | 3 | 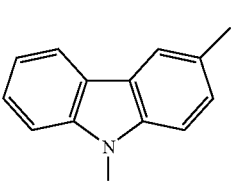 | $CH_2CF_3$ | 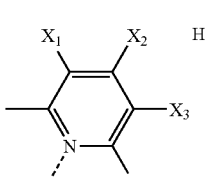 | H | H | H | H | — |
| (21) | Ir | 2 | 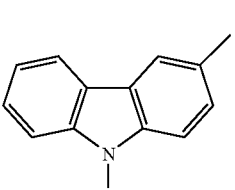 | $CH_2CF_3$ | 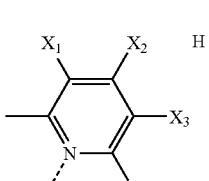 | H | H | H | H | 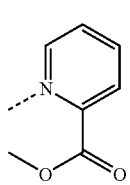 |
| (22) | Ir | 2 | 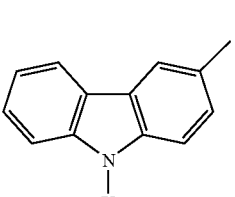 | $CH_2CF_3$ | 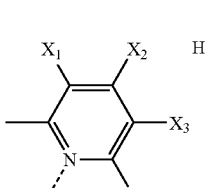 | H | $CF_3$ | H | H | 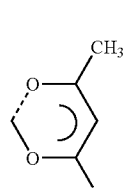 |
| (23) | Ir | 3 | 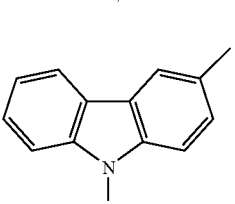 | $CH_2CF_3$ | 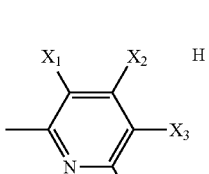 | H | $CF_3$ | H | H | — |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (24) | Ir | 2 | carbazole | $CH_2CF_3$ | pyridine | H | $CF_3$ | H | H | picolinate |
| (25) | Ir | 2 | carbazole | $CH_2CF_3$ | pyridine | H | H | $CF_3$ | H | acac-dimethyl |
| (26) | Ir | 3 | carbazole | $CH_2CF_3$ | pyridine | H | H | $CF_3$ | H | — |
| (27) | Ir | 2 | carbazole | $CH_2CF_3$ | pyridine | H | H | $CF_3$ | H | picolinate |
| (28) | Ir | 2 | carbazole | $CH_2CF_3$ | pyridine | H | H | $NO_2$ | H | acac-dimethyl |
| (29) | Ir | 3 | carbazole | $CH_2CF_3$ | pyridine | H | H | $NO_2$ | H | — |
| (30) | Ir | 2 | carbazole | $CH_2CF_3$ | pyridine | H | H | $NO_2$ | H | picolinate |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (31) | Ir | 2 | | $CH_2CF_3$ | | H | H | F | H | acac-CH₃ |
| (32) | Ir | 3 | | $CH_2CF_3$ | | H | H | F | H | — |
| (33) | Ir | 2 | | $CH_2CF_3$ | | H | H | F | H | picolinate methyl ester |
| (34) | Ir | 2 | | $CH_2CF_3$ | | H | H | CN | H | acac-CH₃ |
| (35) | Ir | 3 | | $CH_2CF_3$ | | H | H | CN | H | — |
| (36) | Ir | 2 | | $CH_2CF_3$ | | H | H | CN | H | picolinate methyl ester |
| (37) | Ir | 2 | 3-CF₃, 6-CH₃ carbazole | | | H | H | H | H | acac-CH₃ |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (38) | Ir | 3 | 3-CF$_3$, 6-CH$_3$ carbazole | | pyridine | H | H | H | H | — |
| (39) | Ir | 2 | 3-CF$_3$, 6-CH$_3$ carbazole | | pyridine | H | H | H | H | methyl picolinate |
| (40) | Ir | 2 | 3-CF$_3$, 6-CH$_3$ carbazole | | pyridine | H | CF$_3$ | H | H | dimethyl-dioxine |
| (41) | Ir | 3 | 3-CF$_3$, 6-CH$_3$ carbazole | | pyridine | H | CF$_3$ | H | H | — |
| (42) | Ir | 2 | 3-CF$_3$, 6-CH$_3$ carbazole | | pyridine | H | CF$_3$ | H | H | methyl picolinate |
| (43) | Ir | 2 | 3-CF$_3$, 6-CH$_3$ carbazole | | pyridine | H | H | CF$_3$ | H | dimethyl-dioxine |
| (44) | Ir | 3 | 3-CF$_3$, 6-CH$_3$ carbazole | | pyridine | H | H | CF$_3$ | H | — |

TABLE I-1-continued
(Specific Synthetic Examples of Metal Coordination Compounds represented by Formulae I-(1) to I-(6))
| No | M | n | Carbazole Unit | X₇ | Ring A | X₁ | X₂ | X₃ | X₄ | Other Ligand |
|---|---|---|---|---|---|---|---|---|---|---|
| (45) | Ir | 2 | 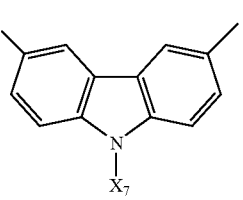 | CH₃ | 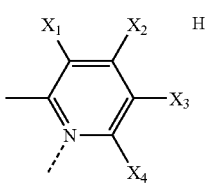 | H | H | CF₃ | H | 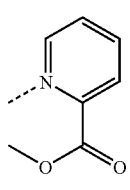 |
| (46) | Ir | 2 | 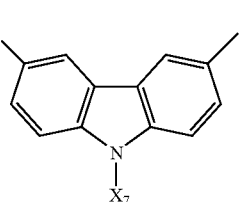 | CH₃ | 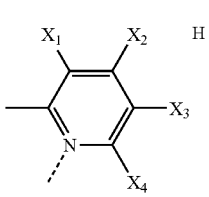 | H | H | NO₂ | H | 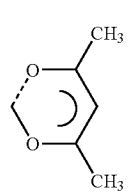 |
| (47) | Ir | 3 | 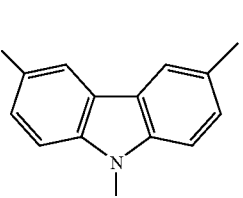 | CH₃ | 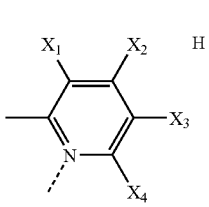 | H | H | NO₂ | H | — |
| (48) | Ir | 2 | 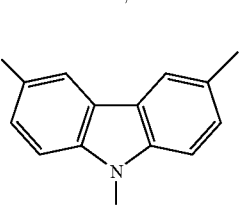 | CH₃ | 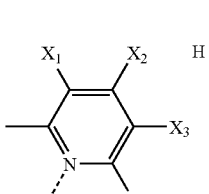 | H | H | NO₂ | H | 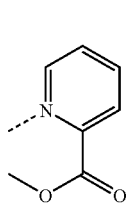 |
| (49) | Ir | 2 | 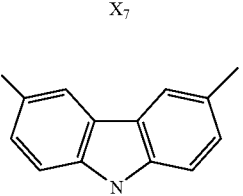 | CH₃ | 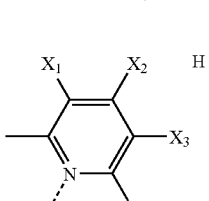 | H | H | F | H | 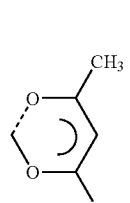 |
| (50) | Ir | 3 | 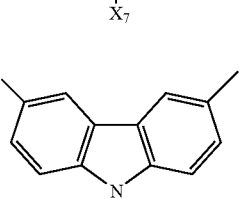 | CH₃ | 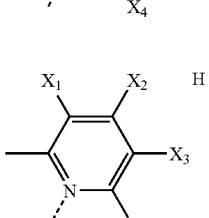 | H | H | F | H | — |
| (51) | Ir | 2 | 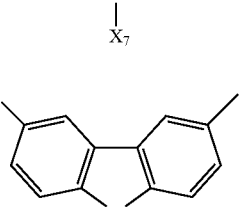 | CH₃ | 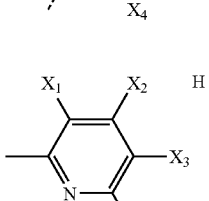 | H | H | F | H | 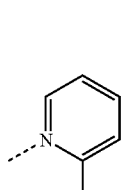 |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (52) | Ir | 2 | $F_3C$-carbazole-$CH_3$ | | pyridine | H | H | CN | H | acac-dimethyl |
| (53) | Ir | 3 | $F_3C$-carbazole-$CH_3$ | | pyridine | H | H | CN | H | — |
| (54) | Ir | 2 | $F_3C$-carbazole-$CH_3$ | | pyridine | H | H | CN | H | methyl picolinate |
| (55) | Ir | 2 | $F_3C$-carbazole-$CH_2CF_3$ | | pyridine | H | H | H | H | acac-dimethyl |
| (56) | Ir | 3 | $F_3C$-carbazole-$CH_2CF_3$ | | pyridine | H | H | H | H | — |
| (57) | Ir | 2 | $F_3C$-carbazole-$CH_2CF_3$ | | pyridine | H | H | H | H | methyl picolinate |
| (58) | Ir | 2 | $F_3C$-carbazole-$CH_2CF_3$ | | pyridine | H | $CF_3$ | H | H | acac-dimethyl |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (59) | Ir | 3 | $F_3C$—carbazole—$CH_2CF_3$ | $X_7$ | pyridine with $X_1, X_2, X_3, X_4$ | H | $CF_3$ | H | H | — |
| (60) | Ir | 2 | $F_3C$—carbazole—$CH_2CF_3$ | $X_7$ | pyridine with $X_1, X_2, X_3, X_4$ | H | $CF_3$ | H | H | methyl picolinate |
| (61) | Ir | 2 | $F_3C$—carbazole—$CH_2CF_3$ | $X_7$ | pyridine with $X_1, X_2, X_3, X_4$ | H | H | $CF_3$ | H | acac-type ($CH_3$, $CH_3$) |
| (62) | Ir | 3 | $F_3C$—carbazole—$CH_2CF_3$ | $X_7$ | pyridine with $X_1, X_2, X_3, X_4$ | H | H | $CF_3$ | H | — |
| (63) | Ir | 2 | $F_3C$—carbazole—$CH_2CF_3$ | $X_7$ | pyridine with $X_1, X_2, X_3, X_4$ | H | H | $CF_3$ | H | methyl picolinate |
| (64) | Ir | 2 | $F_3C$—carbazole—$CH_2CF_3$ | $X_7$ | pyridine with $X_1, X_2, X_3, X_4$ | H | H | $NO_2$ | H | acac-type ($CH_3$, $CH_3$) |
| (65) | Ir | 3 | $F_3C$—carbazole—$CH_2CF_3$ | $X_7$ | pyridine with $X_1, X_2, X_3, X_4$ | H | H | $NO_2$ | H | — |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (66) | Ir | 2 | 3-$CF_3$, 6-$CH_2CF_3$ carbazole | $X_7$ | pyridine | H | H | $NO_2$ | H | methyl picolinate |
| (67) | Ir | 2 | 3-$CF_3$, 6-$CH_2CF_3$ carbazole | $X_7$ | pyridine | H | H | F | H | 2,4-pentanedionate |
| (68) | Ir | 3 | 3-$CF_3$, 6-$CH_2CF_3$ carbazole | $X_7$ | pyridine | H | H | F | H | — |
| (69) | Ir | 2 | 3-$CF_3$, 6-$CH_2CF_3$ carbazole | $X_7$ | pyridine | H | H | F | H | methyl picolinate |
| (70) | Ir | 2 | 3-$CF_3$, 6-$CH_2CF_3$ carbazole | $X_7$ | pyridine | H | H | CN | H | 2,4-pentanedionate |
| (71) | Ir | 3 | 3-$CF_3$, 6-$CH_2CF_3$ carbazole | $X_7$ | pyridine | H | H | CN | H | — |
| (72) | Ir | 2 | 3-$CF_3$, 6-$CH_2CF_3$ carbazole | $X_7$ | pyridine | H | H | CN | H | methyl picolinate |

TABLE I-1-continued
(Specific Synthetic Examples of Metal Coordination Compounds represented by Formulae I-(1) to I-(6))
| No | M | n | Carbazole Unit | X₇ | Ring A | X₁ | X₂ | X₃ | X₄ | Other Ligand |
|---|---|---|---|---|---|---|---|---|---|---|
| (73) | Ir | 2 | 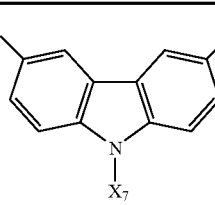 | t-C₄H₉ | 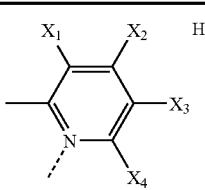 | H | H | H | H | 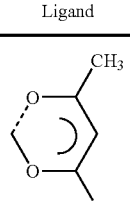 |
| (74) | Ir | 3 | 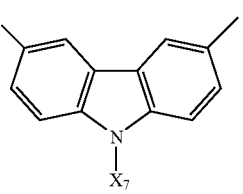 | t-C₄H₉ | 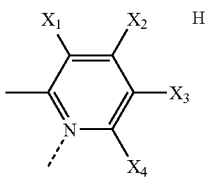 | H | H | H | H | — |
| (75) | Ir | 2 | 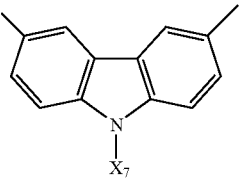 | t-C₄H₉ | 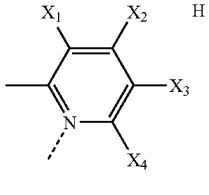 | H | H | H | H | 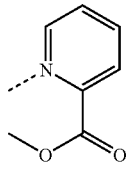 |
| (76) | Ir | 2 | 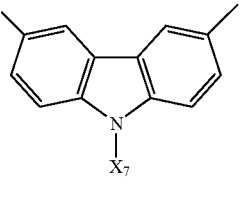 | t-C₄H₉ | 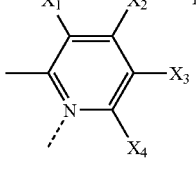 | H | CF₃ | H | H | 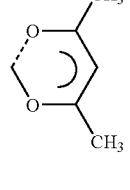 |
| (77) | Ir | 3 | 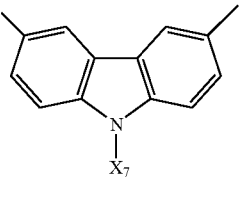 | t-C₄H₉ | 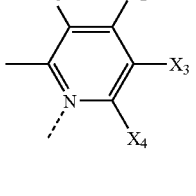 | H | CF₃ | H | H | — |
| (78) | Ir | 2 | 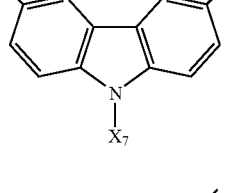 | t-C₄H₉ | 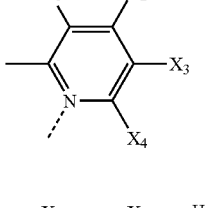 | H | CF₃ | H | H | 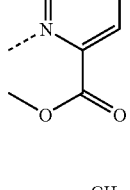 |
| (79) | Ir | 2 | 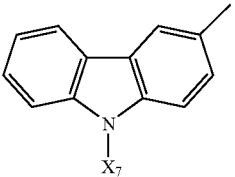 | t-C₄H₉ | 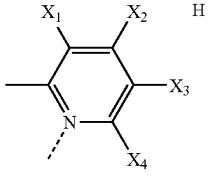 | H | H | CF₃ | H | 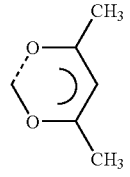 |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (80) | Ir | 3 | | t-$C_4H_9$ | | H | H | $CF_3$ | H | — |
| (81) | Ir | 2 | | t-$C_4H_9$ | | H | H | $CF_3$ | H | |
| (82) | Ir | 2 | | t-$C_4H_9$ | | H | H | $NO_2$ | H | |
| (83) | Ir | 3 | | t-$C_4H_9$ | | H | H | $NO_2$ | H | — |
| (84) | Ir | 2 | | t-$C_4H_9$ | | H | H | $NO_2$ | H | |
| (85) | Ir | 2 | | t-$C_4H_9$ | | H | H | F | H | |
| (86) | Ir | 3 | | t-$C_4H_9$ | | H | H | F | H | — |

TABLE I-1-continued (Specific Synthetic Examples of Metal Coordination Compounds represented by Formulae I-(1) to I-(6))

| No | M | n | Carbazole Unit | X₇ | Ring A | X₁ | X₂ | X₃ | X₄ | Other Ligand |
|---|---|---|---|---|---|---|---|---|---|---|
| (87) | Ir | 2 | carbazole | t-C₄H₉ | pyridine | H | H | F | H | methyl picolinate |
| (88) | Ir | 2 | carbazole | t-C₄H₉ | pyridine | H | H | CN | H | acac (dimethyl) |
| (89) | Ir | 3 | carbazole | t-C₄H₉ | pyridine | H | H | CN | H | — |
| (90) | Ir | 2 | carbazole | t-C₄H₉ | pyridine | H | H | CN | H | methyl picolinate |
| (91) | Rh | 2 | carbazole | C₂H₅ | pyridine | H | CF₃ | H | H | acac (dimethyl) |
| (92) | Rh | 3 | carbazole | C₂H₅ | pyridine | H | CF₃ | H | H | — |
| (93) | Rh | 2 | carbazole | C₂H₅ | pyridine | H | CF₃ | H | H | methyl picolinate |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (94) | Ru | 2 | carbazole | $C_2H_5$ | pyridine | H | $CF_3$ | H | H | acac-dimethyl |
| (95) | Ru | 3 | carbazole | $C_2H_5$ | pyridine | H | $CF_3$ | H | H | — |
| (96) | Ru | 2 | carbazole | $C_2H_5$ | pyridine | H | $CF_3$ | H | H | methyl picolinate |
| (97) | Os | 2 | carbazole | $C_2H_5$ | pyridine | H | $CF_3$ | H | H | acac-dimethyl |
| (98) | Os | 3 | carbazole | $C_2H_5$ | pyridine | H | $CF_3$ | H | H | — |
| (99) | Os | 2 | carbazole | $C_2H_5$ | pyridine | H | $CF_3$ | H | H | methyl picolinate |
| (100) | Pd | 2 | carbazole | $C_2H_5$ | pyridine | H | $CF_3$ | H | H | — |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (101) | Pd | 2 | (carbazole) | $C_2H_5$ | (pyridine) | H | $CF_3$ | H | H | — |
| (102) | Pt | 2 | (carbazole) | $C_2H_5$ | (pyridine) | H | $CF_3$ | H | H | — |
| (103) | Pt | 2 | (carbazole) | $C_2H_5$ | (pyridine) | H | $CF_3$ | H | H | — |
| (104) | Ir | 2 | (carbazole) | $C_2H_5$ | (pyridine) | H | H | H | H | (di-t-butyl dioxine) |
| (105) | Ir | 2 | (carbazole) | $C_2H_5$ | (pyridine) | H | H | H | H | (dimethyl benzyl dioxine) |
| (106) | Ir | 2 | (carbazole) | $C_2H_5$ | (pyridine) | H | H | H | H | (methyl 3-methylpicolinate) |
| (107) | Ir | 2 | (carbazole) | $C_2H_5$ | (pyridine) | H | H | $CF_3$ | H | (di-t-butyl dioxine) |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (108) | Ir | 2 | (carbazole) | $C_2H_5$ | (pyridine) | H | H | $CF_3$ | H | (dioxine-benzyl-dimethyl) |
| (109) | Ir | 2 | (carbazole) | $C_2H_5$ | (pyridine) | H | H | $CF_3$ | H | (methyl pyridine carboxylate) |
| (110) | Ir | 3 | (carbazole) | $C_2H_5$ | (benzoxazole) | H | H | H | H | — |
| (111) | Ir | 3 | (carbazole) | $C_2H_5$ | (benzothiazole) | H | H | H | H | — |
| (112) | Ir | 3 | (carbazole) | $C_2H_5$ | (benzotriazole) | H | H | H | H | — |
| (113) | Ir | 3 | (carbazole) | $C_2H_5$ | (oxazole) | H | (phenyl) | H | H | — |
| (114) | Ir | 3 | (carbazole) | $CH_2CF_3$ | (benzotriazole) | H | H | H | H | — |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (116) | Ir | 3 | 2,7-bis-substituted carbazole ($F_3C$-, $C_2H_5$-) with N-$X_7$ | $C_2H_5$ | benzotriazole | H | H | H | H | — |
| (117) | Ir | 2 | 3-methyl carbazole with N-$X_7$ | $C_2H_5$ | benzoxazole | H | H | H | H | acetylacetonate (dimethyl) |
| (118) | Ir | 2 | 3-methyl carbazole with N-$X_7$ | $C_2H_5$ | benzothiazole | H | H | H | H | methyl picolinate |
| (119) | Ir | 2 | 3-methyl carbazole with N-$X_7$ | $C_2H_5$ | benzotriazole | H | H | H | H | acetylacetonate (dimethyl) |
| (120) | Ir | 2 | 3-methyl carbazole with N-$X_7$ | $C_2H_5$ | oxazole | H | phenyl | — | — | methyl picolinate |
| (121) | Ir | 2 | 3-methyl carbazole with N-$X_7$ | $CH_2CF_3$ | benzotriazole | H | H | H | H | acetylacetonate (dimethyl) |
| (122) | Ir | 2 | 2,7-bis-substituted carbazole ($F_3C$-, $C_2H_5$-) with N-$X_7$ | $C_2H_5$ | benzotriazole | H | H | H | H | methyl picolinate |

TABLE I-1-continued (Specific Synthetic Examples of Metal Coordination Compounds represented by Formulae I-(1) to I-(6))

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (123) | Ir | 2 | | $C_2H_5$ | | H | H | H | H | |
| (124) | Ir | 2 | | $C_2H_5$ | | H | H | H | H | |
| (125) | Ir | 2 | | $C_2H_5$ | | H | H | H | H | |

(Metal Coordination Compounds Represented by Formulae II-(1) to II-(6))

In organic EL, in order to obtain phosphorescence emission from green to red, it is necessary to change the energy level of the lowest excited state. It is surmised that, since the lifetime of an excited triplet state is generally long compared with the lifetime of an excited singlet, and molecules remain in a high energy state for a long time, the molecules react with surrounding substances, the molecules themselves undergo structural change, excitons react with each other, etc., and as a result in the conventional metal coordination compounds the operating life of the phosphorescence-emitting device is short.

The present inventors have carried out various investigations and found that the metal coordination compounds represented by Formulae II-(1) to II-(6) below are phosphorescence-emitting materials having phosphorescence emission from green to red and a long operating life.

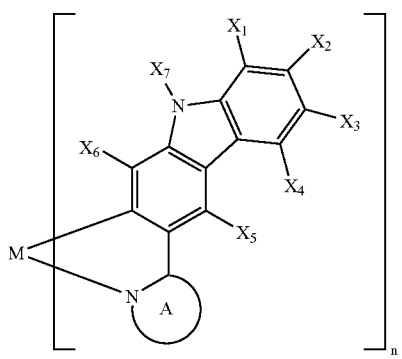

II-(1)

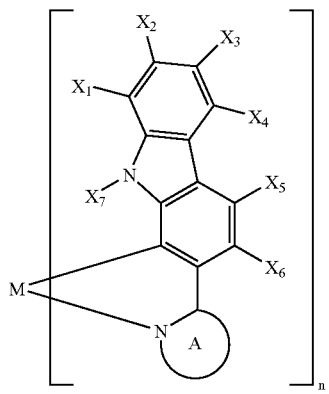

II-(2)

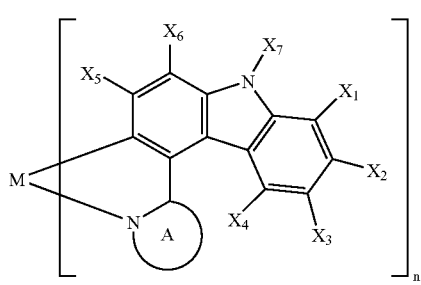

II-(3)

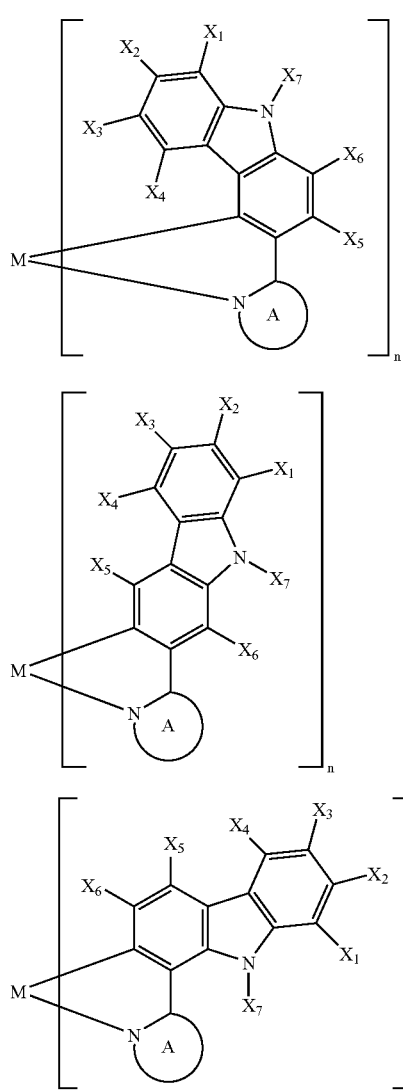

II-(4)

II-(5)

II-(6)

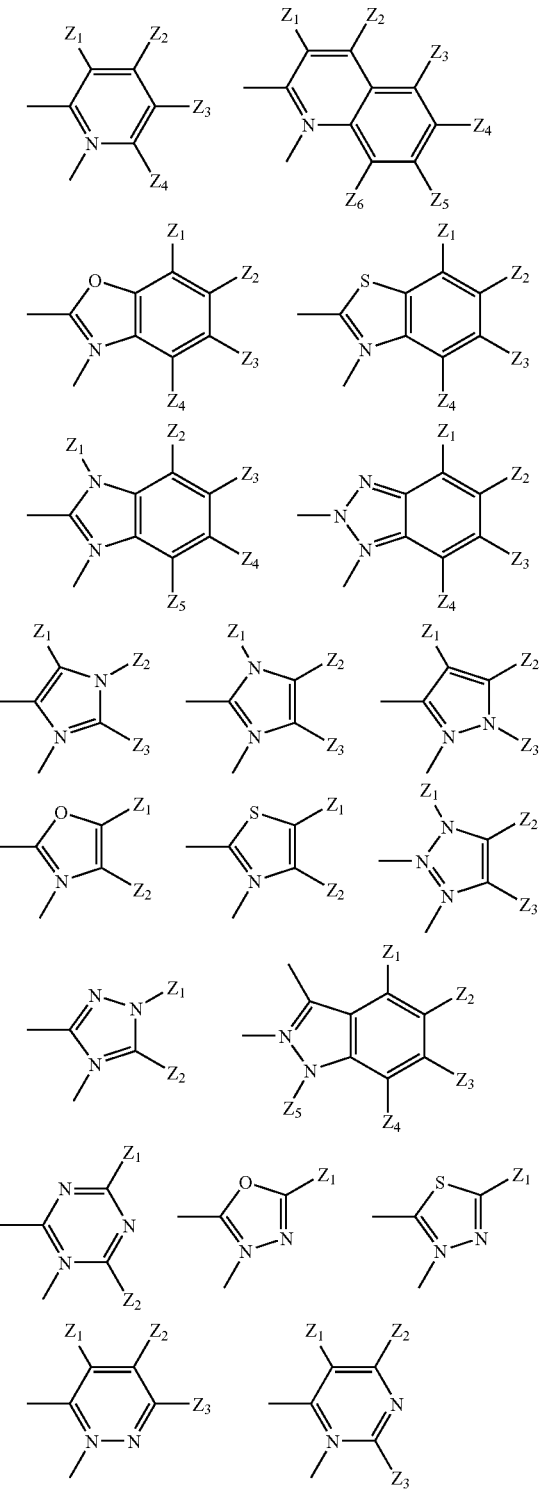

Formulae II-(7)

(In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_7$ are independently substituents selected from the group consisting of —H, —OH, —$R^1$, —$OR^2$, —$SR^3$, —$OCOR^4$, —$COOR^5$, —$SiR^6R^7R^8$, —$NH_2$, —$NHR^9$, and —$NR^{10}R^{11}$ (here, $R^1$ to $R^{11}$ represent a C1 to C22 straight-chain, cyclic, or branched alkyl group, a C6 to C21 aryl group, a C2 to C20 heteroaryl group, or a C7 to C21 aralkyl group, and $R^1$ to $R^{11}$ may be identical to or different from each other), $X_1$ to $X_7$ may be identical to or different from each other, and ring A may have a substituent that is the same as the groups defined by $X_1$ to $X_7$.) Here, $R^1$ to $R^{11}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may further be substituted by a halogen atom, a methyl group, etc.

In the metal coordination compounds represented by Formulae II-(1) to II-(6) above, ring A is preferably any one of the cyclic compounds having the structures shown below, is more preferably pyridine, quinoline, benzoxazole, benzothiazole, benzimidazole, benzotriazole, imidazole, pyrazole, oxazole, thiazole, triazole, benzopyrazole, triazine, or isoquinoline, which may have a substituent that is the same as the groups defined by $X_1$ to $X_7$ (hereinafter collectively referred to as substituents Xn), and is yet more preferably pyridine, quinoline, or isoquinoline.

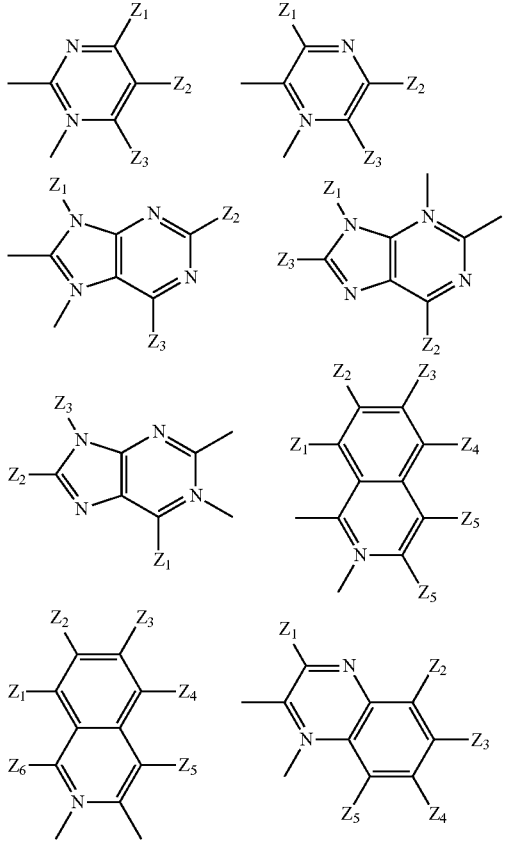

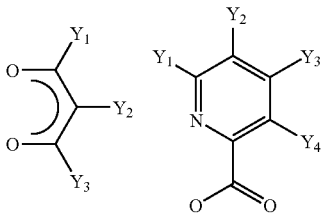

Formulae II-(8)

Here, $Y_1$ to $Y_4$ are the same substituents as the substituents represented by Xn in Formulae II-(1) to II-(6), and $Y_1$ to $Y_4$ may be identical to or different from each other.

In the metal coordination compounds represented by Formulae II-(1) to II-(6) above, it is preferable for at least one of the substituents Xn and the substituents of ring A defined as being the same as Xn to be —R, —OR, or —SR from the viewpoint of ease of control of the emission color from green to red. When at least one of the substituents Xn or the substituents of ring A defined as being the same as Xn comprises any one of the above-mentioned substituents, the other Xn are often hydrogen atoms, but may be another substituent. For example, $X_7$ is preferably an alkyl group, an aryl group, or a heteroaryl group.

Among the metal coordination compounds represented by Formulae II-(1) to II-(6) above, a metal coordination compound represented by Formulae II-(1) or II-(4) is preferable from the viewpoint of ease of synthesis.

With regard to the metal coordination compounds represented by Formulae II-(1) to II-(6) above, the energy level of the lowest excited state is changed by variously changing the substituent, and they are suitable as light-emitting materials for organic EL having green to red emission.

Specific examples of the metal coordination compounds represented by Formulae II-(1) to II-(6) above include the example compounds illustrated below, but they should not be construed as being limited thereto. $X_1$ to $X_4$ in Table II-1 represent substituents of ring A.

Here, $Z_1$ to $Z_6$ are the same substituents as the substituents represented by Xn in Formulae II-(1) to II-(6), and $Z_1$ to $Z_6$ may be identical to or different from each other.

When metal M is Ir, Rh, Ru, or Os and n=2, another ligand bonded to the metal M is preferably either one of the compounds having the structures shown below.

TABLE II-1

(Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (1) | Ir | 2 | | $CH_3$ | | H | H | H | H | |
| (2) | Ir | 3 | | $CH_3$ | | H | H | H | H | — |
| (3) | Ir | 2 | | $CH_3$ | | H | H | H | H | |
| (4) | Ir | 2 | | $C_2H_5$ | | H | $CH_3$ | H | H | |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (5) | Ir | 3 | | $C_2H_5$ | | H | $CH_3$ | H | H | — |
| (6) | Ir | 2 | | $C_2H_5$ | | H | $CH_3$ | H | H | (pyridine carboxylate) |
| (7) | Ir | 2 | | $C_2H_5$ | | H | H | $CH_3$ | H | (dimethyl dioxine) |
| (8) | Ir | 3 | | $C_2H_5$ | | H | H | $CH_3$ | H | — |
| (9) | Ir | 2 | | $C_2H_5$ | | H | H | $CH_3$ | H | (pyridine carboxylate) |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (10) | Ir | 2 | | $C_2H_5$ | | H | H | H | $OCH_3$ | (dimethyl dioxine) |
| (11) | Ir | 3 | | $C_2H_5$ | | H | H | H | $OCH_3$ | — |
| (12) | Ir | 2 | | $C_2H_5$ | | H | H | H | $OCH_3$ | (methyl picolinate) |
| (13) | Ir | 2 | | $C_2H_5$ | | H | H | $N(CH_3)_2$ | H | (dimethyl dioxine) |
| (14) | Ir | 3 | | $C_2H_5$ | | H | H | $N(CH_3)_2$ | H | — |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (15) | Ir | 2 | carbazole with OH | $C_2H_5$ | | H | H | $N(CH_3)_2$ | H | pyridine-2-carboxylate |
| (16) | Ir | 2 | carbazole | $C_2H_5$ | | H | $CH_3$ | H | H | dimethyl-dioxine |
| (17) | Ir | 3 | carbazole | $C_2H_5$ | | H | $CH_3$ | H | H | — |
| (18) | Ir | 2 | carbazole | $C_2H_5$ | | H | $CH_3$ | H | H | pyridine-2-carboxylate |
| (19) | Ir | 2 | carbazole | $C_2H_5$ | | H | H | $CH_3$ | H | dimethyl-dioxine |

TABLE II-1-continued
(Specific Synthetic Examples of Metal Coordination Compounds represented by Formulae II-(1) to II-(6))
| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (20) | Ir | 3 | 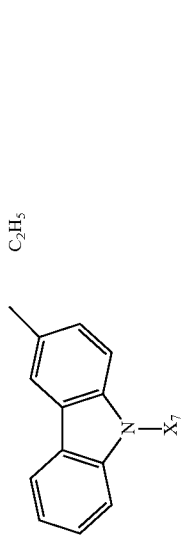 | $C_2H_5$ | 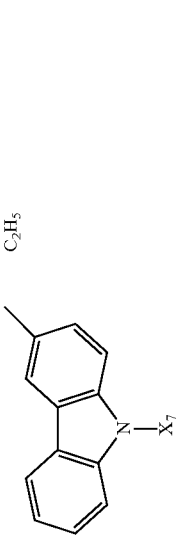 | H | H | $CH_3$ | H | — |
| (21) | Ir | 2 | 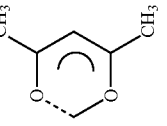 | $C_2H_5$ | 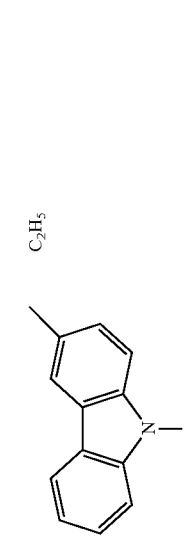 | H | H | $CH_3$ | H | 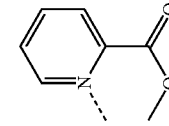 |
| (22) | Ir | 2 | 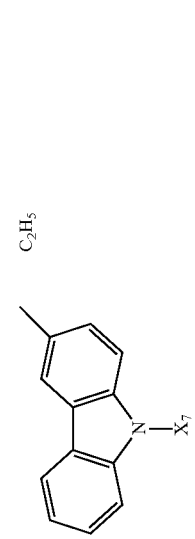 | $C_2H_5$ | | H | H | H | $OCH_3$ |  |
| (23) | Ir | 3 | | $C_2H_5$ | | H | H | H | $OCH_3$ | — |
| (24) | Ir | 2 | 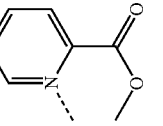 | $C_2H_5$ | | H | H | H | $OCH_3$ | |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (25) | Ir | 2 | 3-methylcarbazole-N-$X_7$ | $C_2H_5$ | pyridyl with $X_1$-$X_4$ | H | H | $N(CH_3)_2$ | H | 4,6-dimethyl-dioxine |
| (26) | Ir | 3 | 3-methylcarbazole-N-$X_7$ | $C_2H_5$ | pyridyl with $X_1$-$X_4$ | H | H | $N(CH_3)_2$ | H | — |
| (27) | Ir | 2 | 3-methylcarbazole-N-$X_7$ | $C_2H_5$ | pyridyl with $X_1$-$X_4$ | H | H | $N(CH_3)_2$ | H | methyl picolinate |
| (28) | Ir | 2 | 3-methylcarbazole-N-$X_7$ | $t$-$C_4H_9$ | pyridyl with $X_1$-$X_4$ | H | $CH_3$ | H | H | 4,6-dimethyl-dioxine |
| (29) | Ir | 3 | 3-methylcarbazole-N-$X_7$ | $t$-$C_4H_9$ | pyridyl with $X_1$-$X_4$ | H | $CH_3$ | H | H | — |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (30) | Ir | 2 | 3-methylcarbazole | t-$C_4H_9$ | | H | $CH_3$ | H | H | methyl picolinate |
| (31) | Ir | 2 | 3-methylcarbazole | t-$C_4H_9$ | | H | H | $CH_3$ | H | 2,2,6,6-dimethyl-1,3-dioxine |
| (32) | Ir | 3 | 3-methylcarbazole | t-$C_4H_9$ | | H | H | $CH_3$ | H | — |
| (33) | Ir | 2 | 3-methylcarbazole | t-$C_4H_9$ | | H | H | $CH_3$ | H | methyl picolinate |
| (34) | Ir | 2 | 3-methylcarbazole | t-$C_4H_9$ | | H | H | H | $OCH_3$ | 2,2,6,6-dimethyl-1,3-dioxine |

TABLE II-1-continued
(Specific Synthetic Examples of Metal Coordination Compounds represented by Formulae II-(1) to II-(6))
| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (35) | Ir | 3 | 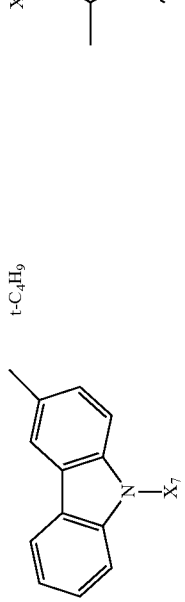 | t-$C_4H_9$ | 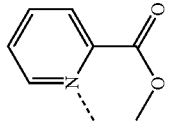 | H | H | H | $OCH_3$ | — |
| (36) | Ir | 2 | 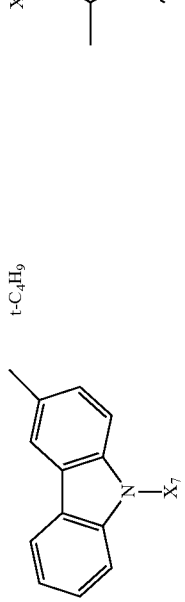 | t-$C_4H_9$ |  | H | H | H | $OCH_3$ | 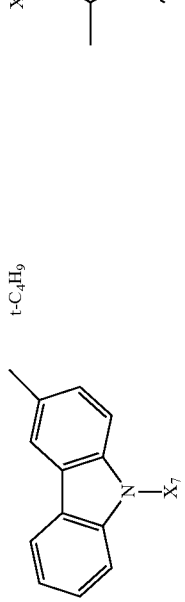 |
| (37) | Ir | 2 |  | t-$C_4H_9$ | 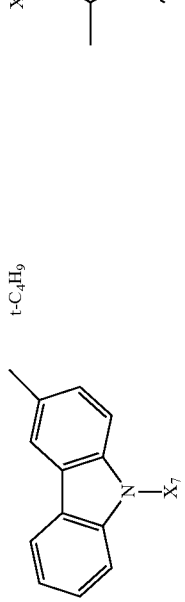 | H | H | $N(CH_3)_2$ | H |  |
| (38) | Ir | 3 | 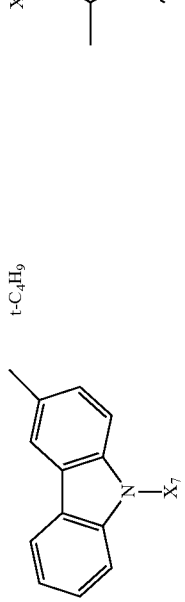 | t-$C_4H_9$ |  | H | H | $N(CH_3)_2$ | H | — |
| (39) | Ir | 2 | | t-$C_4H_9$ | | H | H | $N(CH_3)_2$ | H | |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (40) | Ir | 2 | [carbazole with H₃CO] | $C_2H_5$ | [ring A structure] | H | H | H | H | [4,6-dimethyl-1,3-dioxine ligand] |
| (41) | Ir | 3 | [carbazole with H₃CO] | $C_2H_5$ | [ring A structure] | H | H | H | H | — |
| (42) | Ir | 2 | [carbazole with H₃CO] | $C_2H_5$ | [ring A structure] | H | H | H | H | [methyl picolinate ligand] |
| (43) | Ir | 2 | [carbazole with H₃CO] | $C_2H_5$ | [ring A structure] | H | $CH_3$ | H | H | [4,6-dimethyl-1,3-dioxine ligand] |
| (44) | Ir | 3 | [carbazole with H₃CO] | $C_2H_5$ | [ring A structure] | H | $CH_3$ | H | H | — |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (45) | Ir | 2 | | $C_2H_5$ | | H | $CH_3$ | H | H | pyridine-2-carboxylate methyl ester |
| (46) | Ir | 2 | | $C_2H_5$ | | H | H | $CH_3$ | H | 4,6-dimethyl-1,3-dioxine |
| (47) | Ir | 3 | | $C_2H_5$ | | H | H | $CH_3$ | H | — |
| (48) | Ir | 2 | | $C_2H_5$ | | H | H | $CH_3$ | H | pyridine-2-carboxylate methyl ester |
| (49) | Ir | 2 | | $C_2H_5$ | | H | H | H | $OCH_3$ | 4,6-dimethyl-1,3-dioxine |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (50) | Ir | 3 | (carbazole with H$_3$CO) | $C_2H_5$ | | H | H | H | OCH$_3$ | — |
| (51) | Ir | 2 | (carbazole with H$_3$CO) | $C_2H_5$ | | H | H | H | OCH$_3$ | (pyridine-2-carboxylate) |
| (52) | Ir | 2 | (carbazole with H$_3$CO) | $C_2H_5$ | | H | H | N(CH$_3$)$_2$ | H | (dioxine with CH$_3$ groups) |
| (53) | Ir | 3 | (carbazole with H$_3$CO) | $C_2H_5$ | | H | H | N(CH$_3$)$_2$ | H | — |
| (54) | Ir | 2 | (carbazole with H$_3$CO) | $C_2H_5$ | | H | H | N(CH$_3$)$_2$ | H | (pyridine-2-carboxylate) |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (55) | Ir | 2 | | p-C₆H₄-N(CH₃)₂ | | H | H | H | H | 4,6-dimethyl-1,3-dioxine |
| (56) | Ir | 3 | | p-C₆H₄-N(CH₃)₂ | | H | H | H | H | — |
| (57) | Ir | 2 | | p-C₆H₄-N(CH₃)₂ | | H | H | H | H | methyl picolinate |
| (58) | Ir | 2 | | p-C₆H₄-N(CH₃)₂ | | H | CH₃ | H | H | 4,6-dimethyl-1,3-dioxine |
| (59) | Ir | 3 | | p-C₆H₄-N(CH₃)₂ | | H | CH₃ | H | H | — |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (60) | Ir | 2 | | N(CH$_3$)$_2$ | | H | CH$_3$ | H | H | |
| (61) | Ir | 2 | | N(CH$_3$)$_2$ | | H | H | CH$_3$ | H | |
| (62) | Ir | 3 | | N(CH$_3$)$_2$ | | H | H | CH$_3$ | H | — |
| (63) | Ir | 2 | | N(CH$_3$)$_2$ | | H | H | CH$_3$ | H | |
| (64) | Ir | 2 | | N(CH$_3$)$_2$ | | H | H | H | OCH$_3$ | |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (65) | Ir | 3 | 3-methylcarbazole | p-N(CH$_3$)$_2$-phenyl | pyridyl | H | H | H | OCH$_3$ | — |
| (66) | Ir | 2 | 3-methylcarbazole | p-N(CH$_3$)$_2$-phenyl | pyridyl | H | H | H | OCH$_3$ | picolinate |
| (67) | Ir | 2 | 3-methylcarbazole | p-N(CH$_3$)$_2$-phenyl | pyridyl | H | H | N(CH$_3$)$_2$ | H | dimethyl-dioxine |
| (68) | Ir | 3 | 3-methylcarbazole | p-N(CH$_3$)$_2$-phenyl | pyridyl | H | H | N(CH$_3$)$_2$ | H | — |
| (69) | Ir | 2 | 3-methylcarbazole | p-N(CH$_3$)$_2$-phenyl | pyridyl | H | H | N(CH$_3$)$_2$ | H | picolinate |

TABLE II-1-continued (Specific Synthetic Examples of Metal Coordination Compounds represented by Formulae II-(1) to II-(6))

| No. | M | n | Carbazole Unit | X₇ | Ring A | X₁ | X₂ | X₃ | X₄ | Other Ligand |
|---|---|---|---|---|---|---|---|---|---|---|
| (70) | Ir | 2 | 3-methylcarbazole-N-X₇ | mesityl (3,5-di-CH₃, 4-CH₃ phenyl) | pyridyl with X₁–X₄ | H | H | H | H | 4,6-dimethyl-1,3-dioxine |
| (71) | Ir | 3 | 3-methylcarbazole-N-X₇ | mesityl | pyridyl with X₁–X₄ | H | H | H | H | — |
| (72) | Ir | 2 | 3-methylcarbazole-N-X₇ | mesityl | pyridyl with X₁–X₄ | H | H | H | H | methyl pyridine-2-carboxylate |
| (73) | Ir | 2 | 3-methylcarbazole-N-X₇ | mesityl | pyridyl with X₁–X₄ | H | CH₃ | H | H | 4,6-dimethyl-1,3-dioxine |
| (74) | Ir | 3 | 3-methylcarbazole-N-X₇ | mesityl | pyridyl with X₁–X₄ | H | CH₃ | H | H | — |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (75) | Ir | 2 | | | | H | CH$_3$ | H | H | |
| (76) | Ir | 2 | | | | H | H | CH$_3$ | H | |
| (77) | Ir | 3 | | | | H | H | CH$_3$ | H | — |
| (78) | Ir | 2 | | | | H | H | CH$_3$ | H | |
| (79) | Ir | 2 | | | | H | H | H | OCH$_3$ | |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (80) | Ir | 3 | 3-methylcarbazole | mesityl | pyridyl | H | H | H | CH$_3$ | — |
| (81) | Ir | 2 | 3-methylcarbazole | mesityl | pyridyl | H | H | H | OCH$_3$ | methyl picolinate |
| (82) | Ir | 2 | 3-methylcarbazole | mesityl | pyridyl | H | H | N(CH$_3$)$_2$ | H | 2,6-dimethyl-4H-1,3-dioxine |
| (83) | Ir | 3 | 3-methylcarbazole | mesityl | pyridyl | H | H | N(CH$_3$)$_2$ | H | — |
| (84) | Ir | 2 | 3-methylcarbazole | mesityl | pyridyl | H | H | N(CH$_3$)$_2$ | H | methyl picolinate |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (85) | Ir | 2 | | | | H | H | H | H | |
| (86) | Ir | 3 | | | | H | H | H | H | — |
| (87) | Ir | 2 | | | | H | H | H | H | |
| (88) | Ir | 2 | | | | H | $CH_3$ | H | H | |
| (89) | Ir | 3 | | | | H | $CH_3$ | H | H | — |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (90) | Ir | 2 | | | | H | CH$_3$ | H | H | |
| (91) | Ir | 2 | | | | H | H | CH$_3$ | H | |
| (92) | Ir | 3 | | | | H | H | CH$_3$ | H | — |
| (93) | Ir | 2 | | | | H | H | CH$_3$ | H | |
| (94) | Ir | 2 | | | | H | H | H | OCH$_3$ | |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (95) | Ir | 3 | | | | H | H | H | OCH$_3$ | — |
| (96) | Ir | 2 | | | | H | H | H | OCH$_3$ | |
| (97) | Ir | 2 | | | | H | H | N(CH$_3$)$_2$ | H | |
| (98) | Ir | 3 | | | | H | H | N(CH$_3$)$_2$ | H | — |
| (99) | Ir | 2 | | | | H | H | N(CH$_3$)$_2$ | H | |

TABLE II-1-continued (Specific Synthetic Examples of Metal Coordination Compounds represented by Formulae II-(1) to II-(6))

| No. | M | n | Carbazole Unit | X₇ | Ring A | X₁ | X₂ | X₃ | X₄ | Other Ligand |
|---|---|---|---|---|---|---|---|---|---|---|
| (100) | Rh | 2 | | C₂H₅ | | H | H | CH₃ | H | 4,6-dimethyl-1,3-dioxine |
| (101) | Rh | 3 | | C₂H₅ | | H | H | CH₃ | H | — |
| (102) | Rh | 2 | | C₂H₅ | | H | H | CH₃ | H | methyl pyridine-2-carboxylate |
| (103) | Ru | 2 | | C₂H₅ | | H | H | CH₃ | H | 4,6-dimethyl-1,3-dioxine |
| (104) | Ru | 3 | | C₂H₅ | | H | H | CH₃ | H | — |

TABLE II-1-continued (Specific Synthetic Examples of Metal Coordination Compounds represented by Formulae II-(1) to II-(6))

| No. | M | n | Carbazole Unit | X₇ | Ring A | X₁ | X₂ | X₃ | X₄ | Other Ligand |
|---|---|---|---|---|---|---|---|---|---|---|
| (105) | Ru | 2 | | C₂H₅ | | H | H | CH₃ | H | methyl pyridine-2-carboxylate |
| (106) | Os | 2 | | C₂H₅ | | H | H | CH₃ | H | 2,6-dimethyl-4H-1,3-dioxine |
| (107) | Os | 3 | | C₂H₅ | | H | H | CH₃ | H | — |
| (108) | Os | 2 | | C₂H₅ | | H | H | CH₃ | H | methyl pyridine-2-carboxylate |
| (109) | Pd | 2 | | C₂H₅ | | H | H | CH₃ | H | — |

TABLE II-1-continued (Specific Synthetic Examples of Metal Coordination Compounds represented by Formulae II-(1) to II-(6))

| No. | M | n | Carbazole Unit | X₇ | Ring A | X₁ | X₂ | X₃ | X₄ | Other Ligand |
|---|---|---|---|---|---|---|---|---|---|---|
| (110) | Pd | 2 | | C₂H₅ | | H | H | CH₃ | H | — |
| (111) | Pt | 2 | | C₂H₅ | | H | H | CH₃ | H | — |
| (112) | Pt | 2 | | C₂H₅ | | H | H | CH₃ | H | — |
| (113) | Ir | 2 | | C₂H₅ | | H | CH₃ | H | H | (dipivaloylmethane-type ligand) |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (114) | Ir | 2 | | $C_2H_5$ | | H | $CH_3$ | H | H | |
| (116) | Ir | 2 | | $C_2H_5$ | | H | $CH_3$ | H | H | |
| (117) | Ir | 2 | | $C_2H_5$ | | H | H | $CH_3$ | H | |
| (118) | Ir | 2 | | $C_2H_5$ | | H | H | $CH_3$ | H | |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (119) | Ir | 2 | (3-methylcarbazole-N-$X_7$) | $C_2H_5$ | phenyl with $X_1,X_2,X_3,X_4$ and methyl | H | H | $CH_3$ | H | methyl 3-methylpyridine-2-carboxylate |
| (120) | Ir | 3 | (3-methylcarbazole-N-$X_7$) | mesityl (2,4,6-trimethylphenyl) | benzoxazole | H | H | H | H | — |
| (121) | Ir | 3 | (3-methylcarbazole-N-$X_7$) | mesityl (2,4,6-trimethylphenyl) | benzothiazole | H | H | H | H | — |
| (122) | Ir | 3 | (3-methylcarbazole-N-$X_7$) | mesityl (2,4,6-trimethylphenyl) | benzimidazole | H | H | H | H | — |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (123) | Ir | 3 | 3-methyl carbazole | 2,4,6-trimethylphenyl (mesityl) | 2-methyl oxazole | H | phenyl | — | — | — |
| (124) | Ir | 3 | 3-methyl carbazole | 4-(N(CH$_3$)$_2$)phenyl | N-methyl benzimidazole | H | H | H | H | — |
| (125) | Ir | 3 | 3-methyl carbazole | 2,5-dimethylthiophene | N-methyl benzimidazole | H | H | H | H | — |
| (126) | Ir | 2 | 3-methyl carbazole | 2,4,6-trimethylphenyl (mesityl) | 2-methyl benzoxazole | H | H | H | H | 2,2,6,6-tetramethyl-3,5-heptanedionate |

TABLE II-1-continued (Specific Synthetic Examples of Metal Coordination Compounds represented by Formulae II-(1) to II-(6))

| No. | M | n | Carbazole Unit | $X_7$ | Ring A | $X_1$ | $X_2$ | $X_3$ | $X_4$ | Other Ligand |
|---|---|---|---|---|---|---|---|---|---|---|
| (127) | Ir | 3 | | | | H | H | H | H | |
| (128) | Ir | 2 | | | | H | H | H | H | |
| (129) | Ir | 2 | | | | H | | H | H | |

(Metal Coordination Compounds Represented by Formulae III-(1) to III-(6))

In organic EL, in order to obtain phosphorescence emission from blue to red, it is necessary to change the energy level of the lowest excited state. It is surmised that, since the lifetime of an excited triplet state is generally long compared with the lifetime of an excited singlet, and molecules remain in a high energy state for a long time, the molecules react with surrounding substances, the molecules themselves undergo structural change, excitons react with each other, etc., and as a result the operating life of the phosphorescence-emitting device is short.

The present inventors have carried out various investigations and found that the metal coordination compounds represented by Formulae III-(1) to III-(6) below are phosphorescence-emitting materials having phosphorescence emission from blue to red and a long operating life.

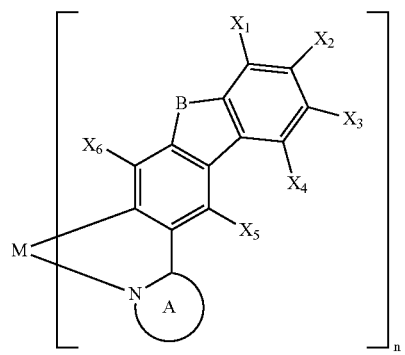

III-(1)

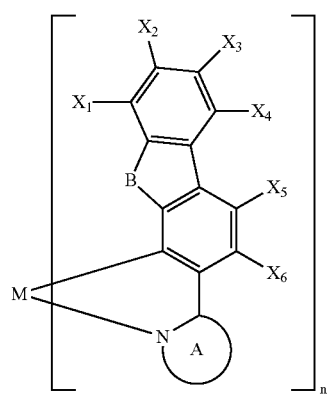

III-(2)

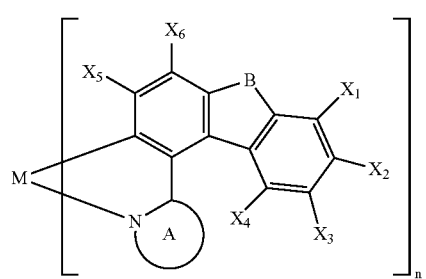

III-(3)

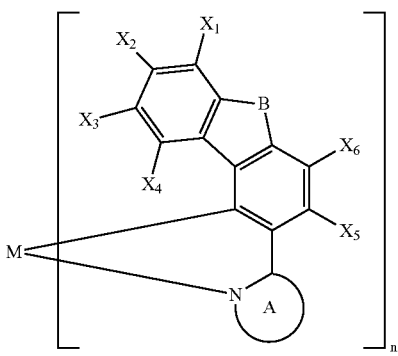

III-(4)

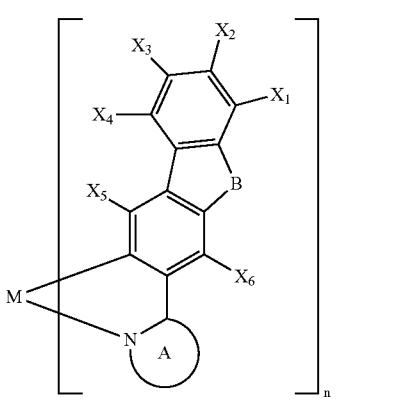

III-(5)

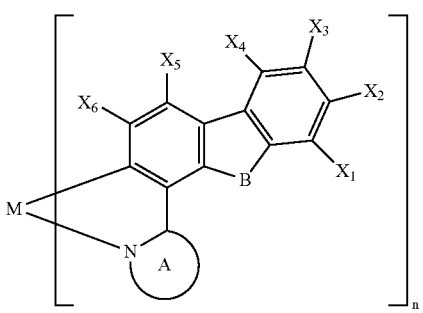

III-(6)

B: >O, >S, >C=O, >SO$_2$, >CR$_2$ (In the formulae, M is Ir, Rh, Ru, Os, Pd, or Pt, and n is 2 or 3. When M is Ir, Rh, Ru, or Os and n is 2, another bidentate ligand further bonds to M. Ring A is a cyclic compound containing a nitrogen atom bonded to M. $X_1$ to $X_6$ and R are independently substituents selected from the group consisting of —$R^1$, —$OR^2$, —$SR^3$, —$OCOR^4$, —$COOR^5$, —$SiR^6R^7R^8$, and —$NR^9R^{10}$ (here, $R^1$ to $R^{10}$ represent a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C21 aryl group, a C2 to C20 heteroaryl group, or a C7 to C21 aralkyl group, or a corresponding halogen-substituted aryl group, halogen-substituted heteroaryl group, or halogen-substituted aralkyl group in which a part or all of the hydrogen atoms are substituted by a halogen atom, and $R^1$ to $R^{10}$ may be identical to or different from each other), $X_1$ to $X_6$ may be identical to or different from each other, and ring A may have a substituent that is the same as the groups defined by $X_1$ to $X_6$.) Here, $R^1$ to $R^{10}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may further be substituted by a halogen atom, a methyl group, etc.

In the metal coordination compounds represented by Formulae III-(1) to III-(6) above, ring A is preferably any one of the cyclic compounds having the structures shown below, is more preferably pyridine, quinoline, benzoxazole, benzothiazole, benzimidazole, benzotriazole, imidazole, pyrazole, oxazole, thiazole, triazole, benzopyrazole, triazine, or isoquinoline, which may have a substituent that is the same as the groups defined by $X_1$ to $X_6$ (hereinafter collectively referred to as substituents Xn), and is yet more preferably pyridine, quinoline, or isoquinoline.

Formulae III-(7)

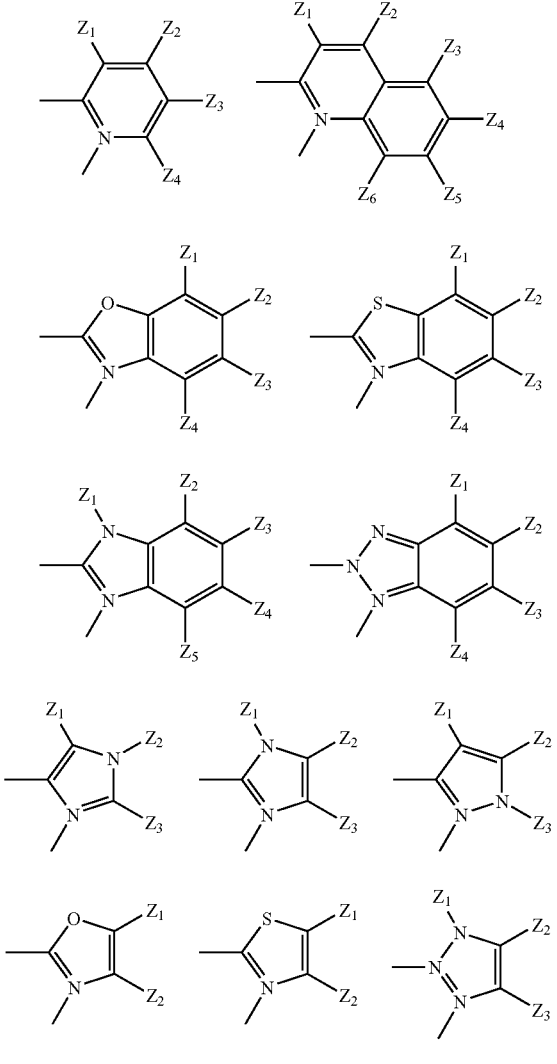
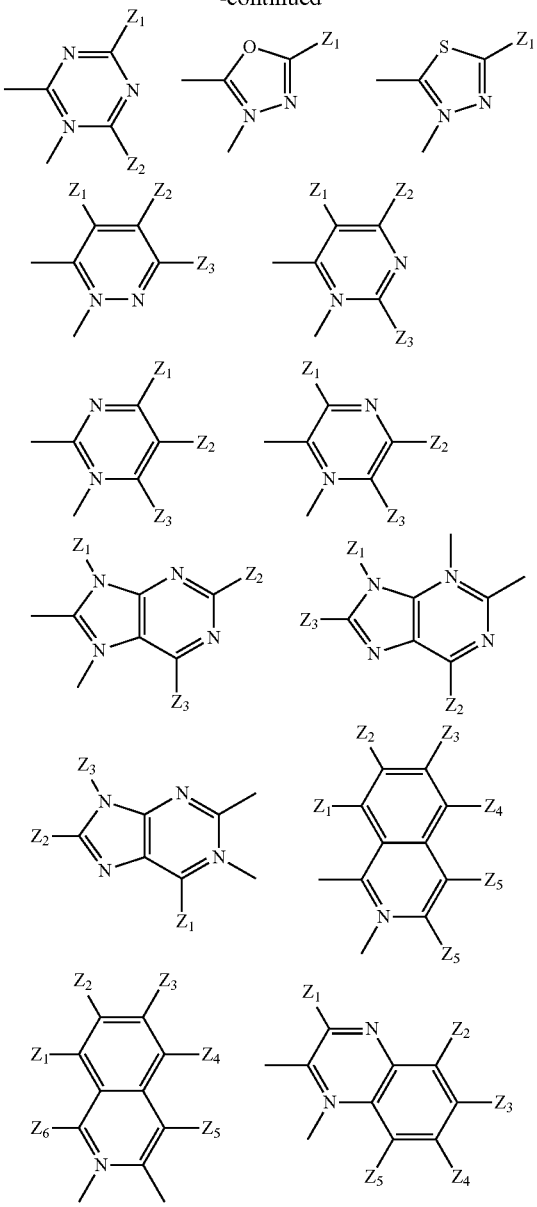

Here, $Z_1$ to $Z_6$ are the same substituents as the substituents represented by Xn in Formulae III-(1) to III-(6), and $Z_1$ to $Z_6$ may be identical to or different from each other.

When metal M is Ir, Rh, Ru, or Os and n=2, another ligand bonded to the metal M is preferably either one of the compounds having the structures shown below.

Formulae III-(8)

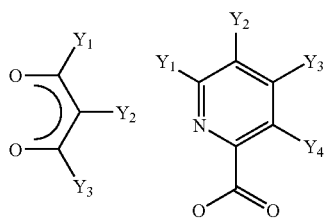

Here, $Y_1$ to $Y_4$ are the same substituents as the substituents represented by Xn in Formulae III-(1) to III-(6), and $Y_1$ to $Y_4$ may be identical to or different from each other.

In the metal coordination compounds represented by Formulae III-(1) to III-(6) above, at least one of the substituents Xn and the substituents of ring A defined as being the same as Xn is preferably a halogen atom, a cyano group, or a halogen-substituted alkyl group from the viewpoint of a blue emission color being obtained, more preferably a fluorine atom, a chlorine atom, a cyano group, or a trifluoromethyl group, yet more preferably a fluorine atom or a trifluoromethyl group, and most preferably a fluorine atom. From the viewpoint of ease of control of emission color from blue to red, —R, —OR, or —SR is preferable. When at least one of the substituents Xn or the substituents of ring A defined as being the same as Xn comprises any one of the above-mentioned substituents, the other Xn are often hydrogen atoms, but may be another substituent.

Among the metal coordination compounds represented by Formulae III-(1) to III-(6) above, from the viewpoint of ease of synthesis, a metal coordination compound represented by Formulae III-(2) or III-(5) is preferable.

Among the metal coordination compounds represented by Formulae III-(1) to III-(6) above, from the viewpoint of a blue emission color being obtained, B is preferably >C=O or >$SO_2$, and from the viewpoint of an emission wavelength from green to red being obtained, B is preferably >O, >S, or >$CR_2$.

With regard to the metal coordination compounds represented by Formulae III-(1) to III-(6) above, the energy level of the lowest excited state is changed by variously changing the substituent, and they are suitable as light-emitting materials for organic EL having emission from blue to red.

Specific examples of the metal coordination compounds represented by Formulae III-(1) to III-(6) above include example compounds illustrated below, but they should not be construed as being limited thereto. $X_1$ to $X_4$ in Table III-1 represent substituents of ring A.

TABLE III-1

(Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (1) | Ir | 2 | | | H | H | H | H | |
| (2) | Ir | 3 | | | H | H | H | H | — |
| (3) | Ir | 2 | | | H | H | H | H | |
| (4) | Ir | 2 | | | H | $CH_3$ | H | H | |
| (5) | Ir | 3 | | | H | $CH_3$ | H | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (6) | Ir | 2 | (fluorenone with methyl) | (pyridine with $X_1$–$X_4$) | H | $CH_3$ | H | H | (methyl picolinate) |
| (7) | Ir | 2 | (fluorenone with methyl) | (pyridine with $X_1$–$X_4$) | H | H | $CH_3$ | H | (acetylacetonate with two $CH_3$) |
| (8) | Ir | 3 | (fluorenone with methyl) | (pyridine with $X_1$–$X_4$) | H | H | $CH_3$ | H | — |
| (9) | Ir | 2 | (fluorenone with methyl) | (pyridine with $X_1$–$X_4$) | H | H | $CH_3$ | H | (methyl picolinate) |
| (10) | Ir | 2 | (fluorenone with methyl) | (pyridine with $X_1$–$X_4$) | H | H | H | $OCH_3$ | (acetylacetonate with two $CH_3$) |
| (11) | Ir | 3 | (fluorenone with methyl) | (pyridine with $X_1$–$X_4$) | H | H | H | $OCH_3$ | — |
| (12) | Ir | 2 | (fluorenone with methyl) | (pyridine with $X_1$–$X_4$) | H | H | H | $OCH_3$ | (methyl picolinate) |
| (13) | Ir | 2 | (fluorenone with methyl) | (pyridine with $X_1$–$X_4$) | H | H | $N(CH_3)_2$ | H | (acetylacetonate with two $CH_3$) |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (14) | Ir | 3 | 2-methylfluorenone | pyridine with $X_1$–$X_4$ | H | H | $N(CH_3)_2$ | H | — |
| (15) | Ir | 2 | 2-methylfluorenone | pyridine with $X_1$–$X_4$ | H | H | $N(CH_3)_2$ | H | methyl picolinate |
| (16) | Ir | 2 | 2-methylfluorenone | pyridine with $X_1$–$X_4$ | H | $CF_3$ | H | H | acetylacetonate |
| (17) | Ir | 3 | 2-methylfluorenone | pyridine with $X_1$–$X_4$ | H | $CF_3$ | H | H | — |
| (18) | Ir | 2 | 2-methylfluorenone | pyridine with $X_1$–$X_4$ | H | $CF_3$ | H | H | methyl picolinate |
| (19) | Ir | 2 | 2-methylfluorenone | pyridine with $X_1$–$X_4$ | H | H | $CF_3$ | H | acetylacetonate |
| (20) | Ir | 3 | 2-methylfluorenone | pyridine with $X_1$–$X_4$ | H | H | $CF_3$ | H | — |
| (21) | Ir | 2 | 2-methylfluorenone | pyridine with $X_1$–$X_4$ | H | H | $CF_3$ | H | methyl picolinate |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (22) | Ir | 2 | 2-methylfluorenone | pyridine | H | H | $NO_2$ | H | acetylacetonate |
| (23) | Ir | 3 | 2-methylfluorenone | pyridine | H | H | $NO_2$ | H | — |
| (24) | Ir | 2 | 2-methylfluorenone | pyridine | H | H | $NO_2$ | H | methyl picolinate |
| (25) | Ir | 2 | 2-methylfluorenone | pyridine | H | H | F | H | acetylacetonate |
| (26) | Ir | 3 | 2-methylfluorenone | pyridine | H | H | F | H | — |
| (27) | Ir | 2 | 2-methylfluorenone | pyridine | H | H | F | H | methyl picolinate |
| (28) | Ir | 2 | 2-methylfluorenone | pyridine | H | H | CN | H | acetylacetonate |
| (29) | Ir | 3 | 2-methylfluorenone | pyridine | H | H | CN | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (30) | Ir | 2 | fluorenone with methyl | pyridine | H | H | CN | H | methyl picolinate |
| (31) | Ir | 2 | 9,9-diethylfluorene with methyl | pyridine | H | H | H | H | acac (dimethyl) |
| (32) | Ir | 3 | 9,9-diethylfluorene with methyl | pyridine | H | H | H | H | — |
| (33) | Ir | 2 | 9,9-diethylfluorene with methyl | pyridine | H | H | H | H | methyl picolinate |
| (34) | Ir | 2 | 9,9-diethylfluorene with methyl | pyridine | H | $CH_3$ | H | H | acac (dimethyl) |
| (35) | Ir | 3 | 9,9-diethylfluorene with methyl | pyridine | H | $CH_3$ | H | H | — |
| (36) | Ir | 2 | 9,9-diethylfluorene with methyl | pyridine | H | $CH_3$ | H | H | methyl picolinate |
| (37) | Ir | 2 | 9,9-diethylfluorene with methyl | pyridine | H | H | $CH_3$ | H | acac (dimethyl) |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (38) | Ir | 3 | 9,9-diethyl-2-methylfluorene | pyridine | H | H | $CH_3$ | H | — |
| (39) | Ir | 2 | 9,9-diethyl-2-methylfluorene | pyridine | H | H | $CH_3$ | H | methyl picolinate |
| (40) | Ir | 2 | 9,9-diethyl-2-methylfluorene | pyridine | H | H | H | $OCH_3$ | 2,6-dimethyl-dioxine |
| (41) | Ir | 3 | 9,9-diethyl-2-methylfluorene | pyridine | H | H | H | $OCH_3$ | — |
| (42) | Ir | 2 | 9,9-diethyl-2-methylfluorene | pyridine | H | H | H | $OCH_3$ | methyl picolinate |
| (43) | Ir | 2 | 9,9-diethyl-2-methylfluorene | pyridine | H | H | $N(CH_3)_2$ | H | 2,6-dimethyl-dioxine |
| (44) | Ir | 3 | 9,9-diethyl-2-methylfluorene | pyridine | H | H | $N(CH_3)_2$ | H | — |
| (45) | Ir | 2 | 9,9-diethyl-2-methylfluorene | pyridine | H | H | $N(CH_3)_2$ | H | methyl picolinate |

TABLE III-1-continued (Specific Synthetic Examples of Metal Coordination Compounds represented by Formulae III-(1) to III-(6))

| No | M | n | Fused Ring Unit | Ring A | X₁ | X₂ | X₃ | X₄ | Other Ligand |
|---|---|---|---|---|---|---|---|---|---|
| (46) | Ir | 2 | fluorene with C₂H₅, C₂H₅ | pyridine | H | CF₃ | H | H | acetylacetonate (CH₃, CH₃) |
| (47) | Ir | 3 | fluorene with C₂H₅, C₂H₅ | pyridine | H | CF₃ | H | H | — |
| (48) | Ir | 2 | fluorene with C₂H₅, C₂H₅ | pyridine | H | CF₃ | H | H | methyl picolinate |
| (49) | Ir | 2 | fluorene with C₂H₅, C₂H₅ | pyridine | H | H | CF₃ | H | acetylacetonate (CH₃, CH₃) |
| (50) | Ir | 3 | fluorene with C₂H₅, C₂H₅ | pyridine | H | H | CF₃ | H | — |
| (51) | Ir | 2 | fluorene with C₂H₅, C₂H₅ | pyridine | H | H | CF₃ | H | methyl picolinate |
| (52) | Ir | 2 | fluorene with C₂H₅, C₂H₅ | pyridine | H | H | NO₂ | H | acetylacetonate (CH₃, CH₃) |
| (53) | Ir | 3 | fluorene with C₂H₅, C₂H₅ | pyridine | H | H | NO₂ | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (54) | Ir | 2 | fluorene with C(C₂H₅)(C₂H₅) | pyridine | H | H | NO₂ | H | methyl picolinate |
| (55) | Ir | 2 | fluorene with C(C₂H₅)(C₂H₅) | pyridine | H | H | F | H | acetylacetonate (CH₃, CH₃) |
| (56) | Ir | 3 | fluorene with C(C₂H₅)(C₂H₅) | pyridine | H | H | F | H | — |
| (57) | Ir | 2 | fluorene with C(C₂H₅)(C₂H₅) | pyridine | H | H | F | H | methyl picolinate |
| (58) | Ir | 2 | fluorene with C(C₂H₅)(C₂H₅) | pyridine | H | H | CN | H | acetylacetonate (CH₃, CH₃) |
| (59) | Ir | 3 | fluorene with C(C₂H₅)(C₂H₅) | pyridine | H | H | CN | H | — |
| (60) | Ir | 2 | fluorene with C(C₂H₅)(C₂H₅) | pyridine | H | H | CN | H | methyl picolinate |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (61) | Ir | 2 | | | H | H | H | H | |
| (62) | Ir | 3 | | | H | H | H | H | — |
| (63) | Ir | 2 | | | H | H | H | H | |
| (64) | Ir | 2 | | | H | $CH_3$ | H | H | |
| (65) | Ir | 3 | | | H | $CH_3$ | H | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (66) | Ir | 2 | | | H | $CH_3$ | H | H | |
| (67) | Ir | 2 | | | H | H | $CH_3$ | H | |
| (68) | Ir | 3 | | | H | H | $CH_3$ | H | — |
| (69) | Ir | 2 | | | H | H | $CH_3$ | H | |
| (70) | Ir | 2 | | | H | H | H | $OCH_3$ | |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (71) | Ir | 3 | | | H | H | H | $OCH_3$ | — |
| (72) | Ir | 2 | | | H | H | H | $OCH_3$ | |
| (73) | Ir | 2 | | | H | H | $N(CH_3)_2$ | H | |
| (74) | Ir | 3 | | | H | H | $N(CH_3)_2$ | H | — |
| (75) | Ir | 2 | | | H | H | $N(CH_3)_2$ | H | |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (76) | Ir | 2 | | | H | $CF_3$ | H | H | |
| (77) | Ir | 3 | | | H | $CF_3$ | H | H | — |
| (78) | Ir | 2 | | | H | $CF_3$ | H | H | |
| (79) | Ir | 2 | | | H | H | $CF_3$ | H | |
| (80) | Ir | 3 | | | H | H | $CF_3$ | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (81) | Ir | 2 | | | H | H | $CF_3$ | H | |
| (82) | Ir | 2 | | | H | H | $NO_2$ | H | |
| (83) | Ir | 3 | | | H | H | $NO_2$ | H | — |
| (84) | Ir | 2 | | | H | H | $NO_2$ | H | |
| (85) | Ir | 2 | | | H | H | F | H | |

TABLE III-1-continued
(Specific Synthetic Examples of Metal Coordination Compounds represented by Formulae III-(1) to III-(6))
| No | M | n | Fused Ring Unit | Ring A | X₁ | X₂ | X₃ | X₄ | Other Ligand |
|---|---|---|---|---|---|---|---|---|---|
| (86) | Ir | 3 | 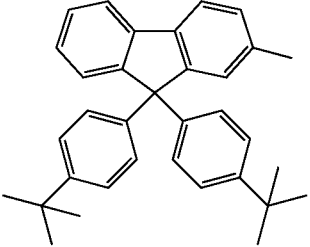 | 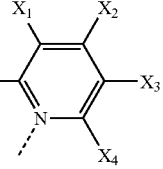 | H | H | F | H | — |
| (87) | Ir | 2 | 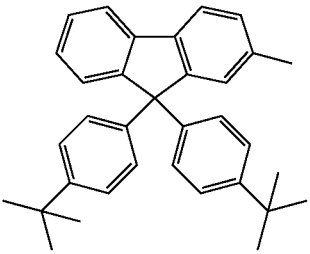 | 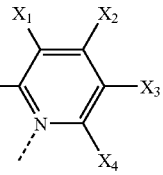 | H | H | F | H | 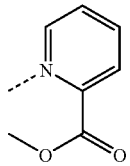 |
| (88) | Ir | 2 | 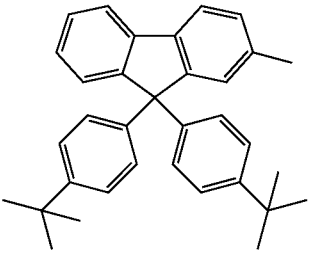 | 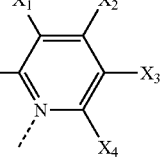 | H | H | CN | H | 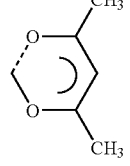 |
| (89) | Ir | 3 | 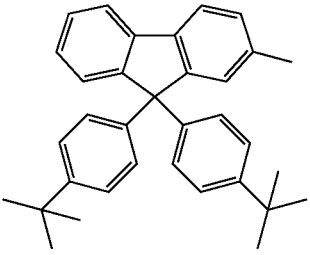 | 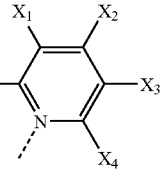 | H | H | CN | H | — |
| (90) | Ir | 2 | 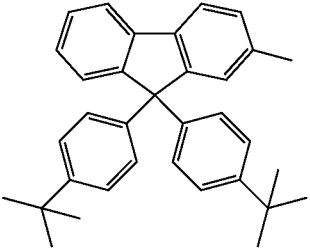 | 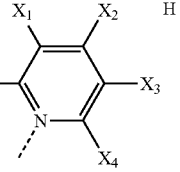 | H | H | CN | H | 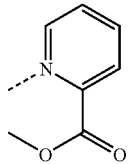 |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (91) | Ir | 2 | [structure] | [structure] | H | H | H | H | [acac] |
| (92) | Ir | 3 | [structure] | [structure] | H | H | H | H | — |
| (93) | Ir | 2 | [structure] | [structure] | H | H | H | H | [picolinate] |
| (94) | Ir | 2 | [structure] | [structure] | H | $CH_3$ | H | H | [acac] |
| (95) | Ir | 3 | [structure] | [structure] | H | $CH_3$ | H | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (96) | Ir | 2 | fluorene with two thiophene-CH3 substituents | pyridine with X1-X4 | H | CH3 | H | H | pyridine-2-carboxylate methyl ester |
| (97) | Ir | 2 | fluorene with two thiophene-CH3 substituents | pyridine with X1-X4 | H | H | CH3 | H | 2,4-pentanedionate |
| (98) | Ir | 3 | fluorene with two thiophene-CH3 substituents | pyridine with X1-X4 | H | H | CH3 | H | — |
| (99) | Ir | 2 | fluorene with two thiophene-CH3 substituents | pyridine with X1-X4 | H | H | CH3 | H | pyridine-2-carboxylate methyl ester |
| (100) | Ir | 2 | methyl dibenzofuran | pyridine with X1-X4 | H | H | H | H | 2,4-pentanedionate |
| (101) | Ir | 3 | methyl dibenzofuran | pyridine with X1-X4 | H | H | H | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (102) | Ir | 2 | dibenzofuran-methyl | pyridine with $X_1, X_2, X_3, X_4$ | H | H | H | H | methyl picolinate |
| (103) | Ir | 2 | dibenzofuran-methyl | pyridine with $X_1, X_2, X_3, X_4$ | H | CH$_3$ | H | H | acetylacetonate |
| (104) | Ir | 3 | dibenzofuran-methyl | pyridine with $X_1, X_2, X_3, X_4$ | H | CH$_3$ | H | H | — |
| (105) | Ir | 2 | dibenzofuran-methyl | pyridine with $X_1, X_2, X_3, X_4$ | H | CH$_3$ | H | H | methyl picolinate |
| (106) | Ir | 2 | dibenzofuran-methyl | pyridine with $X_1, X_2, X_3, X_4$ | H | H | CH$_3$ | H | acetylacetonate |
| (107) | Ir | 3 | dibenzofuran-methyl | pyridine with $X_1, X_2, X_3, X_4$ | H | H | CH$_3$ | H | — |
| (108) | Ir | 2 | dibenzofuran-methyl | pyridine with $X_1, X_2, X_3, X_4$ | H | H | CH$_3$ | H | methyl picolinate |
| (109) | Ir | 2 | dibenzofuran-methyl | pyridine with $X_1, X_2, X_3, X_4$ | H | H | H | OCH$_3$ | acetylacetonate |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (110) | Ir | 3 | dibenzofuran-methyl | pyridyl | H | H | H | $OCH_3$ | — |
| (111) | Ir | 2 | dibenzofuran-methyl | pyridyl | H | H | H | $OCH_3$ | methyl picolinate |
| (112) | Ir | 2 | dibenzofuran-methyl | pyridyl | H | H | $N(CH_3)_2$ | H | acac-dimethyl |
| (113) | Ir | 3 | dibenzofuran-methyl | pyridyl | H | H | $N(CH_3)_2$ | H | — |
| (114) | Ir | 2 | dibenzofuran-methyl | pyridyl | H | H | $N(CH_3)_2$ | H | methyl picolinate |
| (116) | Ir | 2 | dibenzofuran-methyl | pyridyl | H | $CF_3$ | H | H | acac-dimethyl |
| (117) | Ir | 3 | dibenzofuran-methyl | pyridyl | H | $CF_3$ | H | H | — |
| (118) | Ir | 2 | dibenzofuran-methyl | pyridyl | H | $CF_3$ | H | H | methyl picolinate |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (119) | Ir | 2 | dibenzofuran-methyl | pyridine | H | H | $CF_3$ | H | acetylacetonate |
| (120) | Ir | 3 | dibenzofuran-methyl | pyridine | H | H | $CF_3$ | H | — |
| (121) | Ir | 2 | dibenzofuran-methyl | pyridine | H | H | $CF_3$ | H | methyl picolinate |
| (122) | Ir | 2 | dibenzofuran-methyl | pyridine | H | H | $NO_2$ | H | acetylacetonate |
| (123) | Ir | 3 | dibenzofuran-methyl | pyridine | H | H | $NO_2$ | H | — |
| (124) | Ir | 2 | dibenzofuran-methyl | pyridine | H | H | $NO_2$ | H | methyl picolinate |
| (125) | Ir | 2 | dibenzofuran-methyl | pyridine | H | H | F | H | acetylacetonate |
| (126) | Ir | 3 | dibenzofuran-methyl | pyridine | H | H | F | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (127) | Ir | 2 | dibenzofuran | pyridine | H | H | F | H | methyl picolinate |
| (128) | Ir | 2 | dibenzofuran | pyridine | H | H | CN | H | acetylacetonate |
| (129) | Ir | 3 | dibenzofuran | pyridine | H | H | CN | H | — |
| (130) | Ir | 2 | dibenzofuran | pyridine | H | H | CN | H | methyl picolinate |
| (131) | Ir | 2 | dibenzothiophene | pyridine | H | H | H | H | acetylacetonate |
| (132) | Ir | 3 | dibenzothiophene | pyridine | H | H | H | H | — |
| (133) | Ir | 2 | dibenzothiophene | pyridine | H | H | H | H | methyl picolinate |
| (134) | Ir | 2 | dibenzothiophene | pyridine | H | $CH_3$ | H | H | acetylacetonate |

TABLE III-1-continued (Specific Synthetic Examples of Metal Coordination Compounds represented by Formulae III-(1) to III-(6))

| No | M | n | Fused Ring Unit | Ring A | X₁ | X₂ | X₃ | X₄ | Other Ligand |
|---|---|---|---|---|---|---|---|---|---|
| (135) | Ir | 3 | dibenzothiophene | pyridine | H | CH₃ | H | H | — |
| (136) | Ir | 2 | dibenzothiophene | pyridine | H | CH₃ | H | H | methyl picolinate |
| (137) | Ir | 2 | dibenzothiophene | pyridine | H | H | CH₃ | H | acac (dimethyl) |
| (138) | Ir | 3 | dibenzothiophene | pyridine | H | H | CH₃ | H | — |
| (139) | Ir | 2 | dibenzothiophene | pyridine | H | H | CH₃ | H | methyl picolinate |
| (140) | Ir | 2 | dibenzothiophene | pyridine | H | H | H | OCH₃ | acac (dimethyl) |
| (141) | Ir | 3 | dibenzothiophene | pyridine | H | H | H | OCH₃ | — |
| (142) | Ir | 2 | dibenzothiophene | pyridine | H | H | H | OCH₃ | methyl picolinate |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (143) | Ir | 2 | dibenzothiophene | pyridine | H | H | $N(CH_3)_2$ | H | acac |
| (144) | Ir | 3 | dibenzothiophene | pyridine | H | H | $N(CH_3)_2$ | H | — |
| (145) | Ir | 2 | dibenzothiophene | pyridine | H | H | $N(CH_3)_2$ | H | methyl picolinate |
| (146) | Ir | 2 | dibenzothiophene | pyridine | H | $CF_3$ | H | H | acac |
| (147) | Ir | 3 | dibenzothiophene | pyridine | H | $CF_3$ | H | H | — |
| (148) | Ir | 2 | dibenzothiophene | pyridine | H | $CF_3$ | H | H | methyl picolinate |
| (149) | Ir | 2 | dibenzothiophene | pyridine | H | H | $CF_3$ | H | acac |
| (150) | Ir | 3 | dibenzothiophene | pyridine | H | H | $CF_3$ | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (151) | Ir | 2 | dibenzothiophene | pyridine | H | H | $CF_3$ | H | methyl picolinate |
| (152) | Ir | 2 | dibenzothiophene | pyridine | H | H | $NO_2$ | H | acetylacetonate |
| (153) | Ir | 3 | dibenzothiophene | pyridine | H | H | $NO_2$ | H | — |
| (154) | Ir | 2 | dibenzothiophene | pyridine | H | H | $NO_2$ | H | methyl picolinate |
| (155) | Ir | 2 | dibenzothiophene | pyridine | H | H | F | H | acetylacetonate |
| (156) | Ir | 3 | dibenzothiophene | pyridine | H | H | F | H | — |
| (157) | Ir | 2 | dibenzothiophene | pyridine | H | H | F | H | methyl picolinate |
| (158) | Ir | 2 | dibenzothiophene | pyridine | H | H | CN | H | acetylacetonate |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (159) | Ir | 3 | dibenzothiophene-methyl | pyridine | H | H | CN | H | — |
| (160) | Ir | 2 | dibenzothiophene-methyl | pyridine | H | H | CN | H | methyl picolinate |
| (161) | Ir | 2 | dibenzothiophene-S,S-dioxide-methyl | pyridine | H | H | H | H | 2,2,6,6-dimethyl dioxin |
| (162) | Ir | 3 | dibenzothiophene-S,S-dioxide-methyl | pyridine | H | H | H | H | — |
| (163) | Ir | 2 | dibenzothiophene-S,S-dioxide-methyl | pyridine | H | H | H | H | methyl picolinate |
| (164) | Rh | 2 | fluorenone-methyl | pyridine | H | H | $CH_3$ | H | 2,2,6,6-dimethyl dioxin |
| (165) | Rh | 3 | fluorenone-methyl | pyridine | H | H | $CH_3$ | H | — |
| (166) | Rh | 2 | fluorenone-methyl | pyridine | H | H | $CH_3$ | H | methyl picolinate |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (167) | Ru | 2 | | | H | H | $CH_3$ | H | |
| (168) | Ru | 3 | | | H | H | $CH_3$ | H | — |
| (169) | Ru | 2 | | | H | H | $CH_3$ | H | |
| (170) | Os | 2 | | | H | H | $CH_3$ | H | |
| (171) | Os | 3 | | | H | H | $CH_3$ | H | — |
| (172) | Os | 2 | | | H | H | $CH_3$ | H | |
| (173) | Pd | 2 | | | H | H | $CH_3$ | H | — |
| (174) | Pd | 2 | | | H | H | $CH_3$ | H | — |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (175) | Pt | 2 | | | H | H | $CH_3$ | H | — |
| (176) | Pt | 2 | | | H | H | $CH_3$ | H | — |
| (177) | Ir | 2 | | | H | $CH_3$ | H | H | |
| (178) | Ir | 2 | | | H | $CH_3$ | H | H | |
| (179) | Ir | 2 | | | H | $CH_3$ | H | H | |
| (180) | Ir | 2 | | | H | H | $CH_3$ | H | |
| (181) | Ir | 2 | | | H | H | $CH_3$ | H | |

TABLE III-1-continued (Specific Synthetic Examples of Metal Coordination Compounds represented by Formulae III-(1) to III-(6))

| No | M | n | Fused Ring Unit | Ring A | $X_1$ | $X_2$ | $X_3$ | $X_4$ | Other Ligand |
|---|---|---|---|---|---|---|---|---|---|
| (182) | Ir | 2 | | | H | H | $CH_3$ | H | |
| (183) | Ir | 3 | | | H | H | H | H | — |
| (184) | Ir | 3 | | | H | H | H | H | — |
| (185) | Ir | 3 | | | H | H | H | H | — |
| (186) | Ir | 3 | | | H | | | | |
| (187) | Ir | 3 | | | H | H | H | H | — |
| (188) | Ir | 3 | | | H | H | H | H | — |

TABLE III-1-continued (Specific Synthetic Examples of Metal Coordination Compounds represented by Formulae III-(1) to III-(6))

| No | M | n | Fused Ring Unit | Ring A | X₁ | X₂ | X₃ | X₄ | Other Ligand |
|---|---|---|---|---|---|---|---|---|---|
| (189) | Ir | 2 | | | H | H | H | H | |
| (190) | Ir | 3 | | | H | H | H | H | |
| (191) | Ir | 2 | | | H | H | H | H | |
| (192) | Ir | 2 | | | | | H | | |

The metal coordination compound of the present invention can be used as an active layer material of an electroluminescent device. The active layer referred to here means a layer that is able to emit light when an electric field is applied (light-emitting layer), or a layer that improves the charge injection or the charge transporting (charge injection layer or charge transporting layer). The charge referred to here means a negative or a positive charge. The thickness of the active layer is preferably 10 to 100 nm, more preferably 20 to 60 nm, and yet more preferably 20 to 40 nm.

The metal coordination compound of the present invention may be used as a mixture with another material. Furthermore, the electroluminescent device employing the metal coordination compound of the present invention may further have a layer containing a material other than the above-mentioned metal coordination compound layered with the active layer containing the metal coordination compound of the present invention. As a material that may be used as a mixture with the metal coordination compound of the present invention, a known material such as a positive hole injection and/or positive hole transporting material, an electron injection and/or electron transporting material, a light-emitting material, or a binder polymer can be used. The material mixed may be a high molecular weight material or a low molecular weight material.

Examples of the positive hole injection and/or positive hole transporting material that can be used include materials such as an arylamine derivative, a triphenylmethane derivative, a stilbene-based compound, a hydrazone-based compound, a carbazole-based compound, a high molecular weight arylamine, a polyaniline, and a polythiophene, and materials formed by polymerizing the above materials. Examples of the electron injection and/or electron transporting material that can be used include materials such as an oxadiazole derivative, a benzoxazole derivative, a benzoquinone derivative, a quinoline derivative, a quinoxaline derivative, a thiadiazole derivative, a benzodiazole derivative, a triazole derivative, and a metal chelate complex compound, and materials formed by polymerizing the above materials. Examples of the light-emitting material that can be used include an arylamine derivative, an oxadiazole derivative, a perylene derivative, a quinacridone derivative, a pyrazoline derivative, an anthracene derivative, a rubrene derivative, a stilbene derivative, a coumarin derivative, a naphthalene derivative, a metal chelate complex, and a metal complex containing Ir, Pt, etc. as the central metal, materials formed by polymerizing the above materials, and polymer materials such as a polyfluorene derivative, a polyphenylenevinylene derivative, a polyphenylene derivative, and a polythiophene derivative. As the binder polymer that can be used, one that does not greatly degrade the properties can be used. Examples of the binder polymer include polystyrene, polycarbonate, polyarylether, polyacrylate, polymethacrylate, and polysiloxane.

In particular, in the present invention, an organic electroluminescent device can be produced using the above-mentioned metal coordination compound and, as necessary, another low molecular weight material.

Specific examples of the low molecular weight material include CBP (4,4'-N,N'-dicarbazole-biphenyl), CDBP (2,2'-dimethyl-4,4'-N,N'-dicarbazole-biphenyl), and mCP (m-dicarbazole-benzene). The mixing ratio of the low molecular weight material and the metal coordination compound is such that 1 to 15 wt % of the metal coordination compound is used relative to the weight of the low molecular weight material, more preferably 2 to 10 wt %, and yet more preferably 3 to 8 wt %. When the concentration of the metal coordination compound is too low, the luminescence efficiency tends to decrease, and when it is too high, concentration quenching is caused due to interaction in the metal coordination compound, and the luminescence efficiency tends to deteriorate.

Furthermore, in the present invention, an organic electroluminescent device can be produced using a polymer composition containing the above-mentioned metal coordination compound and a conjugated and/or non-conjugated polymer. The polymer composition referred to in the present invention means a composition obtained by mixing the metal coordination compound with a conjugated and/or non-conjugated polymer or a composition obtained by copolymerizing the metal coordination compound with a conjugated and/or non-conjugated polymer.

Specific examples of the above-mentioned conjugated and/or non-conjugated polymer include polymers containing, as a main backbone, such as polyfluorene, polyphenylene, poly(phenylenevinylene), polythiophene, polyquinoline, polyaniline, polyvinylcarbazole, or a derivative thereof; and polymers having, as a unit (that is, not limited to a structure in the main backbone and may be a side chain structure), a structure of benzene, naphthalene, anthracene, phenanthrene, chrysene, rubrene, pyrene, perylene, indene, azulene, adamantane, fluorene, fluorenone, dibenzofuran, carbazole, dibenzothiophene, furan, pyrrole, pyrroline, pyrrolidine, thiophene, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, pyrazine, piperazine, triazine, trithiane, norbornene, benzofuran, indole, benzothiophene, benzimidazole, benzoxazole, benzothiazole, benzoxadizxole, benzotriazole, purine, quinoline, isoquinoline, coumarin, cinnoline, quinoxaline, acridine, phenanthroline, phenothiazine, flavone, triphenylamine, acetylacetone, dibenzoylmethane, picolinic acid, silole, porphyrin, or a derivative thereof.

The mixing ratio or copolymerization ratio of the polymer and the metal coordination compound is preferably 0.1 to 20 parts by weight of the metal coordination compound relative to 100 parts by weight of the polymer.

Examples of a solvent that can be used for the polymer composition include chloroform, methylene chloride, dichloroethane, tetrahydrofuran, toluene, xylene, mesitylene, anisole, acetone, methyl ethyl ketone, ethyl acetate, butyl acetate, and ethyl cellosolve acetate.

In order to use the metal coordination compound or the polymer composition of the present invention as a material of the active layer of the electroluminescent device, a thin film can be formed on a substrate using a method known to a person skilled in the art, such as, for example, vacuum deposition, ink jet, casting, immersion, printing, or spin coating. Examples of the printing method include relief printing, intaglio printing, offset printing, lithographic printing, reverse relief offset printing, screen printing, and gravure printing.

Such a layering method can be usually carried out at a temperature in the range of −20° C. to +300° C., preferably 10° C. to 100° C., and particularly preferably 15° C. to 50° C. The layered polymer solution can usually be dried at room temperature or by heating on a hot plate.

The electroluminescent devices usually include an electroluminescent layer (light-emitting layer) between cathode and anode electrodes, at least one of which is transparent. Furthermore, at least one electron injection layer and/or electron transporting layer is inserted between the electroluminescent layer (light-emitting layer) and the cathode and, moreover, at least one positive hole injection layer and/or positive hole transporting layer is inserted between the electroluminescent layer (light-emitting layer) and the anode. As a material for the cathode, for example, a metal or metal alloy such as Li, Ca, Mg, Al, In, Cs, Mg/Ag, or LiF is preferable. As the anode, a metal (e.g. Au) or another material having metallic conductivity such as, for example, an oxide (e.g. ITO: indium oxide/tin oxide) on a transparent substrate (e.g. a glass or a transparent polymer) can be used.

Examples of an electron injection and/or electron transporting layer include layers containing materials such as an oxadiazole derivative, a benzoxazole derivative, a benzoquinone derivative, a quinoline derivative, a quinoxaline derivative, a thiadiazole derivative, a benzodiazole derivative, a triazole derivative, or a metal chelate complex compound.

Examples of a positive hole injection and/or positive hole transporting layer include layers containing materials such as copper phthalocyanine, a triphenylamine derivative, a triphenylmethane derivative, a stilbene-based compound, a hydrazone-based compound, a carbazole-based compound, a high molecular weight arylamine, a polyaniline, or a polythiophene.

The metal coordination compound of the present invention is suitable as, for example, a material for an organic EL device that has various emission wavelengths, excellent reliability, excellent emission characteristics, etc. In particular, the metal coordination compounds represented by Formulae I-(1) to I-(6) are effective for shortening the wavelength of the emission color, the metal coordination compounds represented by Formulae II-(1) to II-(6) are effective for increasing the life of the device, and the metal coordination compounds represented by Formulae III-(1) to III-(6) are effective for shortening the wavelength of the emission color and increasing the life of a device.

EXAMPLES

The present invention is explained below with reference to examples, but the present invention is not limited by these examples. It is also possible to obtain electroluminescent devices, other than the examples shown below, having excellent color purity, reliability, luminescence characteristics, etc. in cases where the above-mentioned various metal coordination compounds of the present invention are used.

Example I-1

Synthesis of Metal Coordination Compound I-(1)

A Grignard reagent was prepared by gradually adding a THF solution of 3-bromo-9-methylcarbazole (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (½) to give a boronic acid carbazole derivative as colorless crystals (40%). The boronic acid carbazole derivative (12 mmol) thus obtained and 1,2-ethanediol (30 mmol) were refluxed in toluene for 10 hours, and then recrystallized from toluene/acetone (¼) to give a boronic acid ester carbazole derivative as colorless crystals.

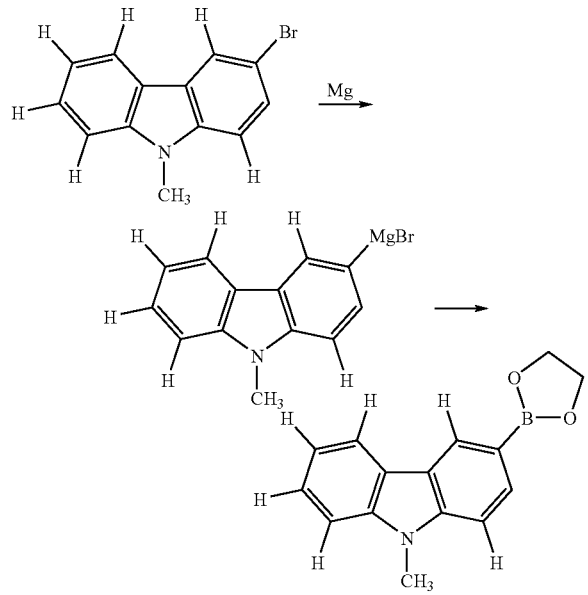

A 2M aqueous solution of $K_2CO_3$ was added to a toluene solution of 2-bromopyridine (10 mmol), the boronic acid ester carbazole derivative (10 mmol), and $Pd(O)(PPh_3)_4$ (0.2 mmol) under a flow of argon, and the mixture was refluxed for 48 hours while stirring vigorously. The reaction mixture was cooled to room temperature and then poured into a large amount of methanol so as to precipitate a solid. The solid thus precipitated was filtered by suction and washed with methanol to give 3-(2'-pyridyl)-9-methylcarbazole as a solid.

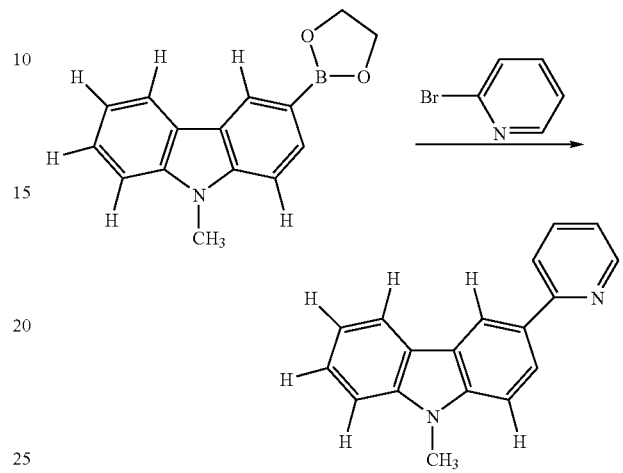

A 200 ml three-necked flask was charged with iridium (III) chloride (1.7 mmol), 3-(2'-pyridyl)-9-methylcarbazole (7.58 mmol), 50 ml of ethoxyethanol, and 20 ml of water, and the mixture was stirred under a flow of nitrogen at room temperature for 30 minutes and then refluxed for 24 hours while stirring. The reaction mixture was cooled to room temperature, and a precipitate was collected by filtration, washed with water, and then washed with ethanol and acetone in sequence. The precipitate was dried under vacuum at room temperature to give di-µ-chloro-tetrakis[3-(2'-pyridyl)-9-methylcarbazole-$N^{1'},C^2$] diiridium (III) as a pale yellow powder.

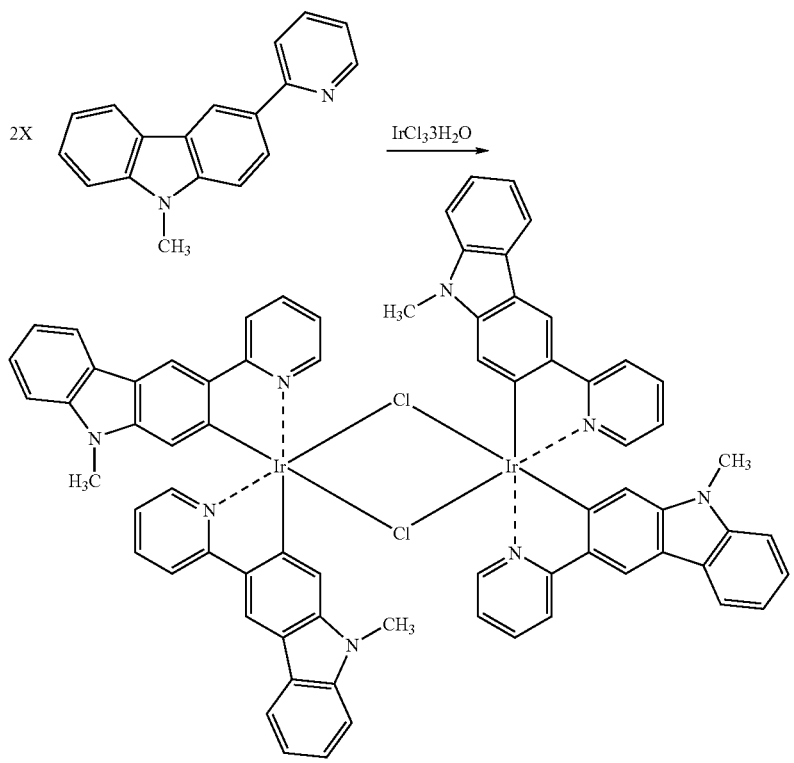

A 200 mL three-necked flask was charged with 70 mL of ethoxyethanol, di-μ-chloro-tetrakis[3-(2'-pyridyl)-9-methyl-carbazole-$N^{1'}$, $C^2$] diiridium (III) (0.7 mmol), acetylacetone (2.10 mmol), and sodium carbonate (9.43 mmol), and the mixture was stirred under a flow of nitrogen at room temperature and then refluxed for 15 hours while stirring. The reaction mixture was cooled with ice, and a precipitate was collected by filtration and washed with water. This precipitate was purified by silica gel column chromatography (eluent: chloroform/methanol: 30/1) to give bis[3-(2'-pyridyl)-9-methyl-carbazole-$N^{1'},C^2$](acetylacetonato)iridium (III) as a pale yellow powder.

The compound thus obtained was identified by NMR spectroscopy, IR spectroscopy, etc. The same applies to the compounds shown below.

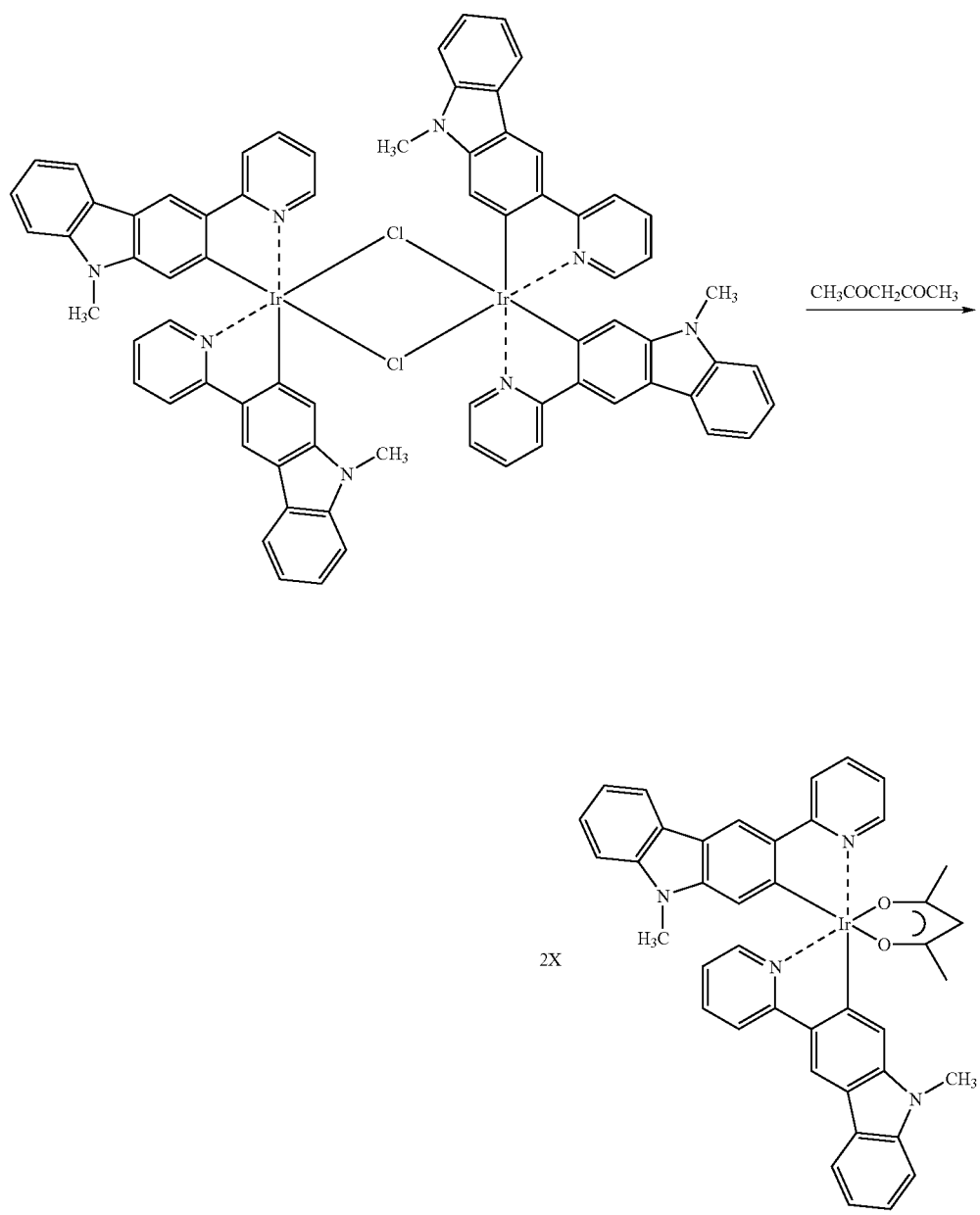

Example I-2

Synthesis of Metal Coordination Compound I-(2)

A 200 mL three-necked flask was charged with 3-(2'-pyridyl)-9-methylcarbazole (1.7 mmol), bis[3-(2'-pyridyl)-9-methylcarbazole-$N^{1'},C^2$] (acetylacetonato) iridium (III) (0.28 mmol) synthesized in Example I-1, and glycerol (55 mL), and the mixture was heated under a flow of nitrogen at about 180° C. for 8 hours while stirring. The reaction mixture was cooled to room temperature and poured into 350 mL of 1 N hydrochloric acid, and a precipitate was collected by filtration, washed with water, and dried under vacuum at 100° C. for 5 hours. This precipitate was purified by silica gel column chromatography using chloroform as an eluent to give tris[3-(2'-pyridyl)-9-methylcarbazole-$N^{1'},C^2$] iridium (III) as a pale yellow powder.

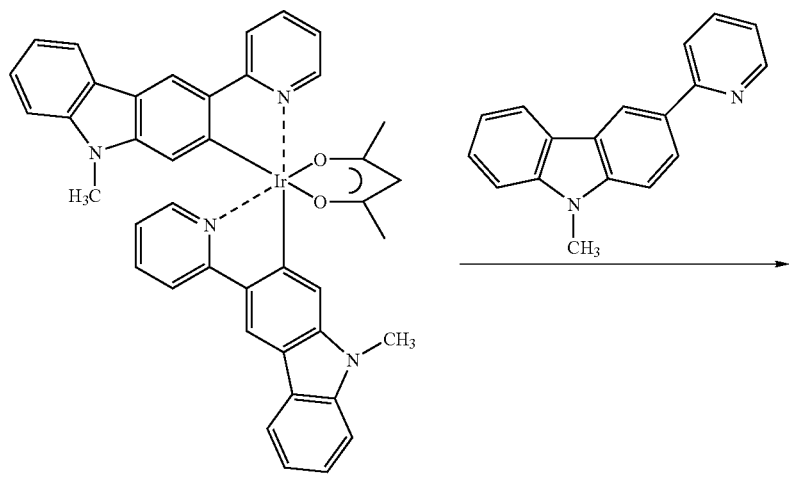

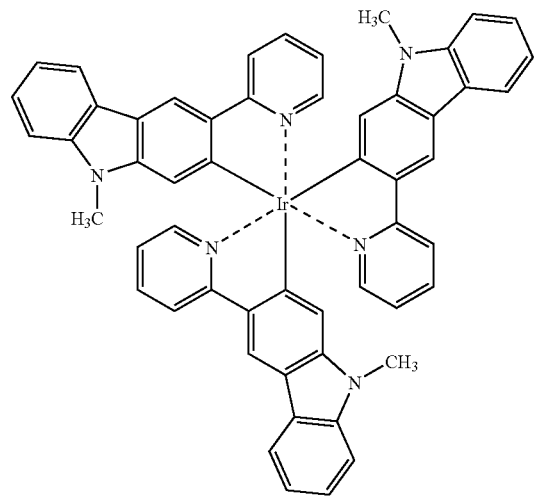

Example I-3 to Example I-9

Synthesis of Various Types of Metal Coordination Compounds

Various types of metal complex compounds shown in Table I-2 below were synthesized by the same method as the synthetic methods of Example I-1 and Example I-2 except that starting materials such as the carbazole unit, ring A, and other ligands were changed.

TABLE I-2

| No | M | n | Carbazole Unit | X₇ | Ring A | X₁ | X₂ | X₃ | X₄ | Other Ligand |
|---|---|---|---|---|---|---|---|---|---|---|
| (5) | Ir | 3 | carbazole | C₂H₅ | pyridine | H | CF₃ | H | H | — |
| (14) | Ir | 3 | carbazole | C₂H₅ | pyridine | H | H | F | H | — |
| (73) | Ir | 2 | carbazole | t-C₄H₉ | pyridine | H | H | H | H | acetylacetonate |
| (75) | Ir | 2 | carbazole | t-C₄H₉ | pyridine | H | H | H | H | picolinate |
| (80) | Ir | 3 | carbazole | t-C₄H₉ | pyridine | H | H | CF₃ | H | — |
| (106) | Ir | 2 | carbazole | C₂H₅ | pyridine | H | H | H | H | 3-methylpicolinate |
| (107) | Ir | 2 | carbazole | C₂H₅ | pyridine | H | H | CF₃ | H | 2,2,6,6-tetramethyl-3,5-heptanedionate |

Example I-10

Fabrication of Organic EL Device

An organic EL device having three organic layers was fabricated using the compound obtained in Example I-2 and its device characteristics were evaluated.

An α-NPD hole transporting layer with a thickness of 40 nm was formed by a vacuum deposition method involving resistive heating within a $10^{-5}$ Pa vacuum chamber on a glass substrate with a 2 mm wide ITO (indium tin oxide) patterning. On top of this layer, the metal coordination compound of Example I-2 (5% ratio by weight) and CBP were vapor codeposited (film thickness 30 nm). Furthermore, as an electron transporting layer, $Alq_3$ was vapor-deposited at 30 nm. On top of this layer, LiF at 0.5 to 2 nm and Al at 100 to 150 nm were vapor deposited as a negative electrode layer.

With regard to the characteristics of the organic EL device, current/voltage characteristics were measured at room temperature using a 4140B picoammeter manufactured by Hewlett-Packard and the luminance was measured using an SR-3 manufactured by Topcon Corporation. When a voltage was applied so that the ITO was the positive electrode and the LiF/Al was the negative electrode, at about 6 V emission of blue light ($\lambda$=450 nm) was observed.

The luminance half-life when operated at a constant current (50 mA/cm$^2$) was 100 hours.

Comparative Example 1

An organic EL device was fabricated in the same manner as in Example I-10 except that Ir(ppy)$_3$ was used instead of the metal coordination compound used in Example I-10. The device thus obtained was connected to a power supply, a voltage was applied so that the ITO was the positive electrode and the LiF/Al was the negative electrode, and at about 6 V emission of green light ($\lambda$=516 nm) was observed.

The luminance half-life when operated at a constant current (50 mA/cm$^2$) was 80 hours.

Example II-1

Synthesis of metal coordination compound II-(1)

A Grignard reagent was prepared by gradually adding a THF solution of 2-hydroxy-6-bromo-9-methylcarbazole (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (½) to give a boronic acid carbazole derivative as colorless crystals (40%).

The boronic acid carbazole derivative (12 mmol) thus obtained and 1,2-ethanediol (30 mmol) were refluxed in toluene for 10 hours, and then recrystallized from toluene/acetone (¼) to give a boronic acid ester carbazole derivative as colorless crystals.

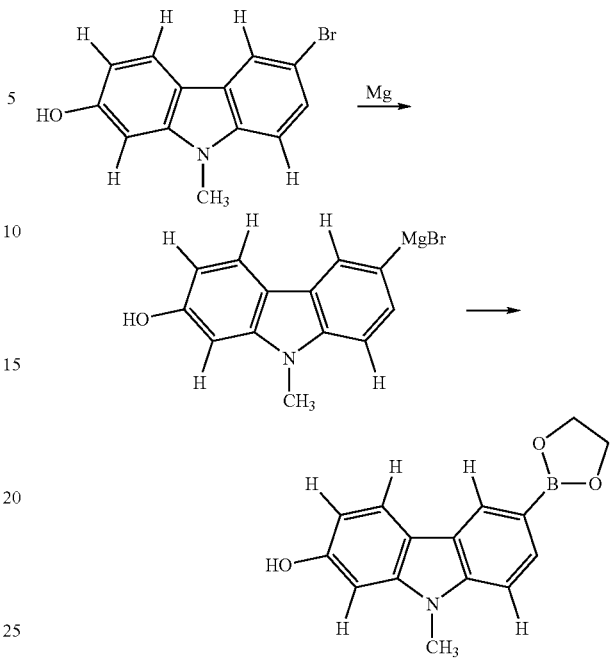

A 2M aqueous solution of $K_2CO_3$ was added to a toluene solution of 2-bromopyridine (10 mmol), the boronic acid ester carbazole derivative (10 mmol), and Pd(0)(PPh$_3$)$_4$ (0.2 mmol) under a flow of argon, and the mixture was refluxed for 48 hours while stirring vigorously. The reaction mixture was cooled to room temperature and then poured into a large amount of methanol so as to precipitate a solid. The solid thus precipitated was filtered by suction and washed with methanol to give 2-hydroxy-6-(2'-pyridyl)-9-methylcarbazole as a solid.

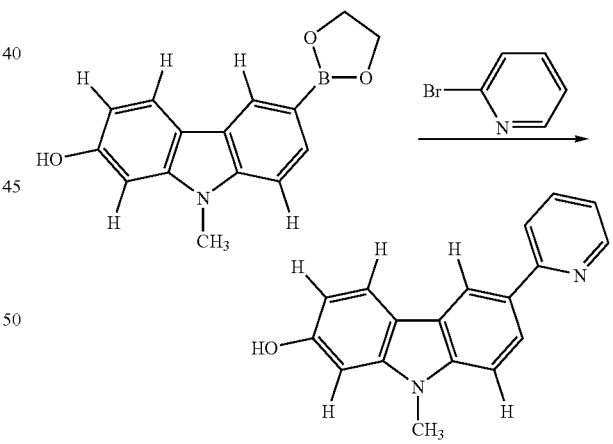

A 200 ml three-necked flask was charged with iridium (III) chloride (1.7 mmol), 2-hydroxy-6-(2'-pyridyl)-9-methylcarbazole (7.58 mmol), 50 ml of ethoxyethanol, and 20 ml of water, and the mixture was stirred under a flow of nitrogen at room temperature for 30 minutes and then refluxed for 24 hours while stirring. The reaction mixture was cooled to room temperature, and a precipitate was collected by filtration, washed with water, and then washed with ethanol and acetone in sequence. The precipitate was dried under vacuum at room temperature to give di-μ-chloro-tetrakis[2-hydroxy-6-(2'-pyridyl)-9-methylcarbazole-N$^{1'}$,C$^7$] diiridium (III) as a pale yellow powder.

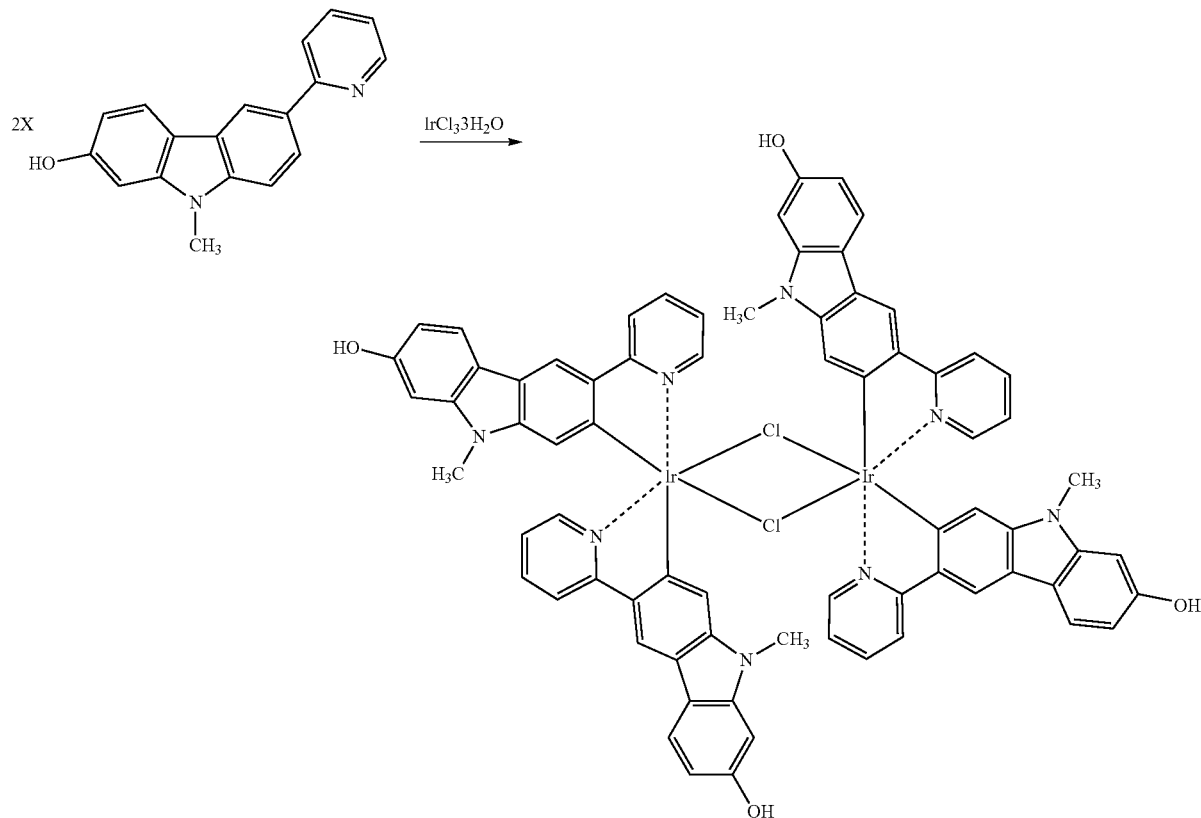

A 200 mL three-necked flask was charged with 70 mL of ethoxyethanol, di-μ-chloro-tetrakis[2-hydroxy-6-(2'-pyridyl)-9-methylcarbazole-$N^{1'},C^{7}$] diiridium (III) (0.7 mmol), acetylacetone (2.10 mmol), and sodium carbonate (9.43 mmol), and the mixture was stirred under a flow of nitrogen at room temperature and then refluxed for 15 hours while stirring. The reaction mixture was cooled with ice, and a precipitate was collected by filtration and washed with water. This precipitate was purified by silica gel column chromatography (eluent: chloroform/methanol: 30/1) to give bis[2-hydroxy-6-(2'-pyridyl)-9-methylcarbazole-$N^{1'},C^{7}$](acetylacetonato) iridium (III) as a pale yellow powder.

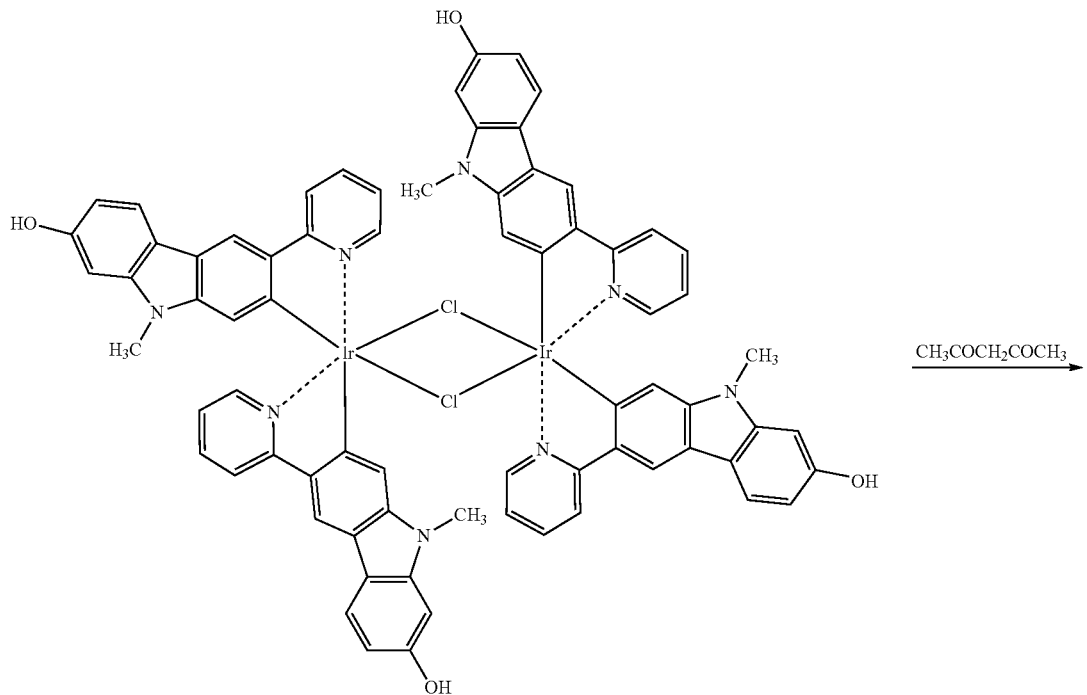

-continued

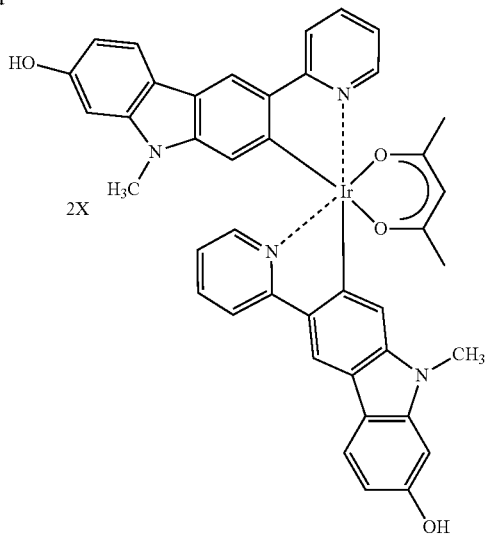

2X

Example II-2

Synthesis of Metal Coordination Compound II-(2)

A 200 mL three-necked flask was charged with 2-hydroxy-6-(2'-pyridyl)-9-methylcarbazole (1.7 mmol), bis[2-hydroxy-6-(2'-pyridyl)-9-methylcarbazole-$N^{1'}$, $C^7$](acetylacetonato) iridium (III) (0.28 mmol) synthesized in Example II-1, and glycerol (55 mL), and the mixture was heated under a flow of nitrogen at about 180° C. for 8 hours while stirring. The reaction mixture was cooled to room temperature and poured into 350 mL of 1N hydrochloric acid, and a precipitate was collected by filtration, washed with water, and dried under vacuum at 100° C. for 5 hours. This precipitate was purified by silica gel column chromatography using chloroform as an eluent to give tris[2-hydroxy-6-(2'-pyridyl)-9-methylcarbazole-$N^{1'}$, $C^7$] iridium (III) as a pale yellow powder.

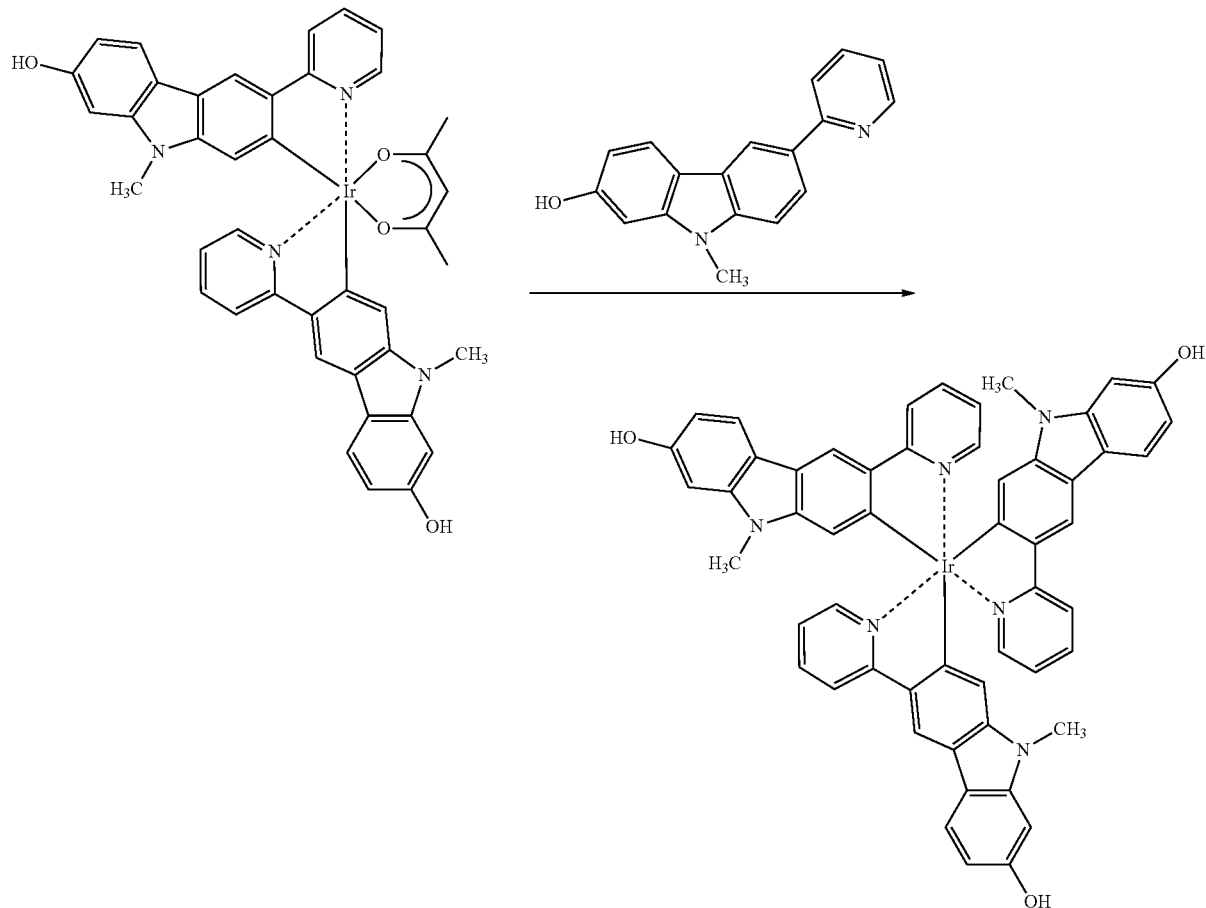

Example II-3 to Example II-13

Synthesis of Various Types of Metal Coordination Compounds

Various types of metal complex compounds shown in Table II-2 below were synthesized by the same method as the synthetic methods of Example II-1 and Example II-2 except that starting materials such as the carbazole unit, ring A, and other ligands were changed.

TABLE II-2

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (20) | Ir | 3 | 3-methylcarbazole | $C_2H_5$ | pyridine | H | H | $CH_3$ | H | — |
| (41) | Ir | 3 | 2-methoxy-6-methylcarbazole | $C_2H_5$ | pyridine | H | H | H | H | — |
| (70) | Ir | 2 | 3-methylcarbazole | 3,4,5-trimethylphenyl | pyridine | H | H | H | H | acac |
| (71) | Ir | 3 | 3-methylcarbazole | 3,4,5-trimethylphenyl | pyridine | H | H | H | H | — |
| (77) | Ir | 3 | 3-methylcarbazole | 3,4,5-trimethylphenyl | pyridine | H | H | $CH_3$ | H | — |
| (91) | Ir | 2 | 3-methylcarbazole | 5-methylthiophen-2-yl | pyridine | H | H | $CH_3$ | H | acac |

TABLE II-2-continued

| No | M | n | Carbazole Unit | $X_7$ | Ring A | $X_1$ | $X_2$ | $X_3$ | $X_4$ | Other Ligand |
|---|---|---|---|---|---|---|---|---|---|---|
| (114) | Ir | 2 | 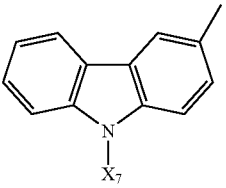 | $C_2H_5$ | 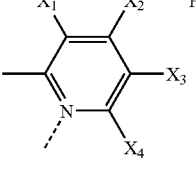 | H | $CH_3$ | H | H | 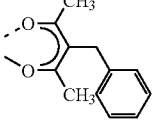 |
| (122) | Ir | 3 | 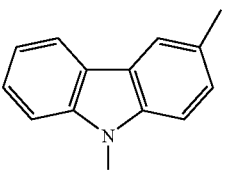 | 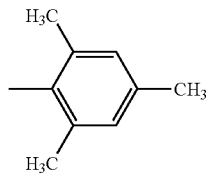 | 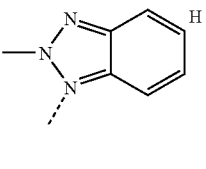 | H | H | H | H | — |
| (125) | Ir | 3 | 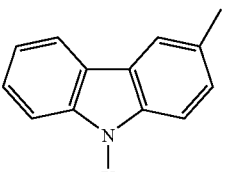 | 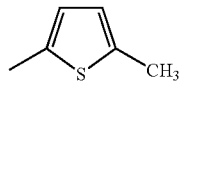 | 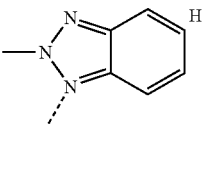 | H | H | H | H | — |
| (127) | Ir | 3 | 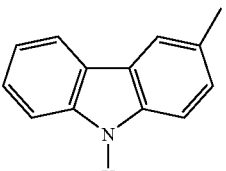 | 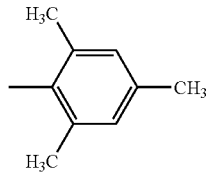 | 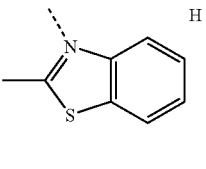 | H | H | H | H | 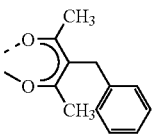 |
| (128) | Ir | 2 | 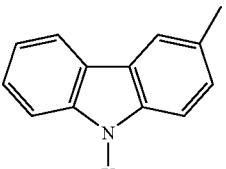 | 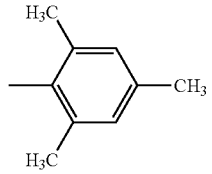 | 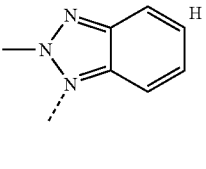 | H | H | H | H | 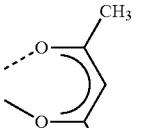 |

Example II-14

Fabrication of Organic EL Device

An organic EL device having three organic layers was fabricated using the compound obtained in Example II-2 and its device characteristics were evaluated.

An α-NPD hole transporting layer with a thickness of 40 nm was formed by a vacuum deposition method involving resistive heating within a $10^{-5}$ Pa vacuum chamber on a glass substrate with a 2 mm wide ITO (indium tin oxide) patterning. On top of this layer, the metal coordination compound of Example II-2 (5% ratio by weight) and CBP were vapor codeposited (film thickness 30 nm). Furthermore, as an electron transporting layer, $Alq_3$ was vapor-deposited at 30 nm. On top of this layer, LiF at 0.5 to 2 nm and Al at 100 to 150 nm were vapor deposited as a negative electrode layer.

With regard to the characteristics of the organic EL device, current/voltage characteristics were measured at room temperature using a 4140B picoammeter manufactured by Hewlett-Packard and the luminance was measured using an SR-3 manufactured by Topcon Corporation. When a voltage was applied so that the ITO was the positive electrode and the LiF/Al was the negative electrode, at about 6 V emission of orange light (λ=590 nm) was observed.

The luminance half-life when operated at a constant current (50 mA/cm²) was 200 hours.

Example III-1

Synthesis of metal coordination compound III-(1)

A Grignard reagent was prepared by gradually adding a THF solution of 2-bromo-9-fluorenone (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (½) to give a boronic acid fluorenone derivative as colorless crystals (40%). The boronic acid fluorenone derivative (12 mmol) thus obtained and 1,2-ethanediol (30 mmol) were refluxed in toluene for 10 hours, and then recrystallized from toluene/acetone (¼) to give a boronic acid ester fluorenone derivative as colorless crystals.

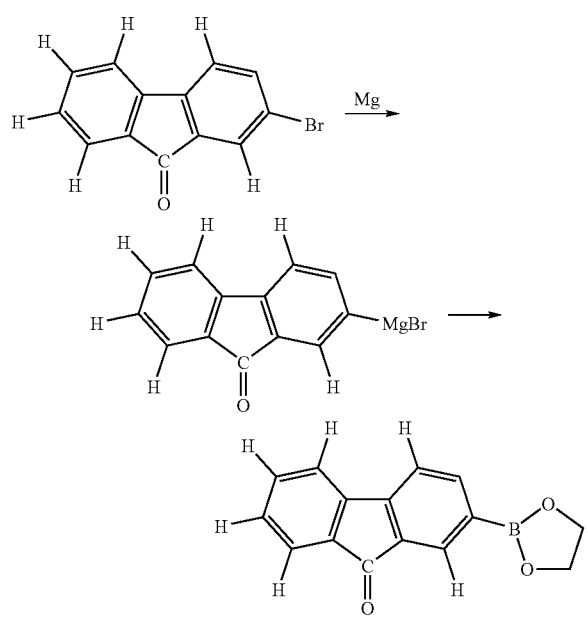

A 2M aqueous solution of $K_2CO_3$ was added to a toluene solution of 2-bromopyridine (10 mmol), the boronic acid ester fluorenone derivative (10 mmol), and $Pd(0)(PPh_3)_4$ (0.2 mmol) under a flow of argon, and the mixture was refluxed for 48 hours while stirring vigorously. The reaction mixture was cooled to room temperature and then poured into a large amount of methanol so as to precipitate a solid. The solid thus precipitated was filtered by suction and washed with methanol to give 2-(2'-pyridyl)-9-fluorenone as a solid.

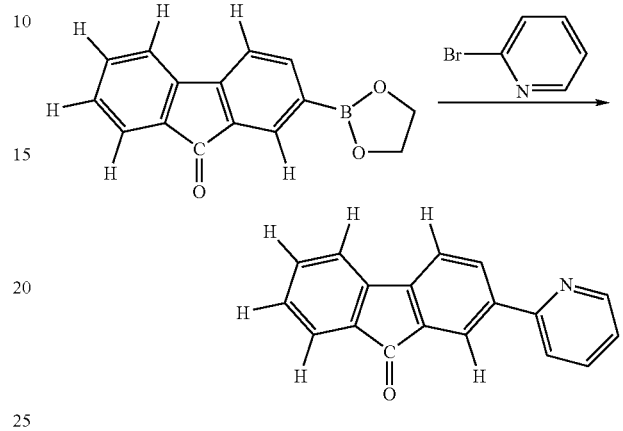

A 200 ml three-necked flask was charged with iridium (III) chloride (1.7 mmol), 2-(2'-pyridyl)-9-fluorenone (7.58 mmol), 50 ml of ethoxyethanol, and 20 ml of water, and the mixture was stirred under a flow of nitrogen at room temperature for 30 minutes and then refluxed for 24 hours while stirring. The reaction mixture was cooled to room temperature, and a precipitate was collected by filtration, washed with water, and then washed with ethanol and acetone in sequence. The precipitate was dried under vacuum at room temperature to give di-μ-chloro-tetrakis[2-(2'-pyridyl)-9-fluorenone-$N^{1'}$, $C^3$] diiridium (III) as a pale yellow powder.

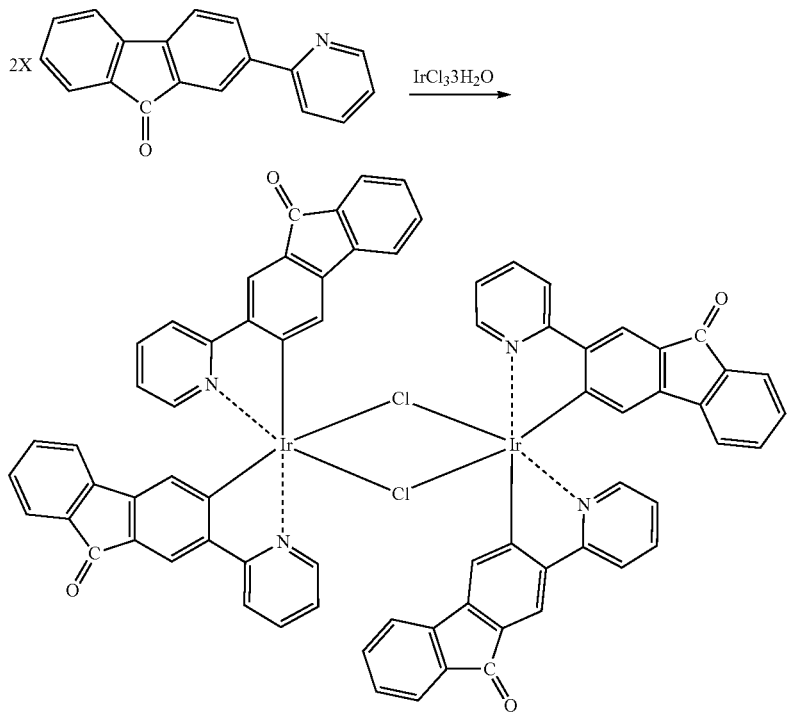

A 200 mL three-necked flask was charged with 70 mL of ethoxyethanol, di-μ-chloro-tetrakis[2-(2'-pyridyl)-9-fluorenone-N[1'], C[3]] diiridium (III) (0.7 mmol), acetylacetone (2.10 mmol), and sodium carbonate (9.43 mmol), and the mixture was stirred under a flow of nitrogen at room temperature and then refluxed for 15 hours while stirring. The reaction mixture was cooled with ice, and a precipitate was collected by filtration and washed with water. This precipitate was purified by silica gel column chromatography (eluent: chloroform/methanol: 30/1) to give bis[2-(2'-pyridyl)-9-fluorenone-N[1'], C[3]](acetylacetonato) iridium (III) as a pale yellow powder.

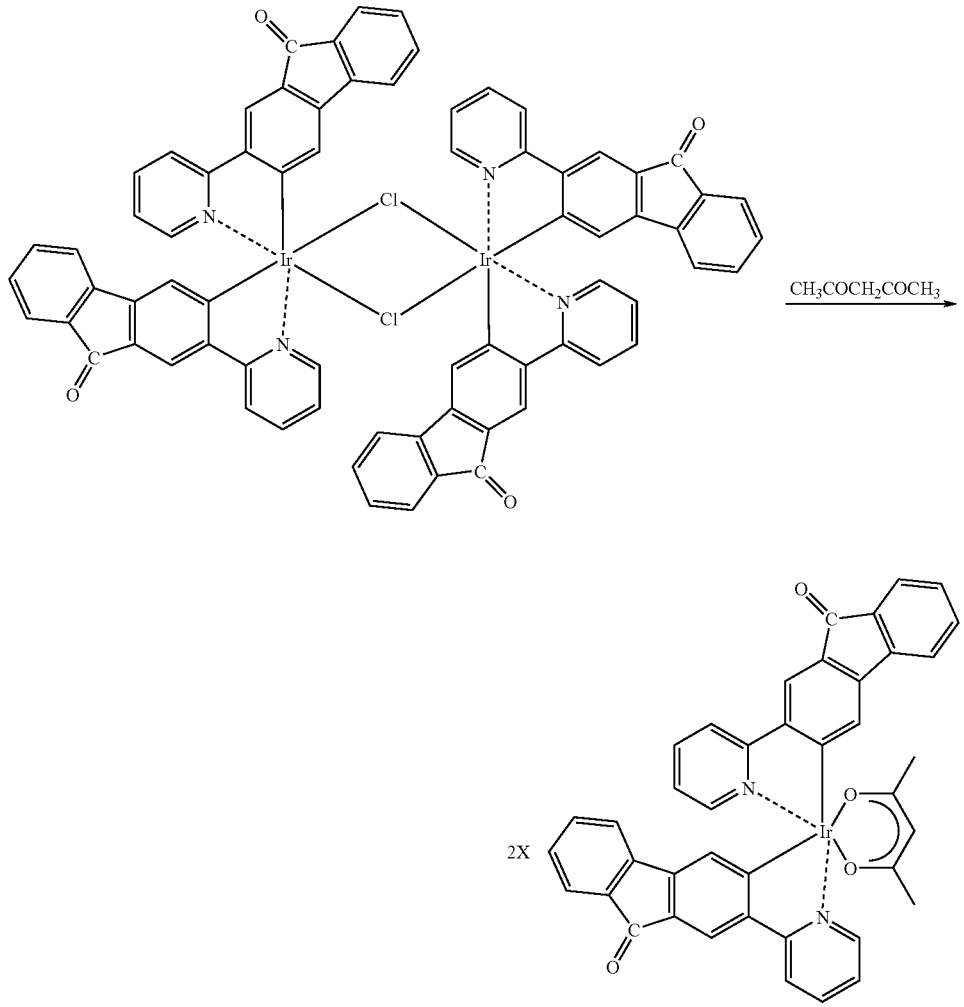

Example III-2

Synthesis of Metal Coordination Compound III-(2)

A 200 mL three-necked flask was charged with 2-(2'-pyridyl)-9-fluorenone (1.7 mmol), bis[2-(2'-pyridyl)-9-fluorenone-N[1'], C[3]](acetylacetonato) iridium (III) (0.28 mmol) synthesized in Example III-1, and glycerol (55 mL), and the mixture was heated under a flow of nitrogen at about 180° C. for 8 hours while stirring. The reaction mixture was cooled to room temperature and poured into 350 mL of 1 N hydrochloric acid, and a precipitate was collected by filtration, washed with water, and dried under vacuum at 100° C. for 5 hours. This precipitate was purified by silica gel column chromatography using chloroform as an eluent to give tris[2-(2'-pyridyl)-9-fluorenone-N[1'], C[3]] iridium (III) as a pale yellow powder.

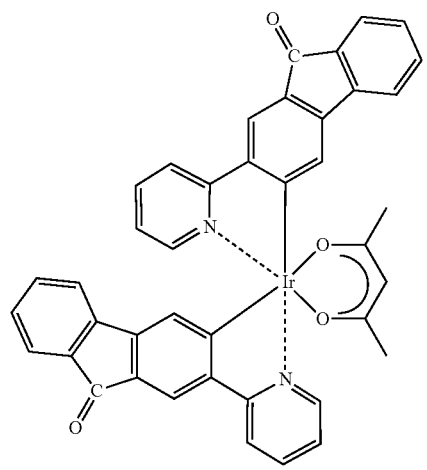
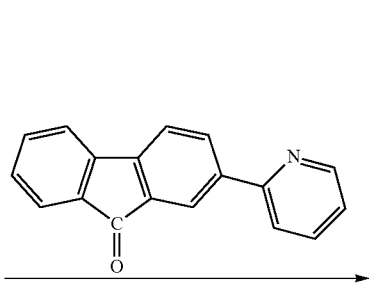
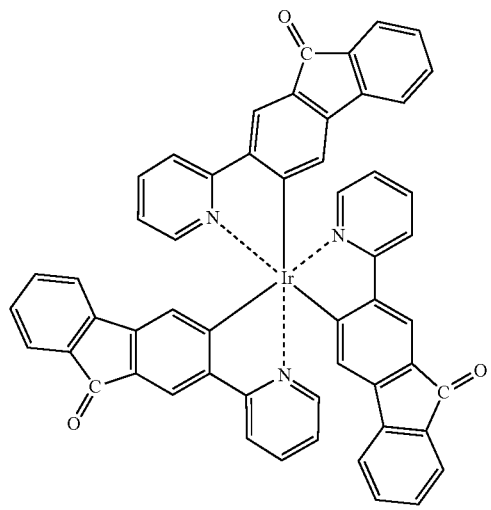

Example III-3 to Example III-17

Various types of metal complex compounds shown in Table III-2 below were synthesized by the same method as the synthetic methods of Example III-1 and Example III-2 except that starting materials such as a fused ring unit, ring A, and other ligands were changed.

TABLE III-2

| No | M | n | Fused Ring Unit | Ring A | $X_1$ | $X_2$ | $X_3$ | $X_4$ | Other Ligand |
|---|---|---|---|---|---|---|---|---|---|
| (8) | Ir | 3 | | | H | H | $CH_3$ | H | — |
| (19) | Ir | 2 | | | H | H | $CF_3$ | H | |

TABLE III-2-continued

| No | M | n | Fused Ring Unit | Ring A | $X_1$ | $X_2$ | $X_3$ | $X_4$ | Other Ligand |
|---|---|---|---|---|---|---|---|---|---|
| (32) | Ir | 3 | fluorene with 2-methyl and 9,9-diethyl substituents | 2-methylpyridine with $X_1, X_2, X_3, X_4$ | H | H | H | H | — |
| (62) | Ir | 3 | fluorene with 2-methyl and 9,9-bis(4-tert-butylphenyl) | 2-methylpyridine | H | H | H | H | — |
| (91) | Ir | 3 | fluorene with 2-methyl and 9,9-bis(5-methylthiophen-2-yl) | 2-methylpyridine | H | H | H | H | acetylacetonate (acac) |
| (92) | Ir | 2 | fluorene with 2-methyl and 9,9-bis(5-methylthiophen-2-yl) | 2-methylpyridine | H | H | H | H | — |
| (100) | Ir | 2 | 4-methyldibenzofuran | 2-methylpyridine | H | H | H | H | acetylacetonate (acac) |
| (131) | Ir | 2 | 4-methyldibenzothiophene | 2-methylpyridine | H | H | H | H | acetylacetonate (acac) |
| (132) | Ir | 3 | 4-methyldibenzothiophene | 2-methylpyridine | H | H | H | H | — |

TABLE III-2-continued

| No | M | n | Fused Ring Unit | Ring A | X₁ | X₂ | X₃ | X₄ | Other Ligand |
|---|---|---|---|---|---|---|---|---|---|
| (178) | Ir | 2 | [fluorenone-methyl] | [pyridine with X₁–X₄] | H | CH₃ | H | H | [benzyl-substituted acetylacetonate] |
| (184) | Ir | 3 | [fluorenone-methyl] | [benzothiazole] | H | H | H | H | — |
| (185) | Ir | 3 | [fluorenone-methyl] | [benzotriazole] | H | H | H | H | — |
| (190) | Ir | 3 | [fluorenone-methyl] | [benzothiazole] | H | H | H | H | [benzyl-substituted acetylacetonate] |
| (191) | Ir | 2 | [fluorenone-methyl] | [benzotriazole] | H | H | H | H | [acetylacetonate] |
| (192) | Ir | 2 | [fluorenone-methyl] | [oxazole with X₁, X₂] | H | | | | [toluene]; [pyridine-carboxylate with CH₃] |

Example III-18

Fabrication of Organic EL Device

An organic EL device having three organic layers was fabricated using the compound obtained in Example III-2 and its device characteristics were evaluated.

An α-NPD hole transporting layer with a thickness of 40 nm was formed by a vacuum deposition method involving resistive heating within a $10^{-5}$ Pa vacuum chamber on a glass substrate with a 2 mm wide ITO (indium tin oxide) patterning. On top of this layer, the metal coordination compound of Example III-2 (5% ratio by weight) and CBP were vapor codeposited (film thickness 30 nm). Furthermore, as an electron transporting layer, $Alq_3$ was vapor-deposited at 30 nm. On top of this layer, LiF at 0.5 to 2 nm and Al at 100 to 150 nm were vapor deposited as a negative electrode layer.

With regard to the characteristics of the organic EL device, current/voltage characteristics were measured at room temperature using a 4140B picoammeter manufactured by Hewlett-Packard and the luminance was measured using an SR-3 manufactured by Topcon Corporation. When a voltage was applied so that the ITO was the positive electrode and the LiF/Al was the negative electrode, at about 6 V emission of blue light (λ=450 nm) was observed.

The luminance half-life when operated at a constant current (50 mA/cm²) was 200 hours.

The invention claimed is:

1. A metal coordination compound represented by any one of Formulae I-(1) to I-(6),

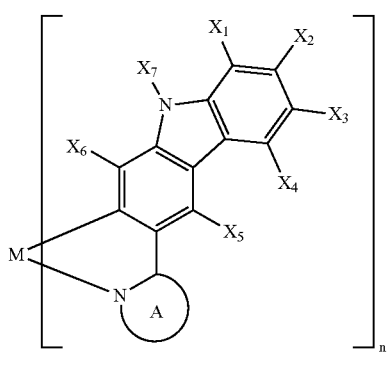

(1)

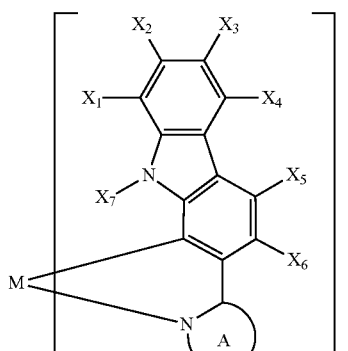

(2)

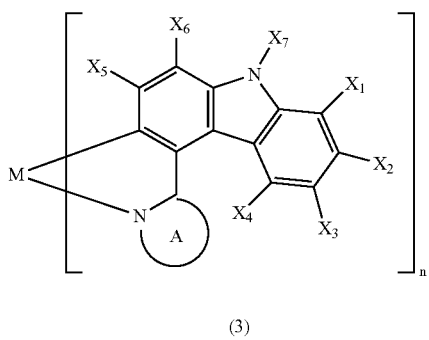

(3)

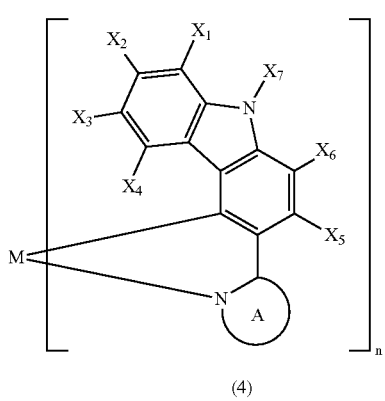

(4)

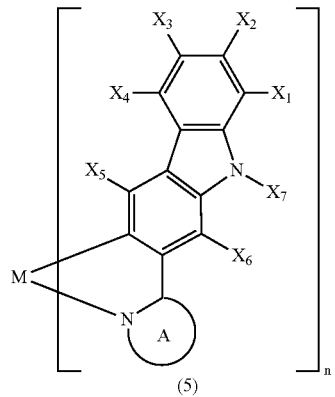

(5)

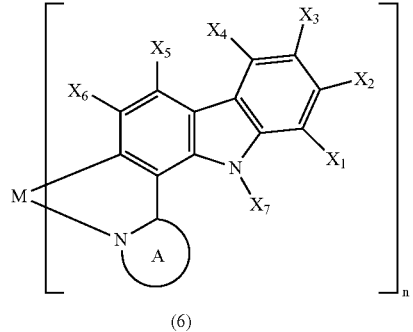

(6)

(in the formulae, M is Ir, Rh, Ru, Os, Pd, or Pt, and n is 2 or 3; when M is Ir, Rh, Ru, or Os and n is 2, another bidentate ligand further bonds to M; ring A is a cyclic compound containing a nitrogen atom bonded to M; $X_1$ to $X_7$ may be any of a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C21 aryl group, a C2 to C20 heteroaryl group, or a C7 to C21 aralkyl group, or a corresponding halogen-substituted aryl group, halogen-substituted heteroaryl group, or halogen-substituted aralkyl group in which a part or all of the hydrogen atoms are substituted by a halogen atom, $X_1$ to $X_7$ may be identical to or different from each other, and ring A may have a substituent that is the same as the groups defined by $X_1$ to $X_7$)

wherein in Formulae I-(1) to I-(6) at least one of $X_1$ to $X_7$ and the substituent of ring A defined as being the same as $X_1$ to $X_7$ is a fluorine atom or a trifluoromethyl group.

2. The metal coordination compound according to claim 1, wherein in Formulae I-(1) to I-(6) ring A is pyridine, quinoline, benzoxazole, benzothiazole, benzimidazole, benzotriazole, imidazole, pyrazole, oxazole, thiazole, triazole, benzopyrazole, or triazine, which may have a substituent that is the same as the groups defined by $X_1$ to $X_7$.

3. The metal coordination compound according to claim 1, wherein M is Ir.

4. A polymer composition comprising the metal coordination compound according to claim 1 and a conjugated and/or non-conjugated polymer.

5. An organic electroluminescent device fabricated using the metal coordination compound according to claim 1.

6. An organic electroluminescent device fabricated using the polymer composition according to claim 4.

* * * * *